(12) United States Patent
Izawa

(10) Patent No.: US 12,127,407 B2
(45) Date of Patent: Oct. 22, 2024

(54) MEMORY DEVICE

(71) Applicant: Kioxia Corporation, Tokyo (JP)

(72) Inventor: Yusaku Izawa, Nagoya (JP)

(73) Assignee: Kioxia Corporation, Tokyo (JP)

( * ) Notice: Subject to any disclaimer, the term of this patent is extended or adjusted under 35 U.S.C. 154(b) by 402 days.

(21) Appl. No.: 17/654,926

(22) Filed: Mar. 15, 2022

(65) Prior Publication Data

US 2023/0064874 A1 Mar. 2, 2023

(30) Foreign Application Priority Data

Aug. 25, 2021 (JP) ................. 2021-136962

(51) Int. Cl.
| | | |
|---|---|---|
| H01L 23/528 | (2006.01) | |
| H01L 23/522 | (2006.01) | |
| H10B 41/10 | (2023.01) | |
| H10B 41/27 | (2023.01) | |
| H10B 41/35 | (2023.01) | |
| H10B 43/10 | (2023.01) | |
| H10B 43/27 | (2023.01) | |
| H10B 43/35 | (2023.01) | |

(52) U.S. Cl.
CPC ......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ..... H10B 43/27; H10B 41/10; H01L 23/5226; H01L 23/5283
See application file for complete search history.

(56) References Cited

U.S. PATENT DOCUMENTS

| | | | |
|---|---|---|---|
| 10,930,673 B2 | 2/2021 | Nanami et al. | |
| 11,569,215 B2 * | 1/2023 | Kim ................. | H01L 25/50 |
| 11,631,690 B2 * | 4/2023 | Okina .............. | H10B 41/50 |
| | | | 257/314 |
| 11,647,630 B2 * | 5/2023 | Nakajima ......... | H01L 21/76897 |
| | | | 257/314 |

(Continued)

FOREIGN PATENT DOCUMENTS

| | | |
|---|---|---|
| JP | 2020-145230 A | 9/2020 |
| JP | 2021-39965 A | 3/2021 |
| TW | 1720887 B | 3/2021 |

*Primary Examiner* — Thao P Le
(74) *Attorney, Agent, or Firm* — Oblon, McClelland, Maier & Neustadt, L.L.P.

(57) ABSTRACT

According to one embodiment, a memory device includes: first and second memory areas each including conductive layers stacked in a first direction; a hookup portion between first and second memory areas in a second direction, the hookup portion including terraces; and interconnects provided in correspondence with the terraces above the hookup portion. First to fourth sub-staircases of the hookup portion are arranged in order of the first sub-staircase, the second sub-staircase, the third sub-staircase and the fourth sub-staircase in a direction from the first memory area toward the second memory area, and the first to fourth sub-staircases are arranged in order of the first sub-staircase, the second sub-staircase, the fourth sub-staircase and the third sub-staircase in a direction from the interconnects toward the terraces.

20 Claims, 31 Drawing Sheets

(56) References Cited

U.S. PATENT DOCUMENTS

| | | | |
|---|---|---|---|
| 2012/0068252 A1 | 3/2012 | Katsumata et al. | |
| 2021/0066297 A1 | 3/2021 | Matsumoto. et al. | |
| 2021/0296335 A1 | 9/2021 | Sun et al. | |
| 2022/0208748 A1* | 6/2022 | Rabkin | H01L 24/80 |
| 2022/0230917 A1* | 7/2022 | Amano | H01L 21/76895 |
| 2022/0231050 A1* | 7/2022 | Young | G11C 11/223 |
| 2022/0254804 A1* | 8/2022 | Yoshida | H10B 41/27 |
| 2022/0271053 A1* | 8/2022 | Ohya | H10B 43/50 |
| 2022/0328512 A1* | 10/2022 | Tanaka | H10B 43/27 |
| 2022/0359391 A1* | 11/2022 | Jhothiraman | H01L 23/5283 |
| 2022/0399285 A1* | 12/2022 | Zhang | H01L 23/5283 |
| 2023/0013984 A1* | 1/2023 | Otsu | H10B 43/40 |
| 2023/0057885 A1* | 2/2023 | Itou | H01L 23/5221 |
| 2023/0069307 A1* | 3/2023 | Shimomura | H10B 43/35 |

* cited by examiner

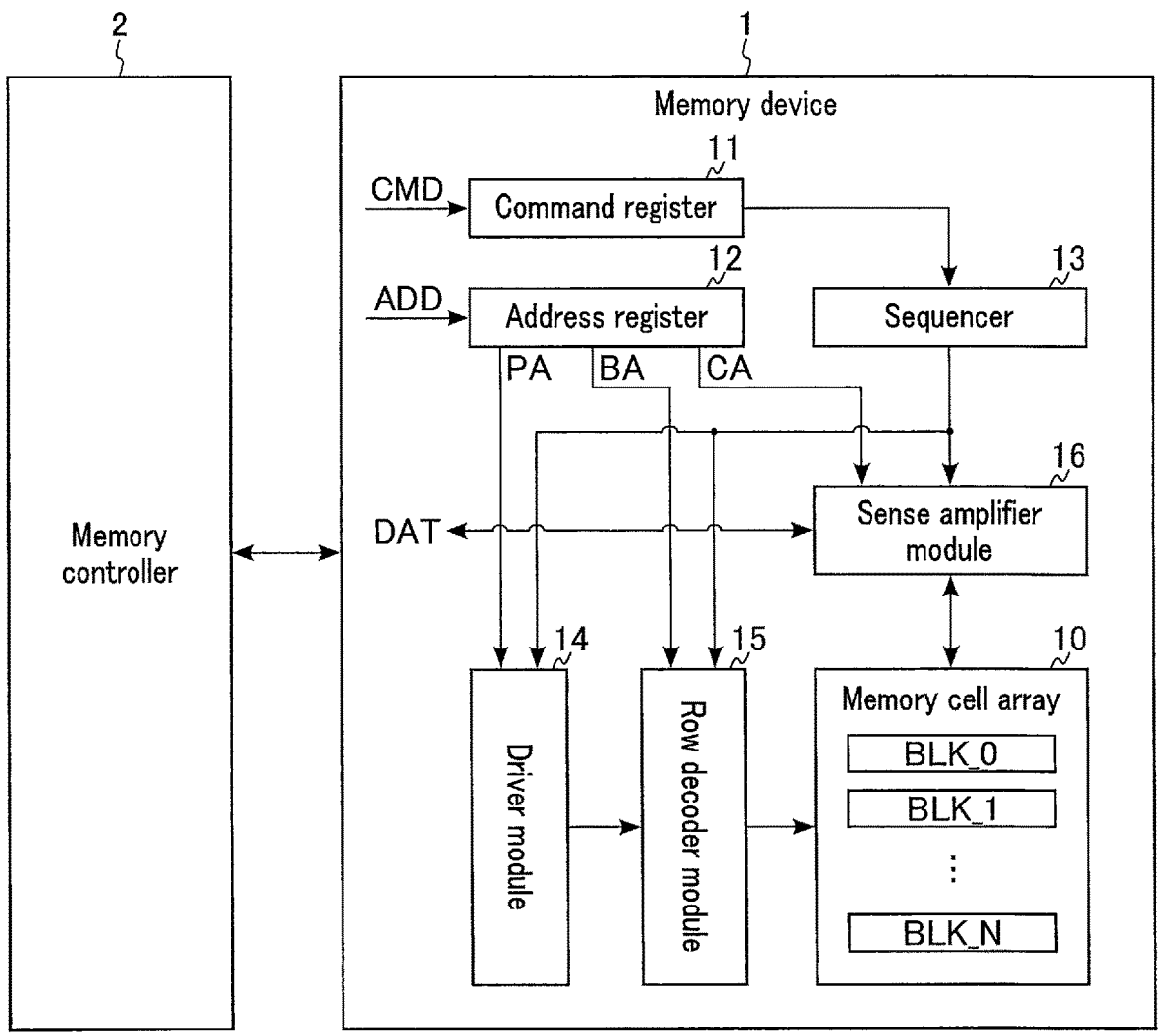
F I G. 1

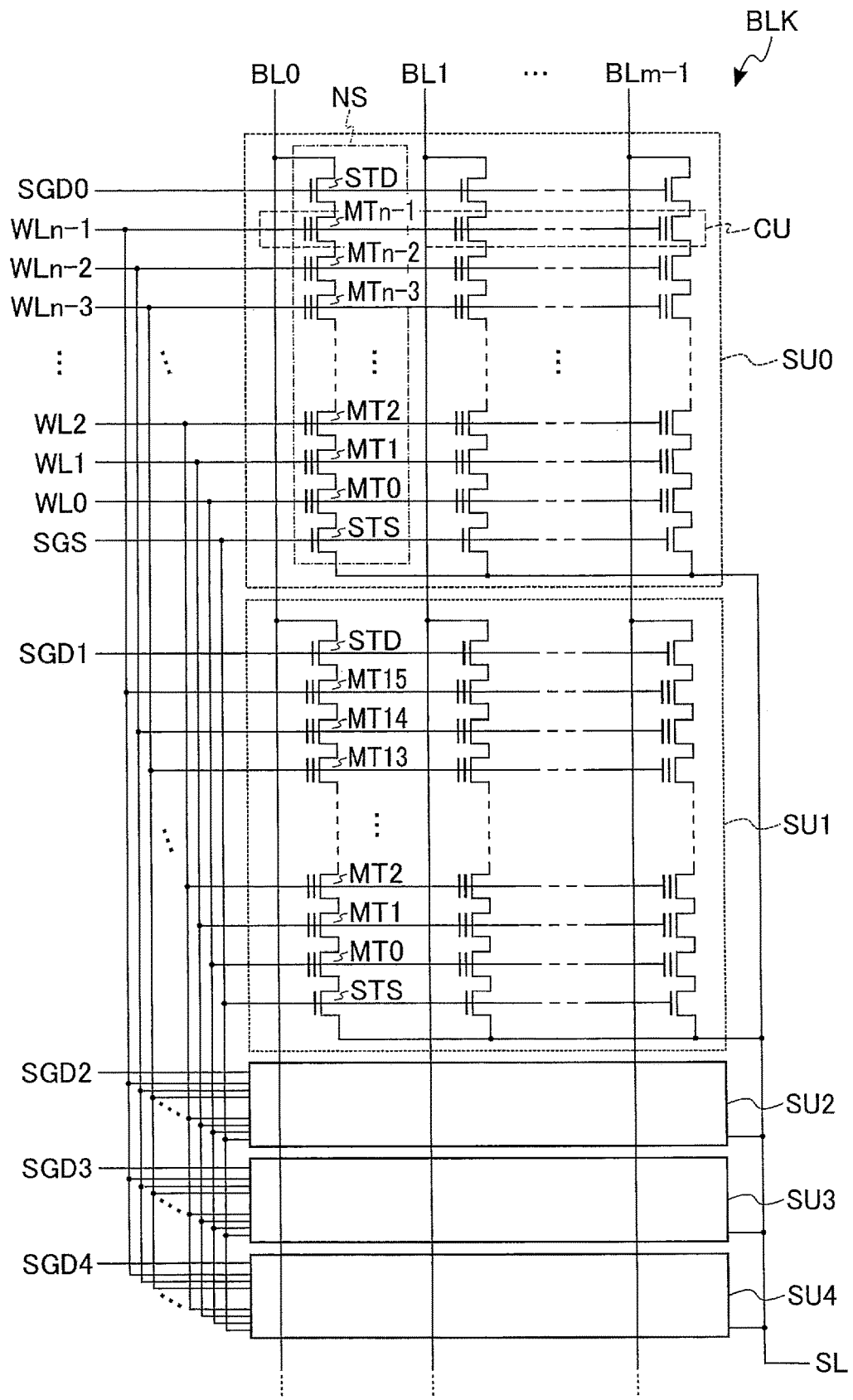
F I G. 2

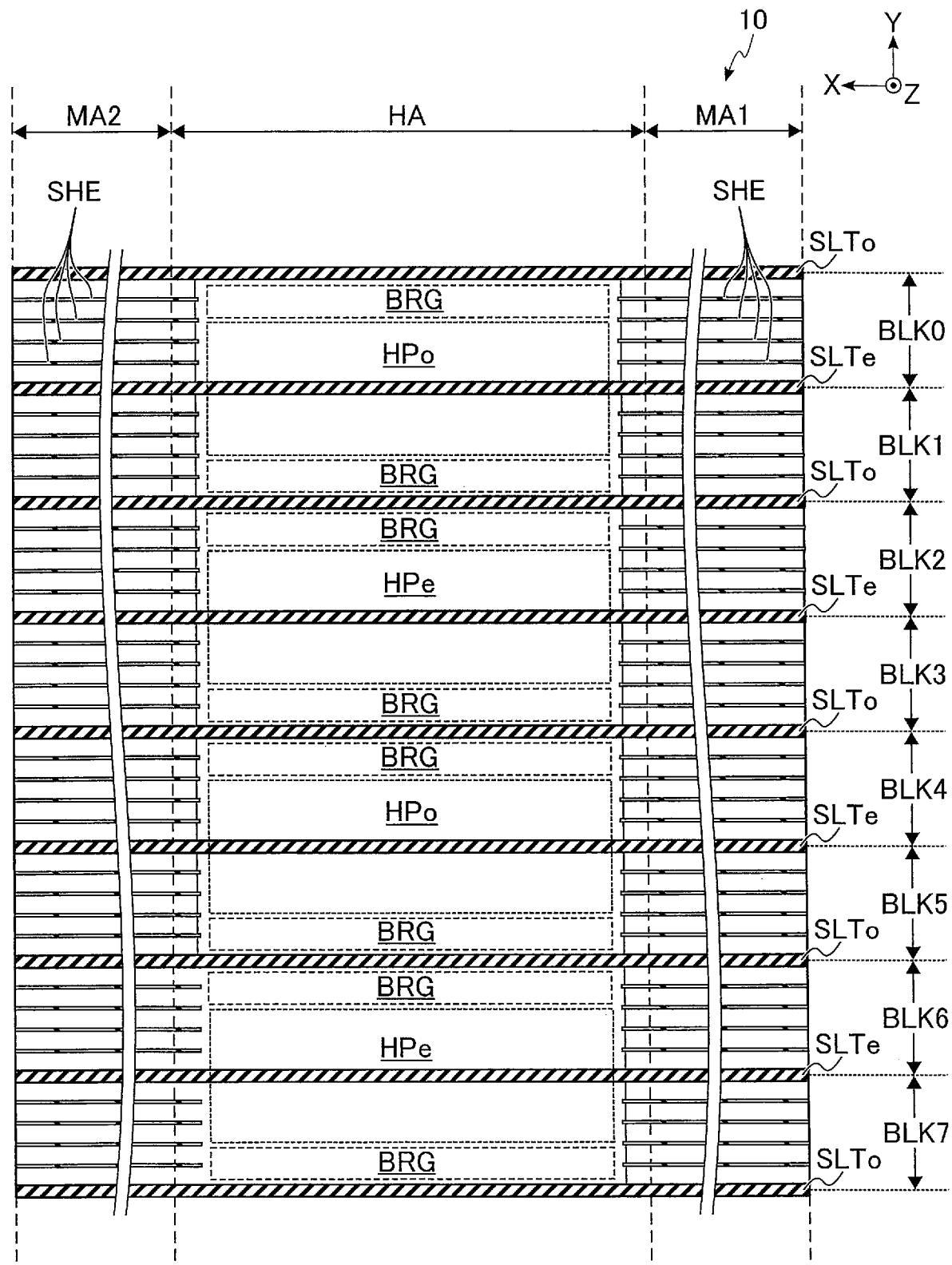
F I G. 3

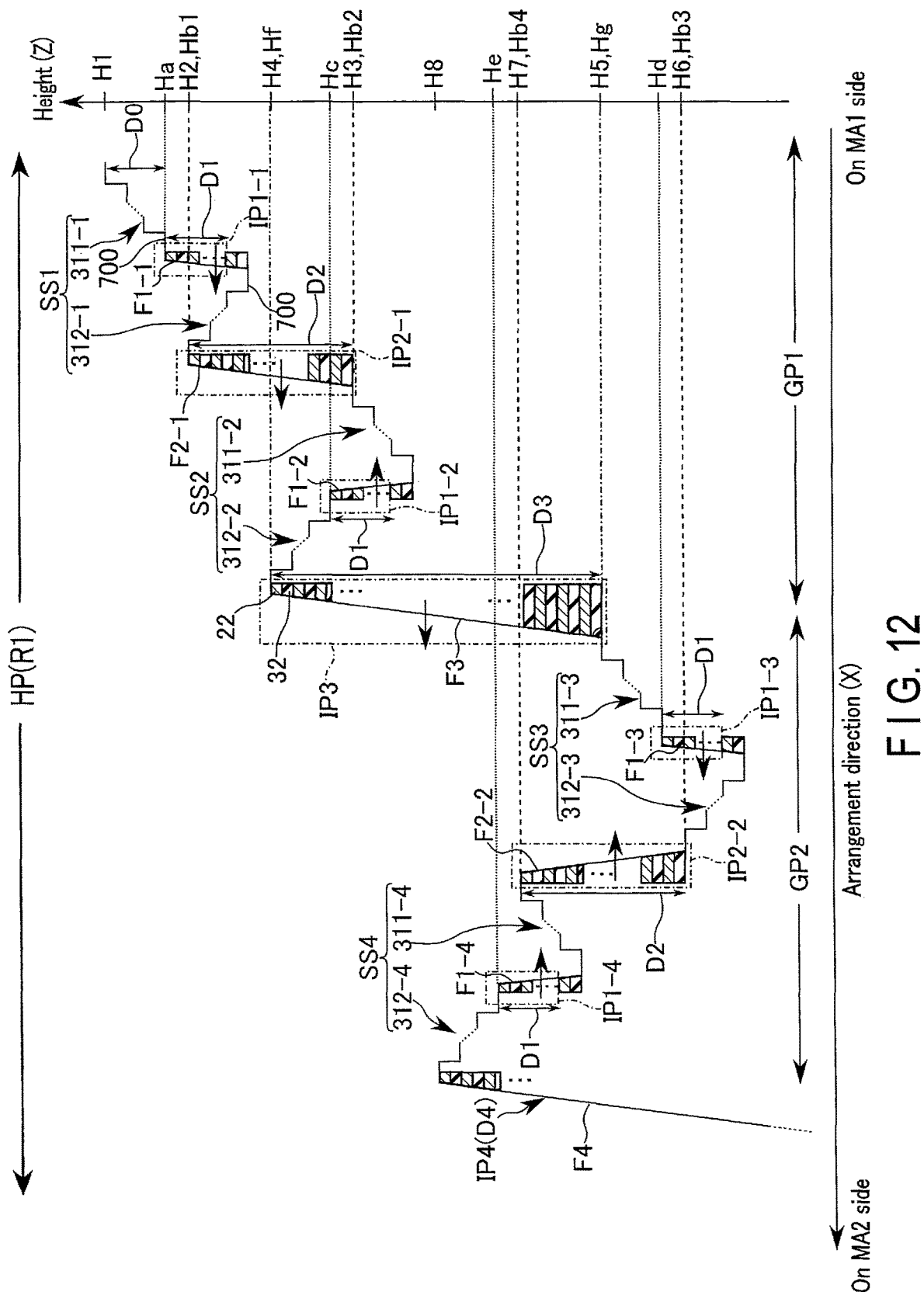
F I G. 12

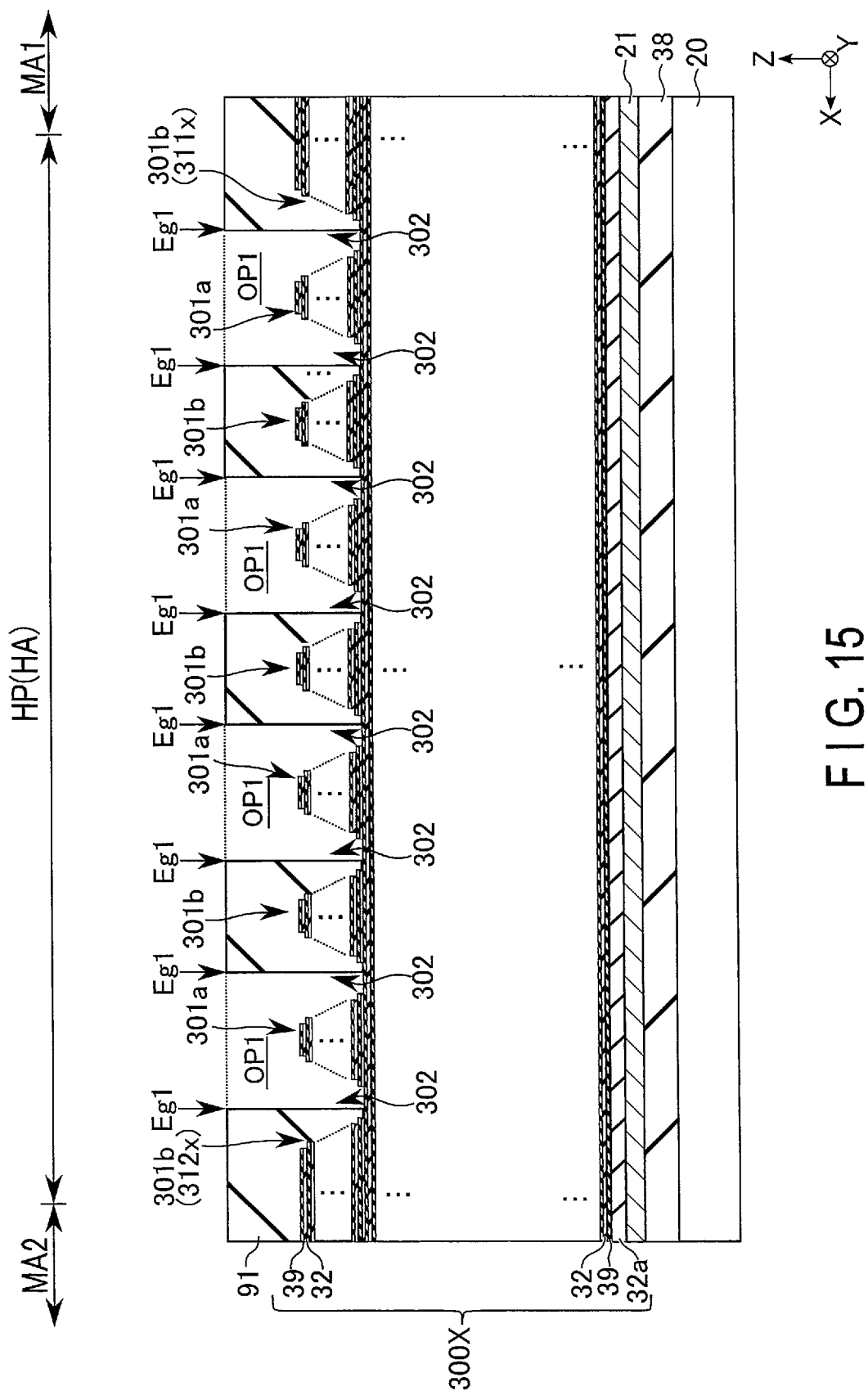
F I G. 15

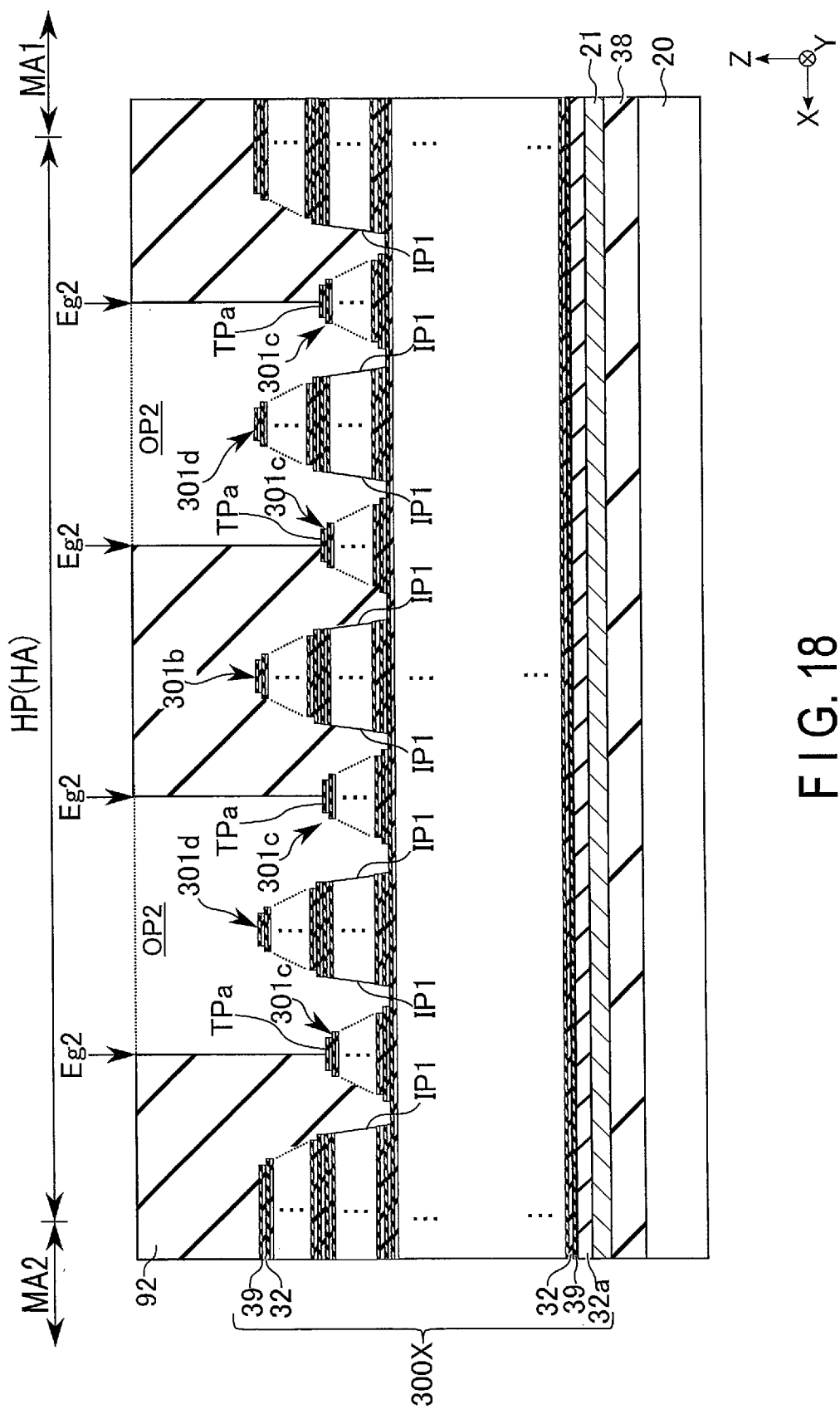
F I G. 18

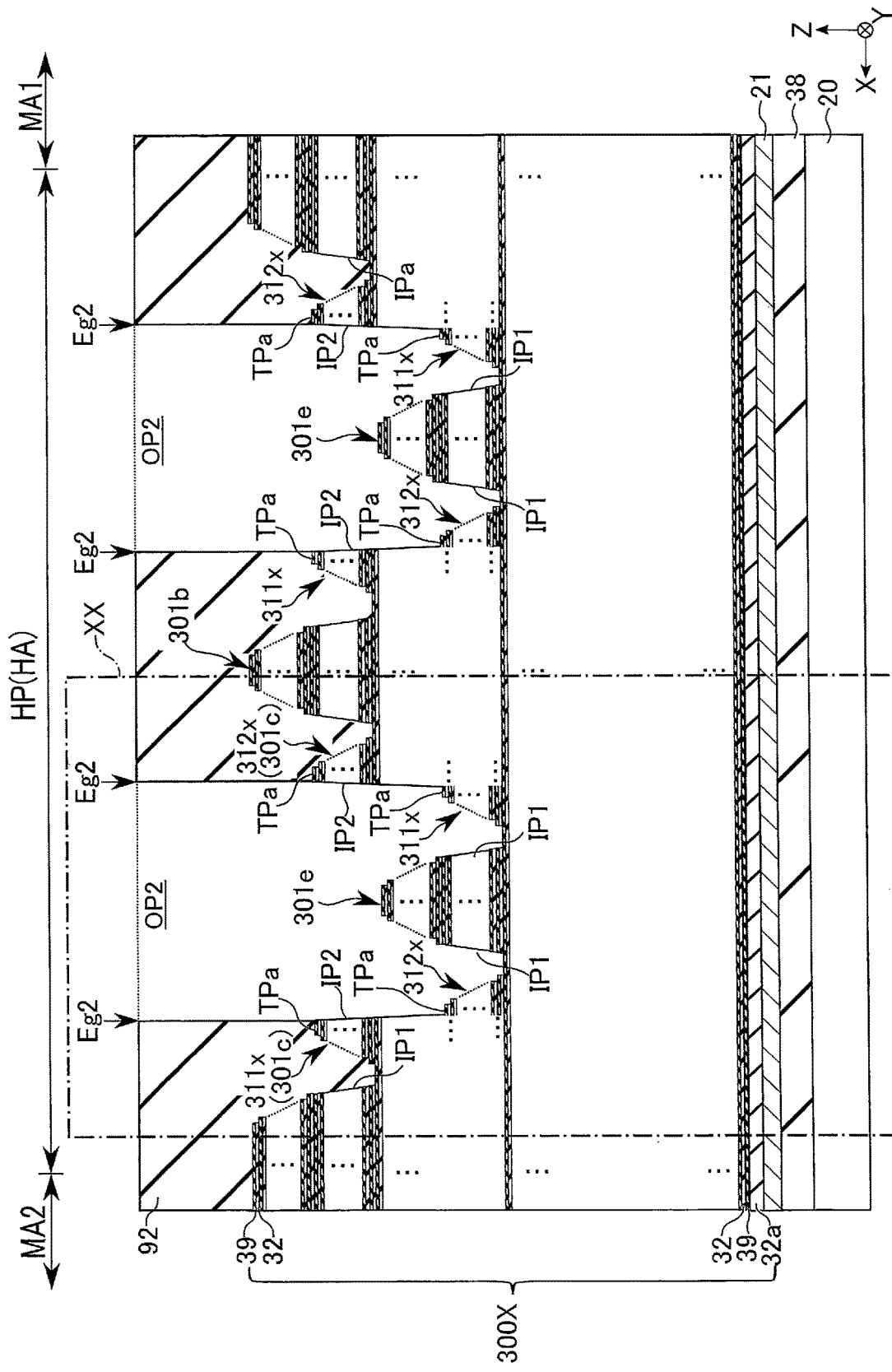
F I G. 19

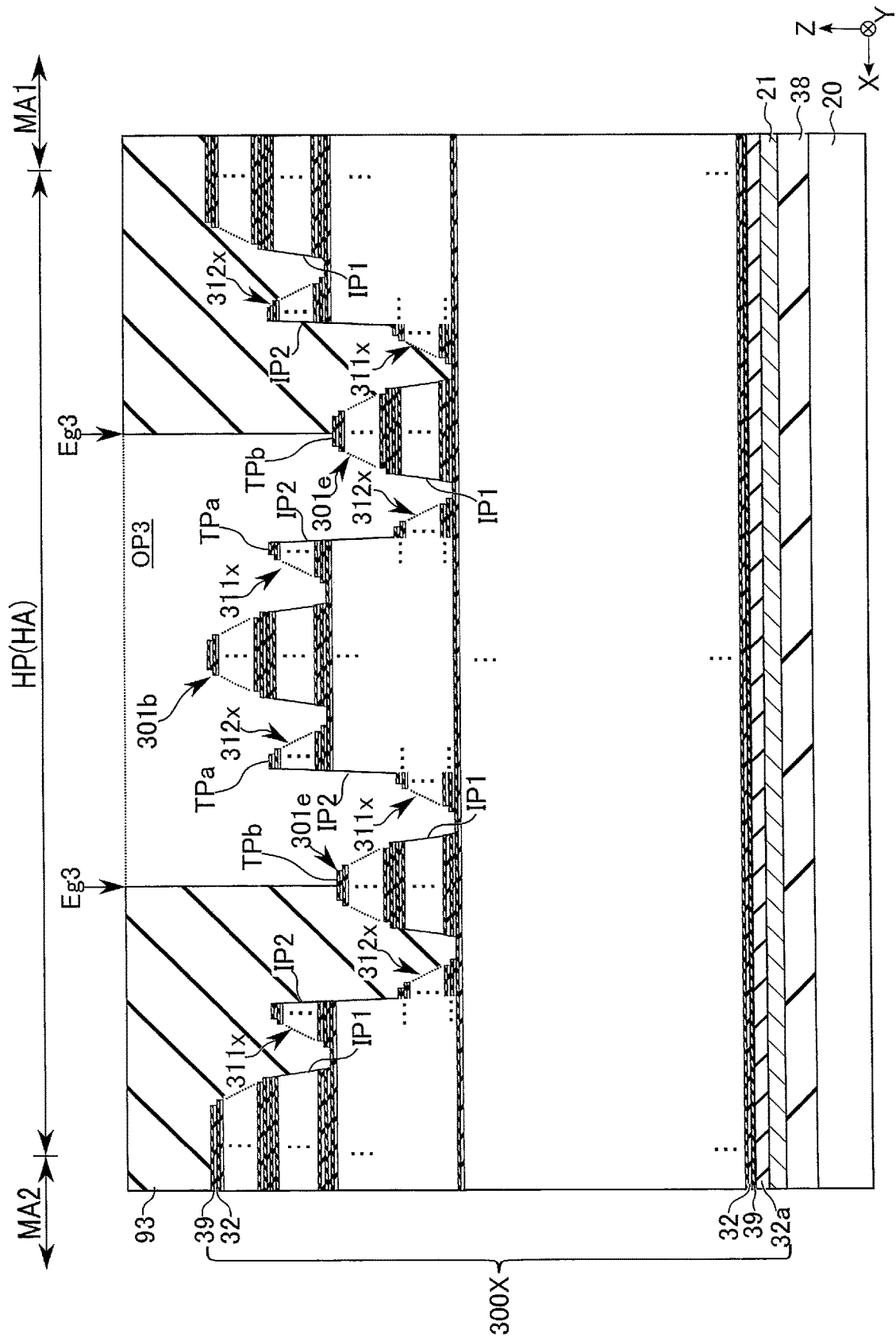
F I G. 21

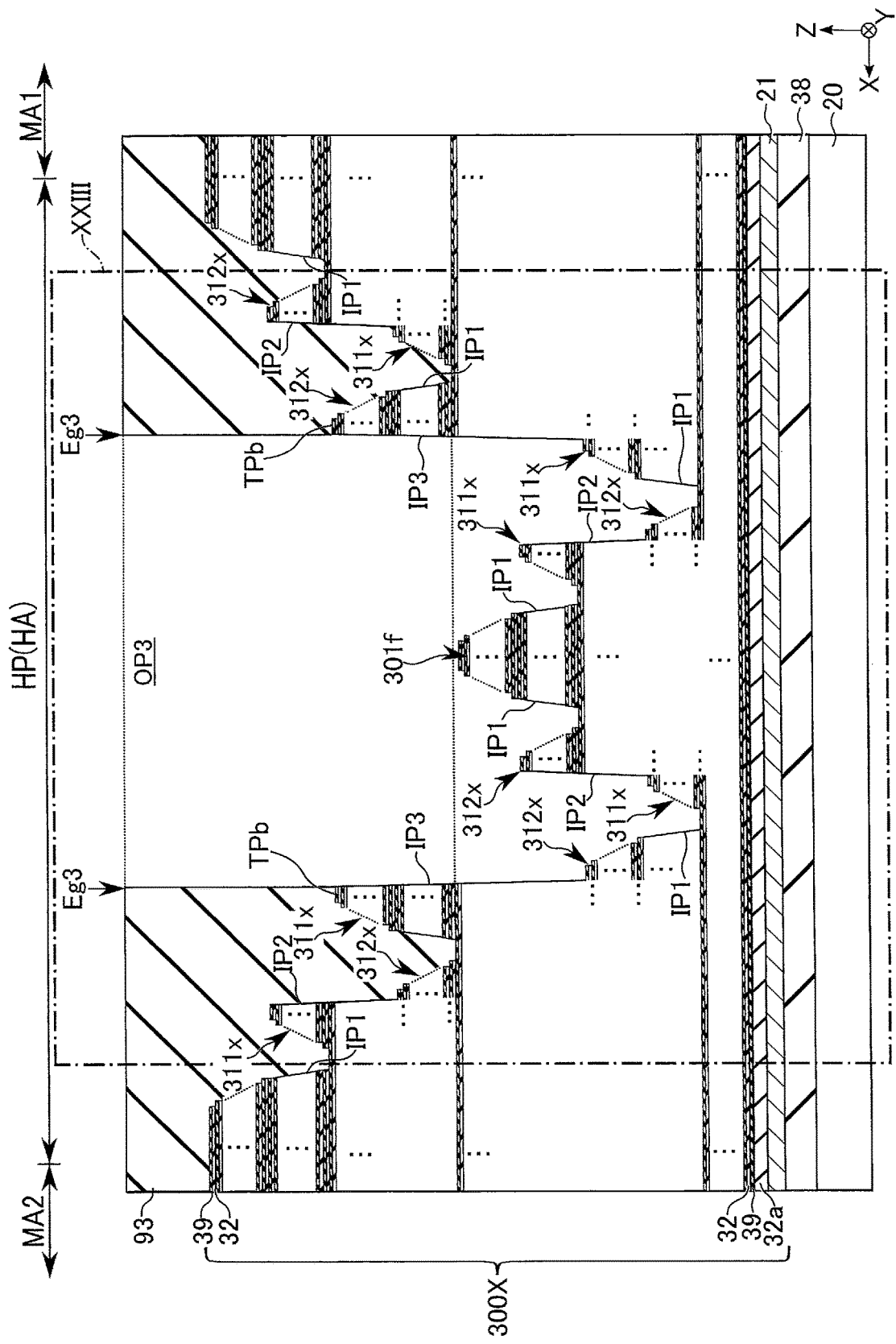
F I G. 22

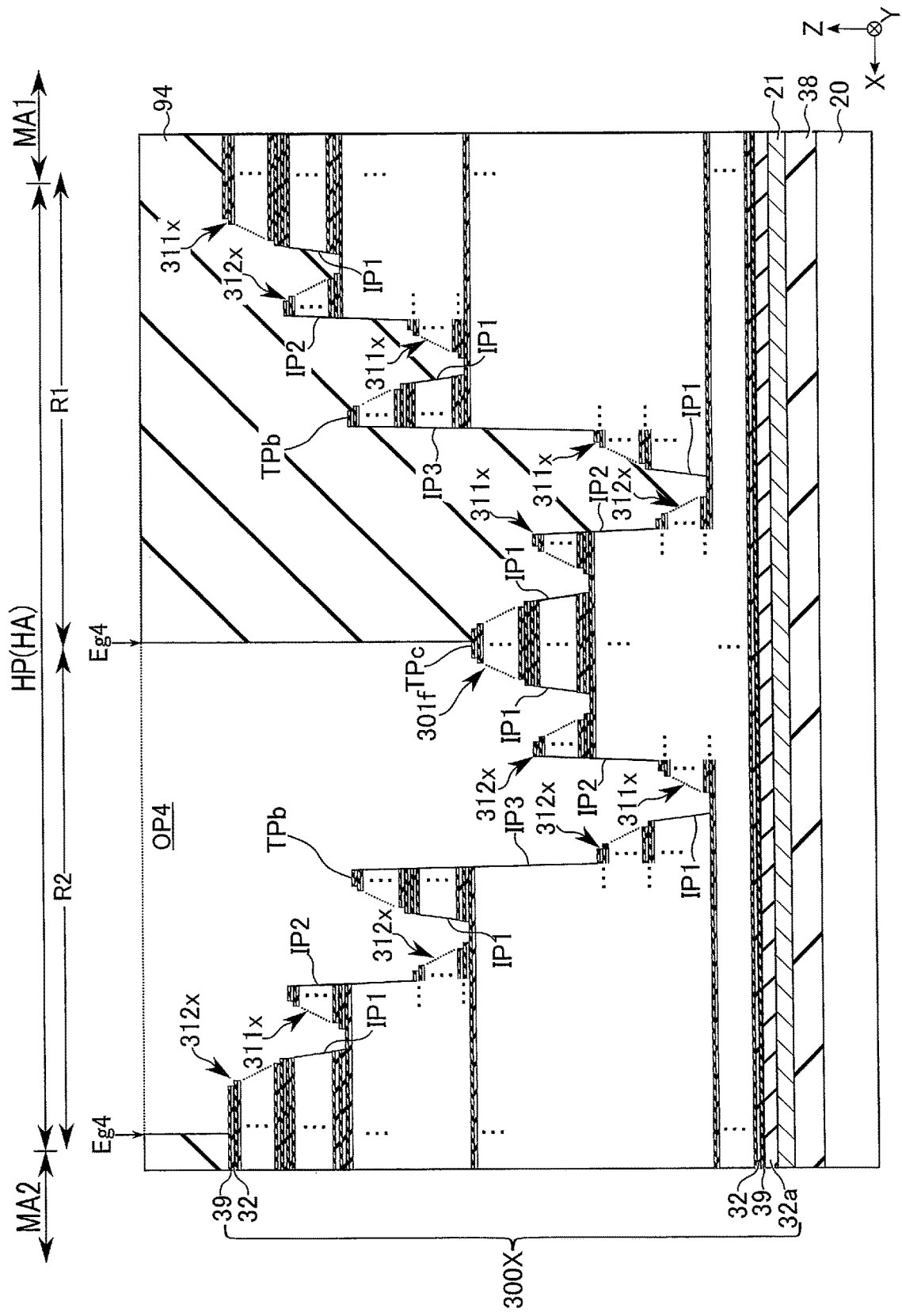
F I G. 24

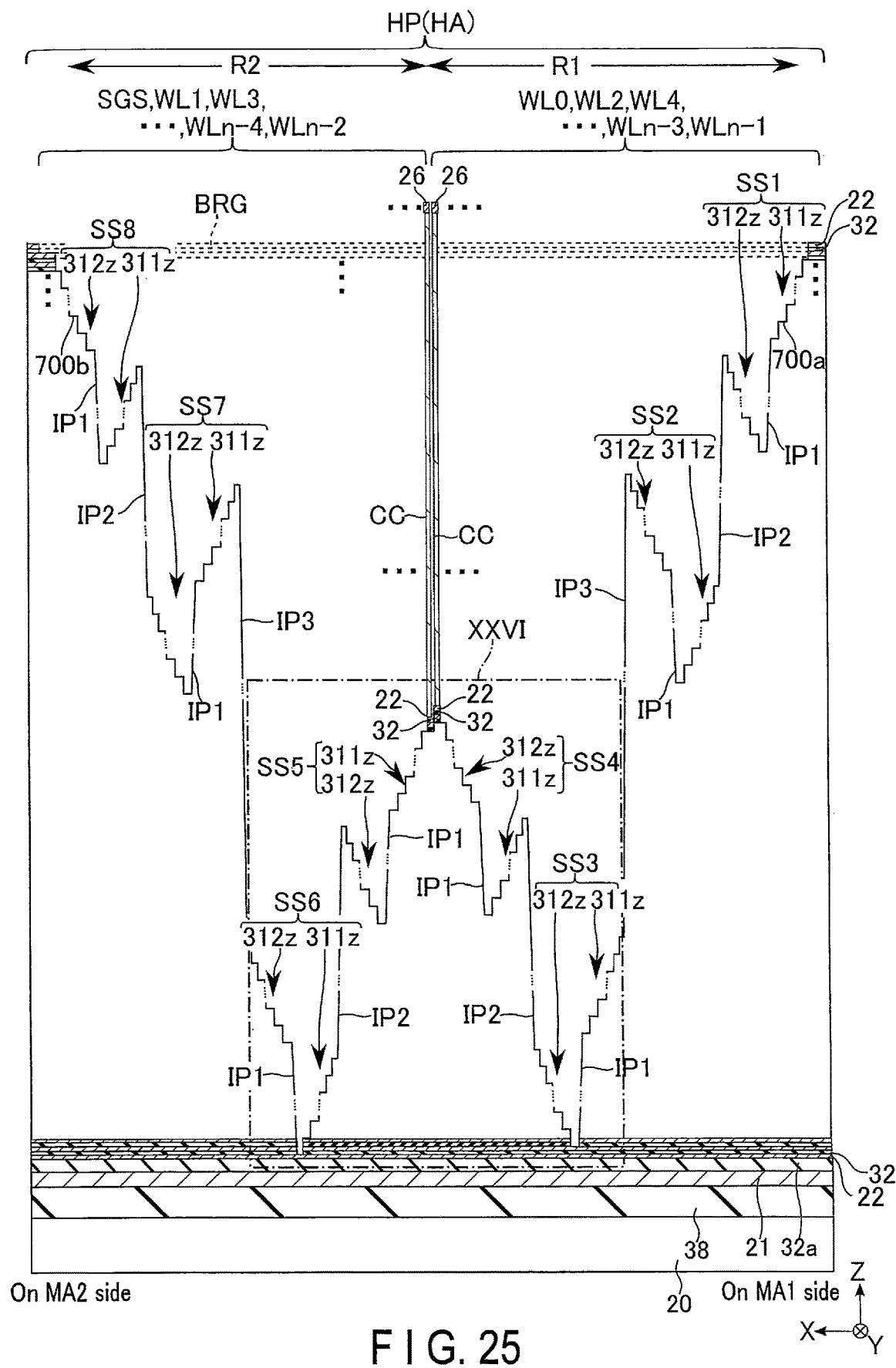
F I G. 25

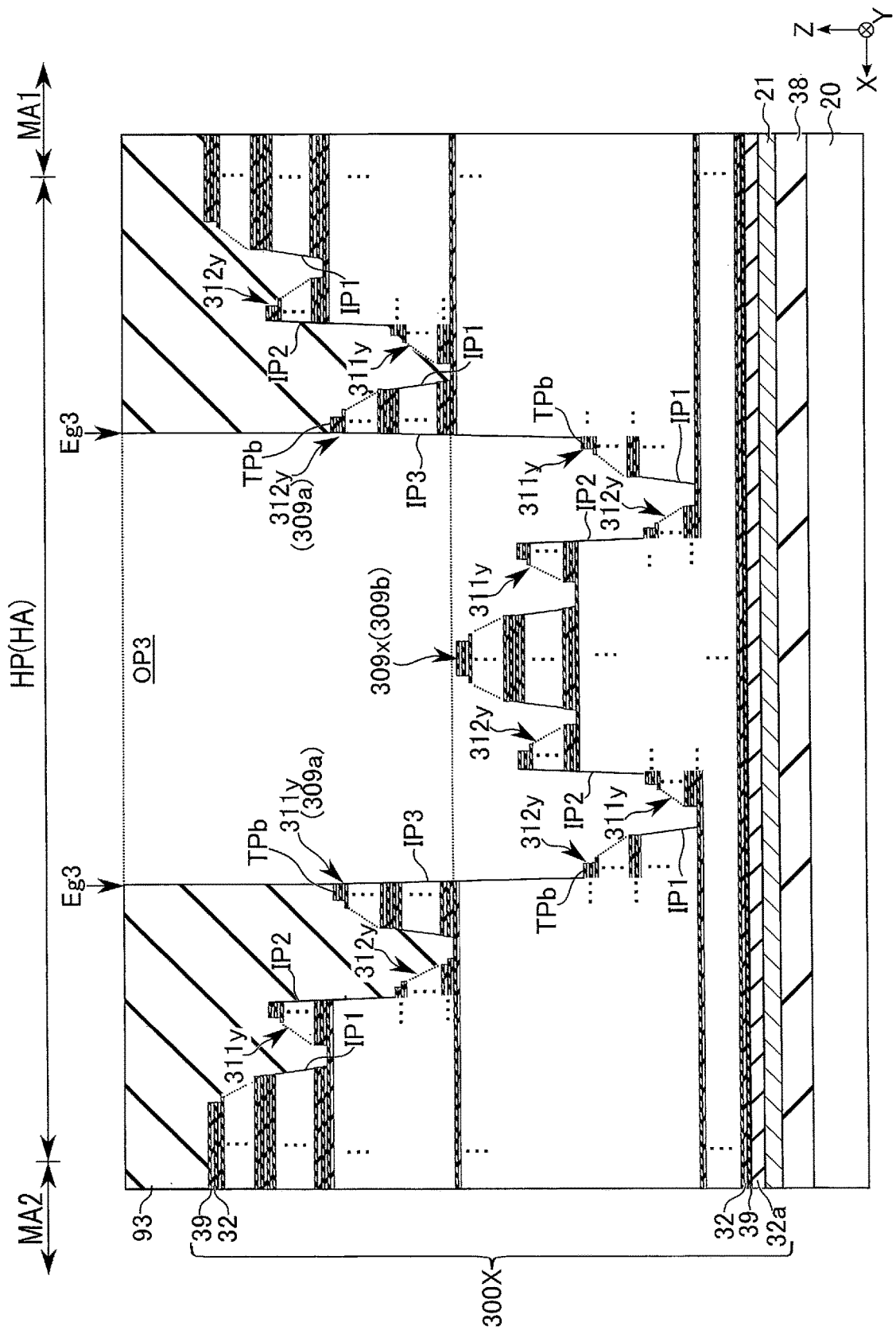
F I G. 29

MEMORY DEVICE

CROSS-REFERENCE TO RELATED APPLICATIONS

This application is based upon and claims the benefit of priority from Japanese Patent Application No. 2021-136962, filed Aug. 25, 2021, the entire contents of which are incorporated herein by reference.

FIELD

Embodiments described herein relate generally to a memory device.

BACKGROUND

There is known a NAND flash memory capable of storing data in a nonvolatile manner.

BRIEF DESCRIPTION OF THE DRAWINGS

FIG. 1 is a block diagram showing an example of the overall configuration of a memory device of the first embodiment.

FIG. 2 is a circuit diagram showing an example of a circuit configuration of a memory cell array of the memory device of the first embodiment.

FIG. 3 is a plan view showing an example of a planar layout of the memory cell array of the memory device of the first embodiment.

Figure 10:
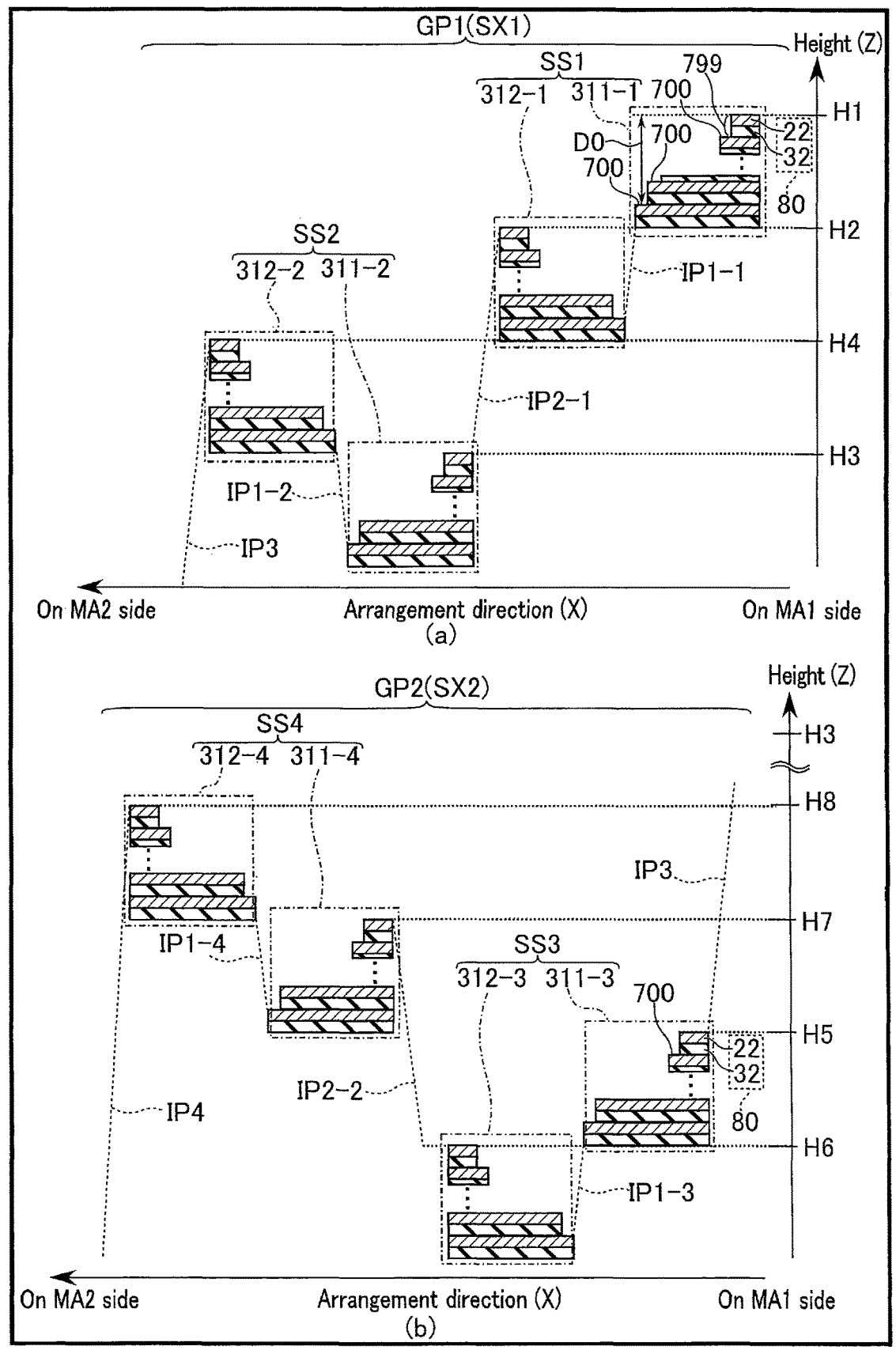
Figure 11:
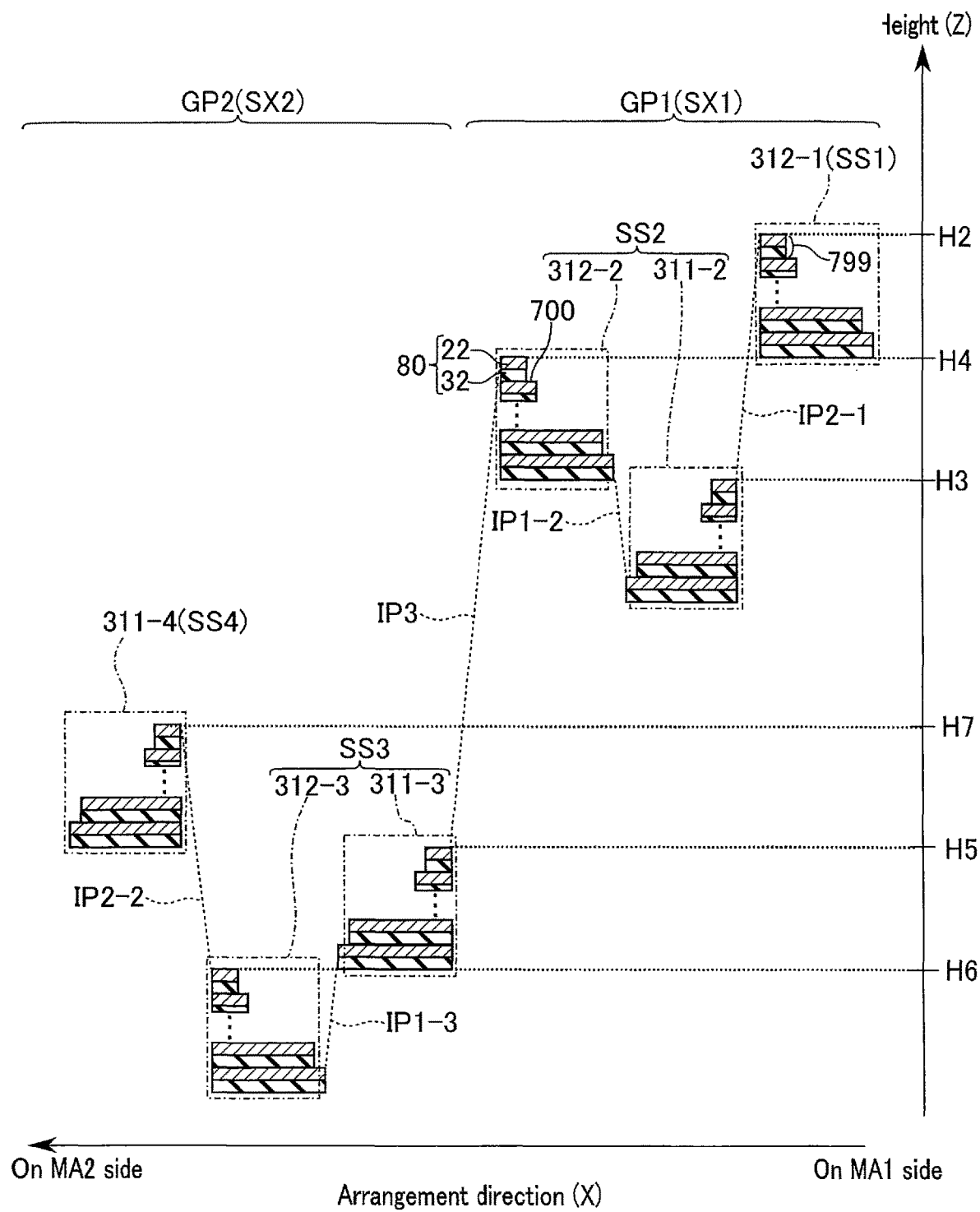

Each of FIGS. 10, 11 and 12 is a schematic view showing an example of a cross-sectional structure of the hookup portion of the memory device of the first embodiment.

Figure 13:
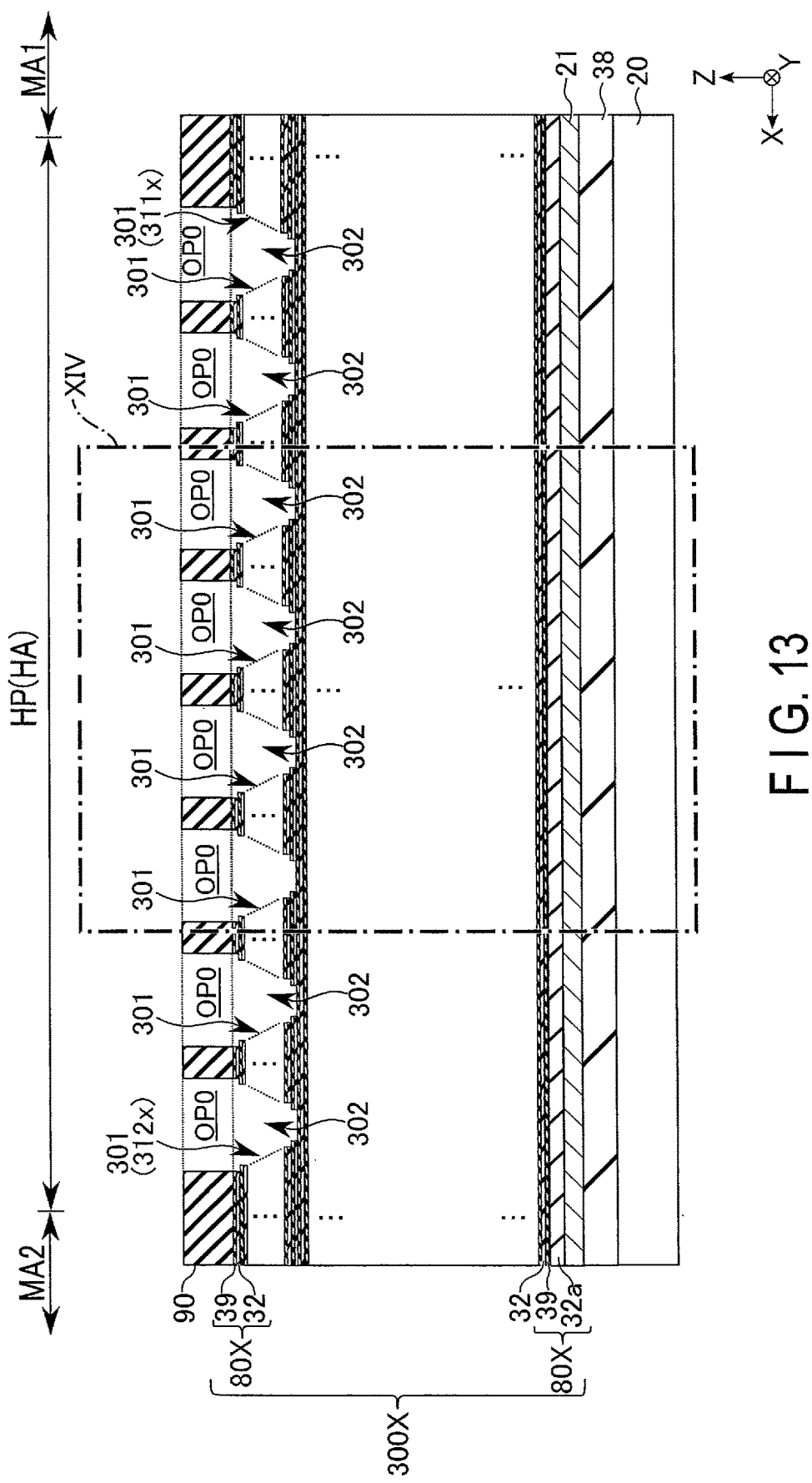

FIG. 13 is a cross-sectional diagram illustrating one step in a method of manufacturing the memory device of the first embodiment.

Figure 14:
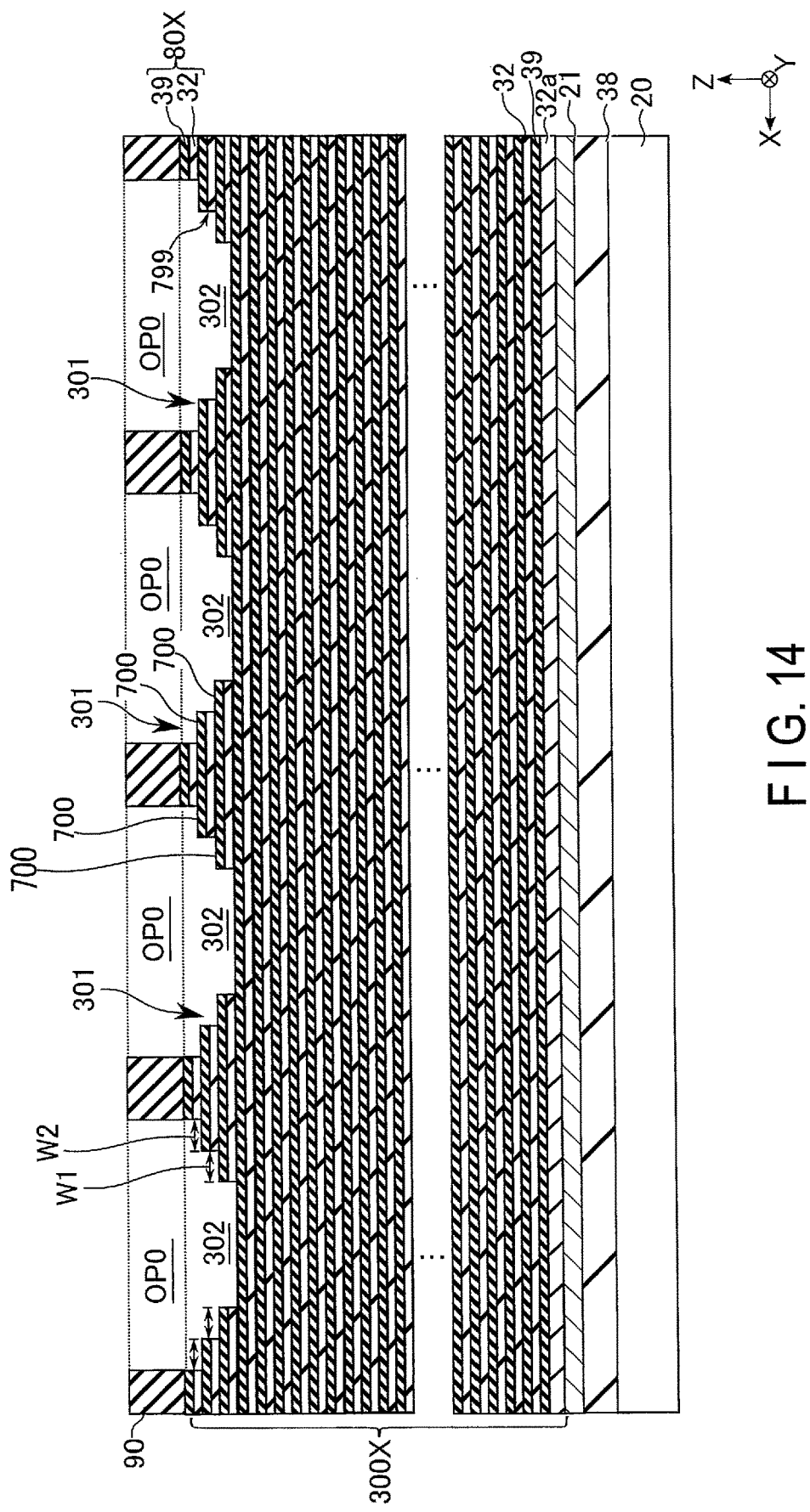

FIG. 14 is a cross-sectional diagram showing region XIV of FIG. 13.

Figure 16:
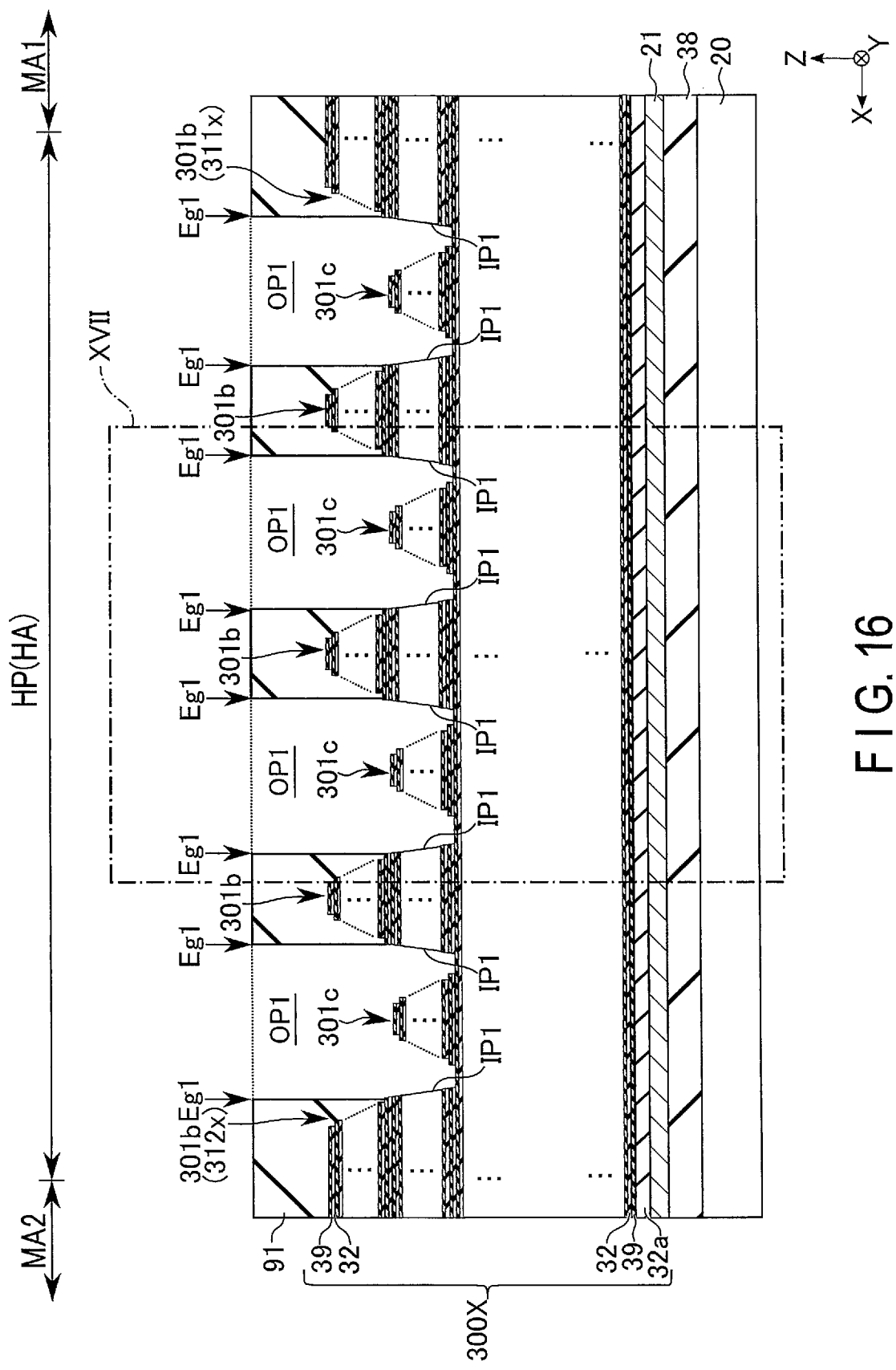

Each of FIGS. 15 and 16 is a cross-sectional diagram illustrating one step in the method of manufacturing the memory device of the first embodiment.

Figure 17:
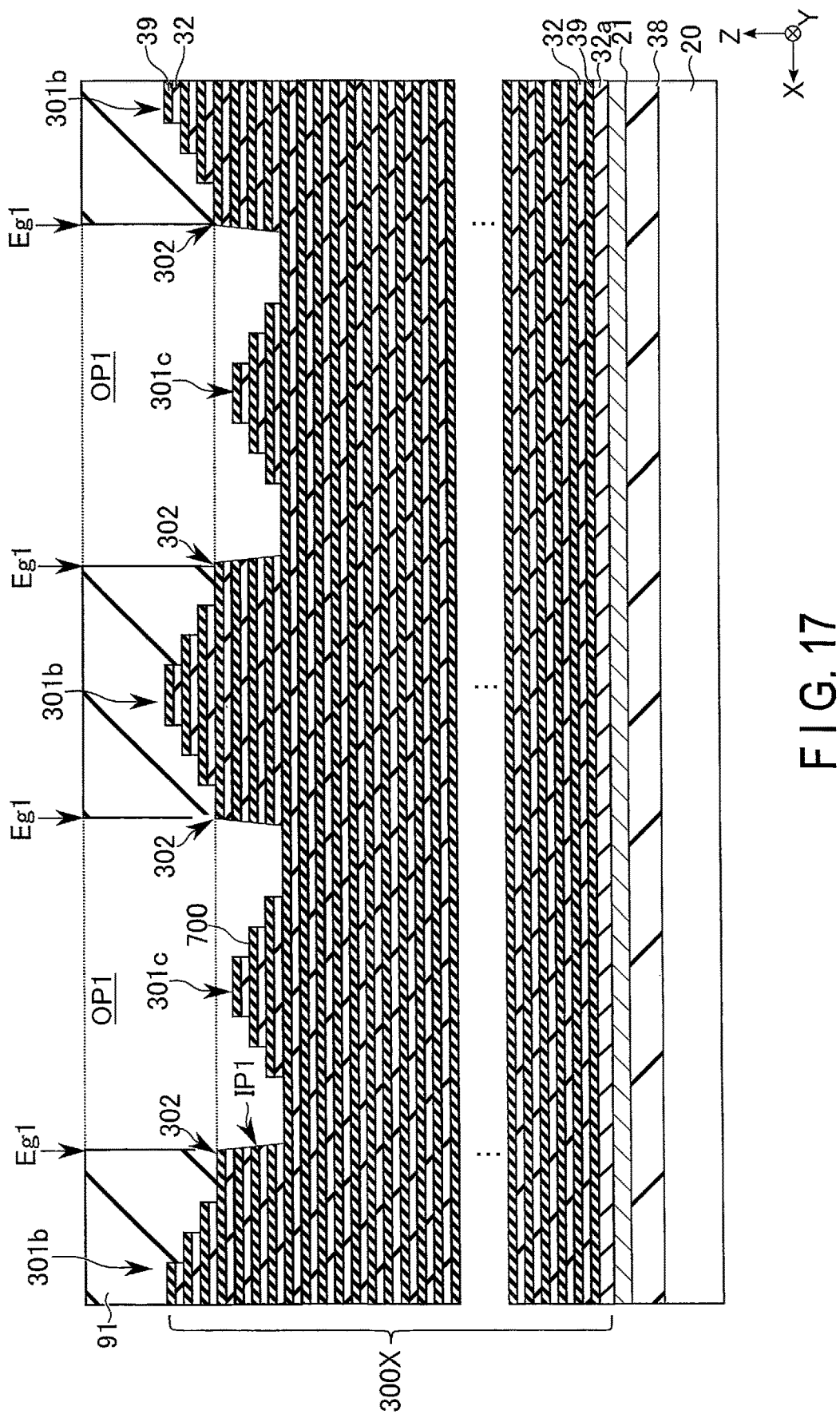

FIG. 17 is a cross-sectional diagram showing region XVII of FIG. 16.

Each of FIGS. 18 and 19 is a cross-sectional diagram illustrating one step in the method of manufacturing the memory device of the first embodiment.

Figure 20:
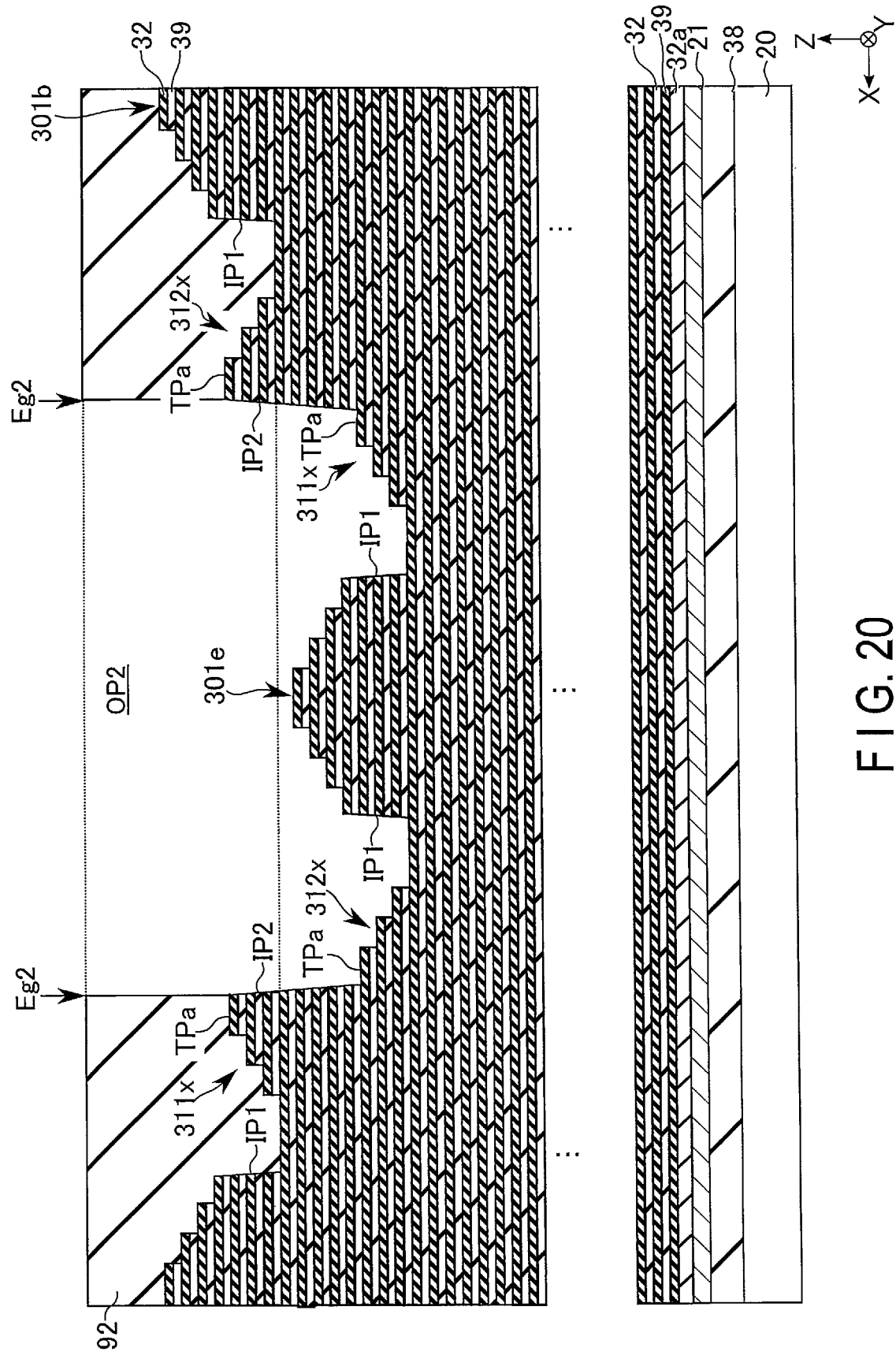

FIG. 20 is a cross-sectional diagram showing region XX of FIG. 19.

Each of FIGS. 21 and 22 is a cross-sectional diagram illustrating one step in the method of manufacturing the memory device of the first embodiment.

Figure 23:
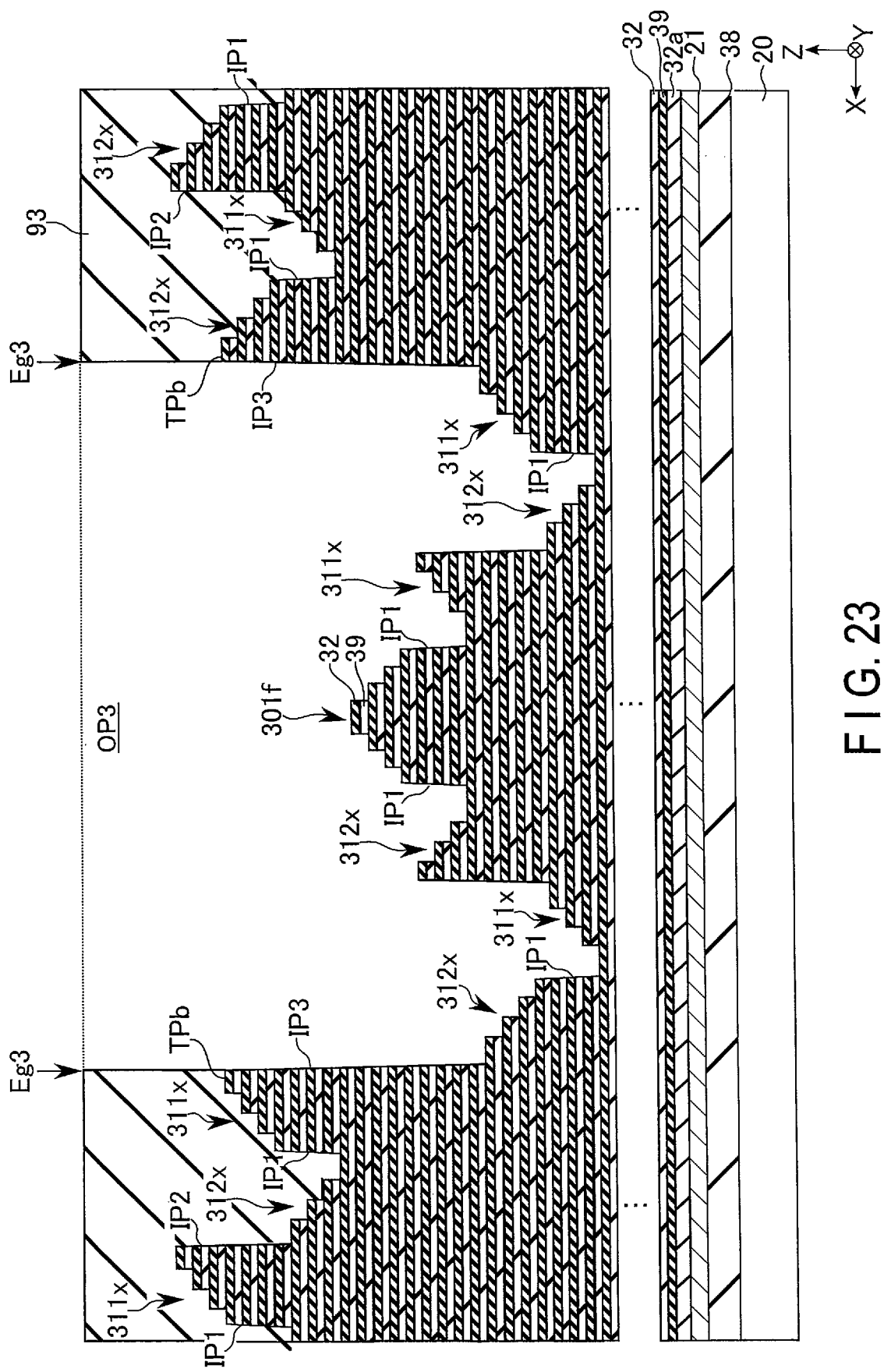

FIG. 23 is a cross-sectional diagram showing region XXIII of FIG. 22.

FIG. 24 is a cross-sectional diagram illustrating one step in the method of manufacturing the memory device of the first embodiment.

FIG. 25 is a cross-sectional view showing an example of a cross-sectional structure of a hookup portion of a memory cell array of a memory device of the second embodiment.

Figure 26:
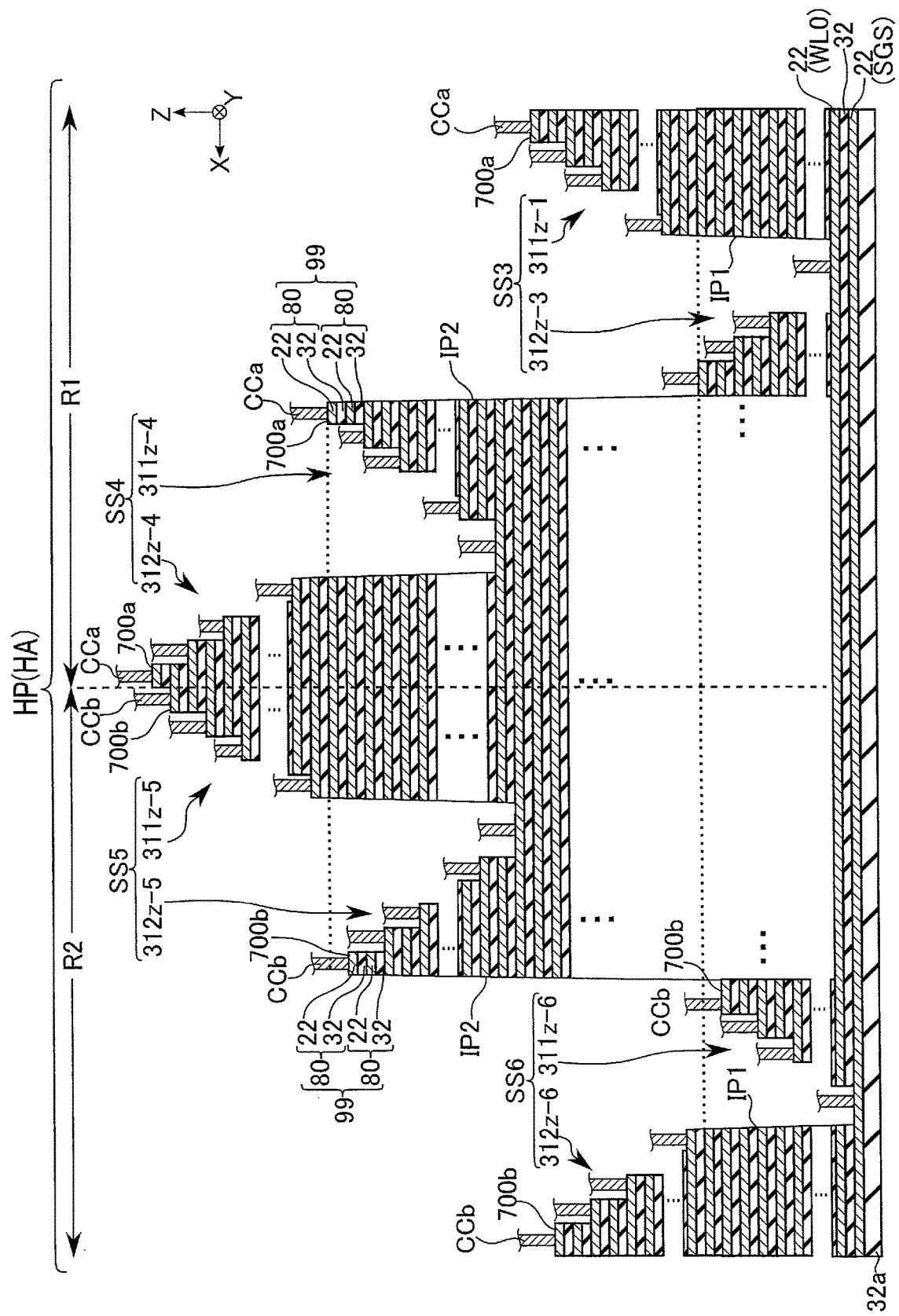

FIG. 26 is a schematic cross-sectional diagram showing region XXVI of FIG. 25.

Each of FIGS. 27, 28, 29 and 30 is a cross-sectional diagram illustrating one step in the method of manufacturing the memory device of the second embodiment.

Figure 30:
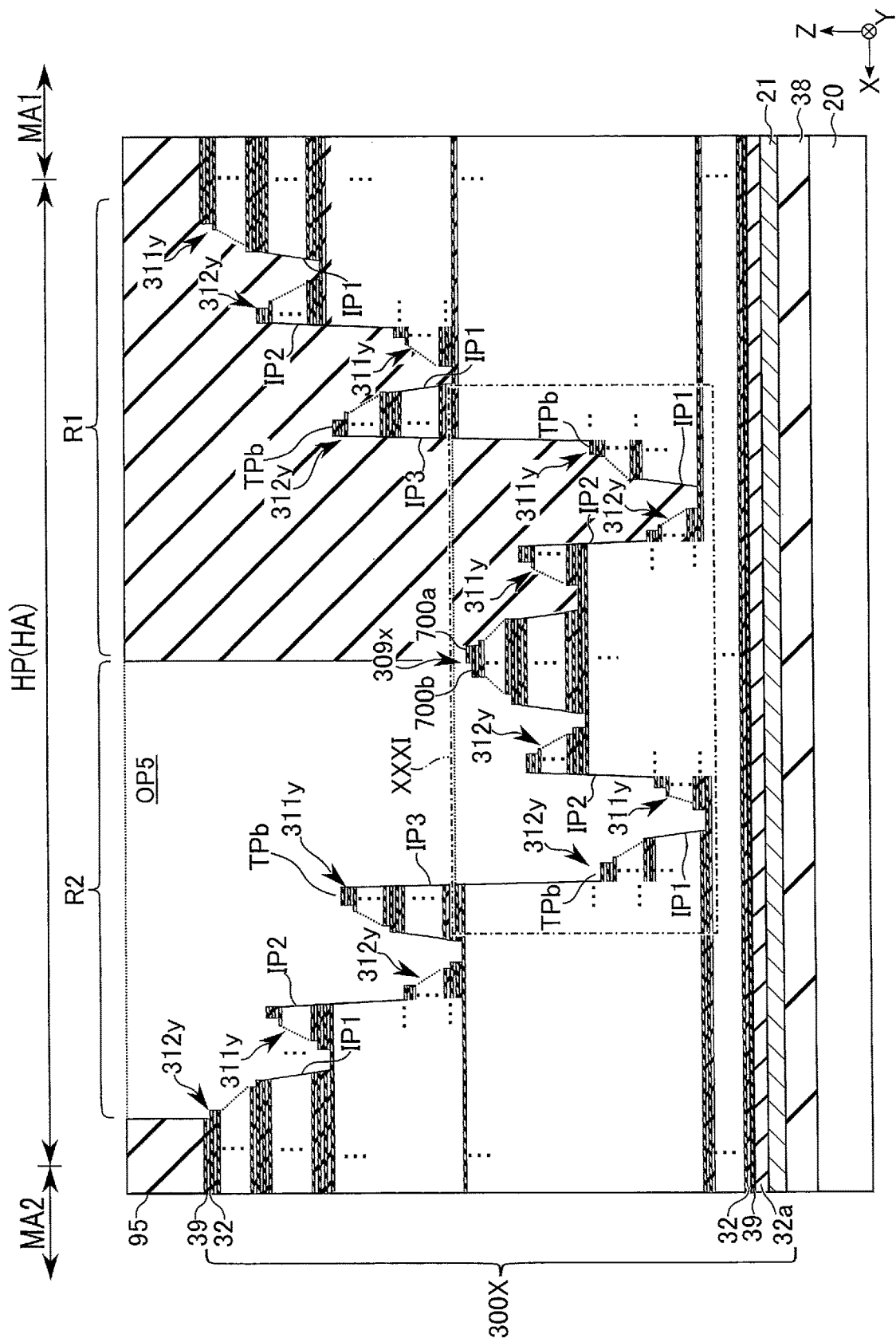
Figure 31:
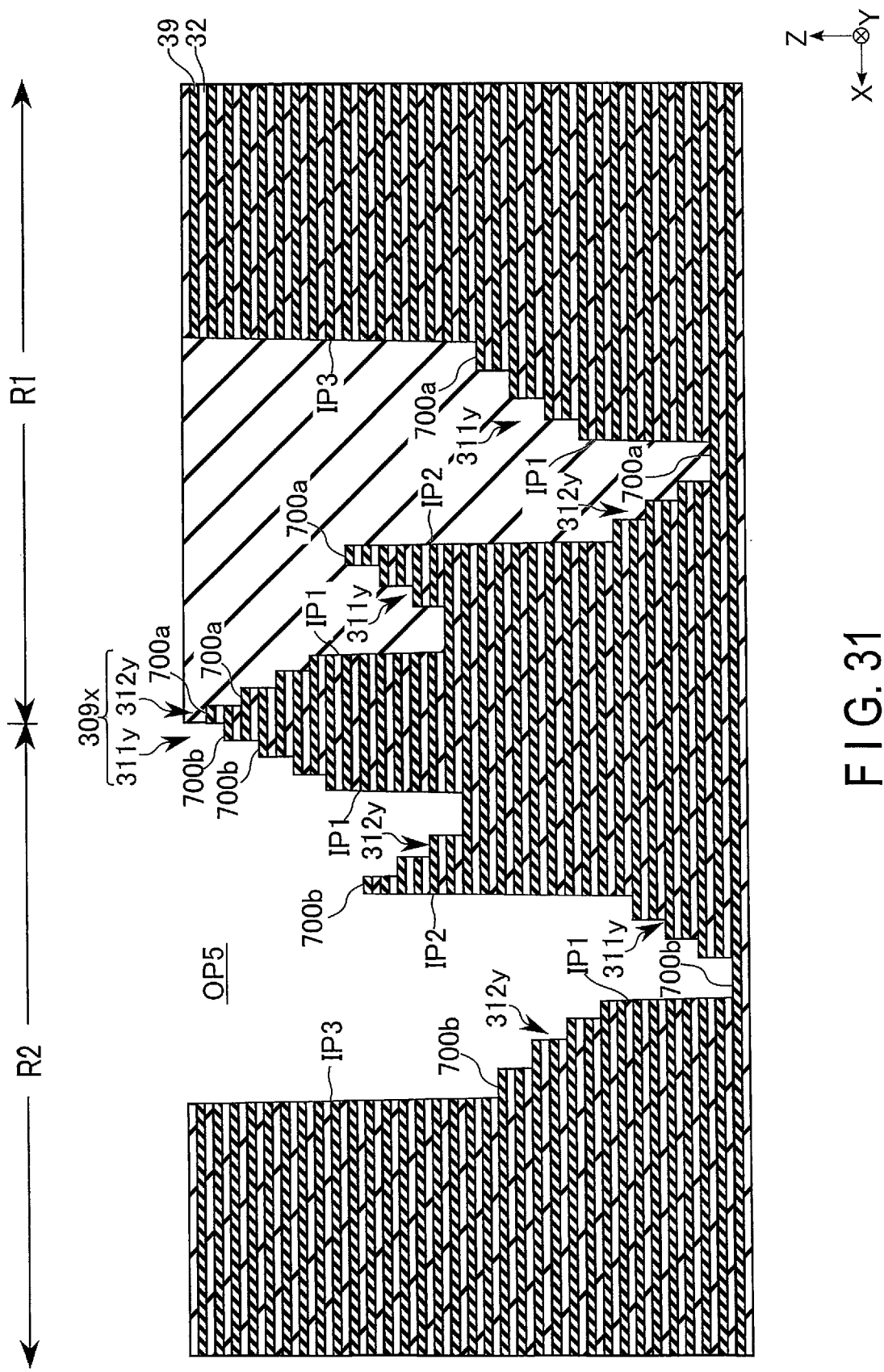

FIG. 31 is a cross-sectional diagram showing region XXXI of FIG. 30.

DETAILED DESCRIPTION

In general, according to one embodiment, a memory device includes: first and second memory areas each including a plurality of conductive layers stacked in a first direction and being arranged in a second direction perpendicular to the first direction; a bridge portion provided between the first memory area and the second memory area in the second direction, the bridge portion coupling the plurality of conductive layers of the first memory area and the plurality of conductive layers of the second memory area to each other; a hookup portion provided between the first memory area and the second memory area in the second direction, the hookup portion including a plurality of terraces coupled to the plurality of conductive layers via the bridge portion; a plurality of interconnects provided in correspondence with the plurality of terraces above the hookup portion; and a plurality of contacts that electrically couple the plurality of terraces and the plurality of interconnects to each other, wherein the hookup portion includes a first sub-staircase, a second sub-staircase, a third sub-staircase and a fourth sub-staircase each including corresponding ones of the plurality of terraces, the first to fourth sub-staircases are arranged in order of the first sub-staircase, the second sub-staircase, the third sub-staircase and the fourth sub-staircase in a direction from a side of the first memory area toward a side of the second memory area, and the first to fourth sub-staircases are arranged in order of the first sub-staircase, the second sub-staircase, the fourth sub-staircase and the third sub-staircase in a direction from a side of the plurality of interconnects toward a side of the plurality of terraces.

EMBODIMENTS

Hereinafter, embodiments will be described with reference to the accompanying drawings. The drawings are schematic or conceptual. The dimensions and scales of the drawings are not necessarily the same as those of actual products. In the description below, structural elements having the same functions and configurations will be denoted by the same reference symbols. The numbers after the letters of reference symbols are referred to by the reference signs containing the same letters and are used to distinguish between elements having similar configurations. Where elements denoted by reference symbols including the same symbols need not be discriminated from each other, they will be denoted by reference symbols including only letters.

(1) First Embodiment

A memory device of the first embodiment will be described with reference to FIGS. 1 to 24.

[a] Configuration Example

[a-1] Configuration of Memory Device 1

FIG. 1 is a block diagram showing an example of the overall configuration of a memory device 1 of an embodiment. The memory device 1 can be controlled by an external memory controller 2. The memory device 1 is a semiconductor memory; for example, it is a NAND flash memory capable of storing data in a nonvolatile manner. When the memory device 1 is the NAND flash memory, the memory device 1 communicates with the memory controller 2 by exchanging various control signals and performing data transfers based on the interface standard of the NAND flash memory.

As shown in FIG. 1, the memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). Each block BLK includes an aggregation of a plurality of memory cells capable of storing data in a nonvolatile manner. In the NAND flash memory, the block BLK is used, for example, as a data erasing unit. The memory cell array 10 is provided with a plurality of bit lines and a plurality of word lines. For example, each memory cell is associated with one bit line and one word line. The detailed configuration of the memory cell array 10 will be described later.

The command register 11 holds a command CMD which the memory device 1 receives from the memory controller 2. The command CMD includes, for example, an instruction for causing the sequencer 13 to execute a read operation, a write operation, an erase operation, etc.

The address register 12 holds address information ADD which the memory device 1 receives from the memory controller 2. The address information ADD includes, for example, a block address BA, a page address PA, and a column address CA. For example, the block address BA, the page address PA, and the column address CA are used to select a block BLK, a word line and a bit line, respectively.

The sequencer 13 controls the overall operation of the memory device 1. For example, the sequencer 13 controls the driver module 14, the row decoder module 15, the sense amplifier module 16 etc., based on the command CMD held in the command register 11, to execute a read operation, a write operation, an erase operation, etc.

The driver module 14 generates voltages used in the read operation, write operation, erase operation, etc. The driver module 14 applies the generated voltages to the interconnect corresponding to a selected word line, for example, based on the page address PA held in the address register 12.

The row decoder module 15 selects one of the blocks BLK in the corresponding memory cell array 10, based on the block address BA held in the address register 12. The row decoder module 15 transfers, for example, the voltage applied to the interconnect corresponding to the selected word line to the selected word line in the selected block BLK.

In the write operation, the sense amplifier module 16 applies a desired voltage to each bit line in accordance with the write data DAT received from the memory controller 2. In the read operation, the sense amplifier module 16 determines the data stored in the memory cell, based on the voltage of the bit line (or the presence/absence of a current flowing through the bit line), and transfers a determination result to the memory controller 2 as read data DAT.

The memory device 1 and the memory controller 2 described above may constitute one device (or one system) by combining them together. Examples of such a device include a memory card (for example, an SD™ card), a USB (universal serial bus) memory, a UFS (universal flash storage) device, and an SSD (solid state drive).

[a-2] Circuit Configuration of Memory Cell Array 10

FIG. 2 is a circuit diagram showing an example of the circuit configuration of the memory cell array 10 included in the memory device 1 of the present embodiment. FIG. 2 shows one block BLK among a plurality of blocks BLK included in the memory cell array 10. As shown in FIG. 2, the block BLK includes, for example, five string units SU0 to SU4.

Each string unit SU includes a plurality of NAND strings NS associated with bit lines BL0 to BLm-1 (m is an integer of 1 or more), respectively. Each NAND string NS includes, for example, memory cell transistors (hereinafter referred to simply as memory cells as well) MT0 to MTn-1, and select transistors STD and STS. Each memory cell transistor MT includes a control gate and a charge storage layer. Each memory cell transistor MT can store data substantially in a nonvolatile manner. Each of the select transistors STD and STS is used to select a string unit SU during various operations.

In each NAND string NS, the memory cell transistors MT0 to MTn-1 are coupled in series. The drain of the select transistor STD is coupled to one associated bit line BL among the plurality of bit lines BL0 to BLm-1. The source of the select transistor STD is coupled to one end of the memory cell transistors MT0 to MT1n-1 coupled in series. The drain of the select transistor STS is coupled to the other end of the memory cell transistors MT0 to MTn-1 coupled in series. The source of the select transistor STS is coupled to the source line SL.

Each of the control gates of the memory cell transistors MT0 to MTn-1 is coupled to one associated word line WL among the plurality of word lines WL0 to WLn-1.

The gates of the plurality of select transistors STS are coupled to the select gate line SGS.

The gates of the plurality of select transistors STD in the string unit SU0 are coupled to the select gate line SGD0. The gates of the plurality of select transistors STD in the string unit SU1 are coupled to the select gate line SGD1. The gates of the plurality of select transistors STD in the string unit SU2 are coupled to the select gate line SGD2. The gates of the plurality of select transistors STD in the string unit SU3 are coupled to the select gate line SGD3. The gates of the plurality of select transistors STD in the string unit SU4 are coupled to the select gate line SGD4.

Different column addresses are assigned to the bit lines BL0 to BLm-1. Each bit line BL is shared by NAND strings NS to which the same column address is assigned in a plurality of blocks BLK. The select gate lines SGD0 to SGD4 and SGS and the word lines WL0 to WLn-1 are provided for each block BLK. The source line SL is shared, for example, by a plurality of blocks BLK.

A set of memory cell transistors MT coupled to a common word line WL in one string unit SU are referred to, for example, as a cell unit CU. For example, the storage capacity of the cell unit CU including the memory cell transistor MT for storing 1-bit data is defined as "1 page". The cell unit CU may have a storage capacity of two pages or more in accordance with the number of bits of data stored in each memory cell transistor MT.

The circuit configuration of the memory cell array 10 of the memory device 1 of the embodiment is not limited to the above configuration. The number of string units SU included in each block BLK and the numbers of memory cell transistors MT and select transistors STD and STS included in each NAND string NS can be appropriately changed according to the circuit configuration of the memory cell array 10.

[a-3] Structure of Memory Cell Array 10

A description will be given of an example of the structure of the memory cell array 10 of the memory device 1 of the present embodiment. In the drawings referred to below, the X direction corresponds to the direction in which the word lines WL extend, the Y direction corresponds to the direction in which the bit lines BL extend, and the Z direction corresponds the direction perpendicular to the surface of semiconductor substrate 20 used for forming the memory device 1. In the plan views, hatching is added where appropriate to make the views easy to see. The hatching added to the plan view is not necessarily related to the materials and/or characteristics of the hatched component. In the cross-sectional views, the illustration of a configuration (member) is omitted as appropriate in order to make the views easy to see. The configuration in each drawing is shown in a simplified manner, as appropriate.

<Planar Layout of Memory Cell Array 10>

FIG. 3 is a plan view showing an example of a planar layout of the memory cell array 10 of the memory device 1 of the present embodiment. FIG. 3 shows areas corresponding to the eight blocks BLK0 to BLK7.

As shown in FIG. 3, the planar layout of the memory cell array 10 is divided into two memory areas MA1 and MA2 and a hookup area HA in the X direction, for example. Each of the memory areas MA1 and MA2 is an area used for storing data. Each of the memory areas MA1 and MA2 includes a plurality of NAND strings NS. The hookup area. HA is located between the memory areas MA1 and MA2 arranged in the X direction. The hookup area HA is an area in which contacts or the like of the interconnect stack of the memory cell array 10 are provided.

The memory cell array 10 includes a plurality of slits SLT and a plurality of slits SHE.

Each of the plurality of slits SLT has a portion extending in the X direction. The plurality of slits SLT are arranged in the Y direction. Each of the plurality of slits SLT crosses the memory areas MA1 and MA2 and the hookup area HA in the X direction. Each slit SLT has, for example, a structure in which an insulator and/or a plate-shaped contact are embedded inside (in the grooves of the interconnect stack). Each slit SLT divides a plurality of interconnects (e.g., word lines WL0 to WLn-1, select gate lines SGD and SGS) that are adjacent to each other, with the slits SLT interposed. In this example, each of the regions partitioned by the plurality of slits SLT corresponds to one block BLK. In the description given below, among the plurality of slits SLT arranged in the Y direction, the slits SLT arranged at the odd-numbered positions will be referred to as "SLTo", and the slits SLT arranged at the even-numbered positions will be referred to as "SLTe".

The plurality of slits SHE are arranged in the memory areas MA1 and MA2. Each of the plurality of slits SHE corresponding to the memory area MA1 is provided across the memory area MA1. In the memory area MA1, the plurality of slits SHE are arranged in the Y direction. Each of the plurality of slits SHE corresponding to the memory area MA2 is provided across the memory area MA2. In the memory area MA2, the plurality of slits SHE are arranged in the Y direction. In this example, four slits SHE are arranged between adjacent slits SLT. The slit SHE has a structure in which an insulator is embedded inside (in the grooves of the interconnect stack). The slit SHE divides interconnects that are adjacent to each other, with the slit SHE interposed. The slit SHE divides only the select gate line SGD. In this example, each of the regions partitioned by the slit SLT and the slit SHE (or by two slits SHE) corresponds to one string unit SU.

The hookup area HA includes a plurality of hookup portions HP and a plurality of bridge portions BRG.

The hookup portion HP includes a plurality of contacts (which may be referred to as contact portions as well) of the interconnect stack including a plurality of word lines WL etc. The hookup portion HP is a structure (hereinafter referred to as a staircase structure) including a plurality of sub-staircases (and a plurality of stadium-shaped staircase sections) described later. The hookup portion HP is arranged for each two blocks BLK. In other words, the hookup portion HP is arranged between the adjacent slits SLTo. Each hookup portion HP is divided by one slit SLTe. In the description given below, among the plurality of hookup portions HP arranged in the Y direction, the hookup portions HP located at the odd-numbered positions will be referred to as "HPo", and the hookup portions HP located at the even-numbered positions will be referred to as "HPe".

The bridge portion BRG electrically couples the memory areas MA1 and MA2 and the hookup portion HP via the interconnect stack of the memory cell array 10. The bridge portion BRG is a structure that is continuous with the interconnect stack of the two memory areas MA1 and MA2. Each of the plurality of conductive layers of the bridge portion BRG (which may also be referred to as bridge layers, for distinction) is electrically coupled to the corresponding conductive layers in the first memory area MA1 and the second memory area MA2. The bridge portion BRG is arranged for each block. Each bridge portion BRG is arranged between adjacent slits SLTo and SLTe. Between the slits SLTo and SLTe, the bridge portion BRG is adjacent to the hookup portion HP in the Y direction. For example, the bridge portion BRG is provided between the slit SLTo and the hookup portion HP. The bridge portions BRG which are adjacent to each other in the Y direction, with the slit SLTo in between, are separated and insulated by the slit SLTo.

In this manner, the conductive layers (and the insulating layers) in the interconnect stack of the memory cell array 10 extend from the memory areas MA1 and MA2 to the bridge portion BRG, and further extends from the bridge portion BRG to the hookup portion HP. The two memory areas MA1 and MA2 arranged in the X direction are electrically coupled via the bridge portion BRG extending in the X direction. Each conductive layer of the portion continuous with the memory area MA in the hookup portion HP may have a region that is directly coupled to each conductive layer of the memory area MA without the bridge portion BRG.

The hookup area HA may further include a contact area (not shown). A plurality of contact areas are arranged, for example, for each block BLK. The contact area includes a plurality of contacts (not shown). A plurality of contacts of the hookup portion HP are coupled to the contacts in the contact area. The contacts in the contact area couples the contacts of the hookup portion HP and the interconnects above the memory cell array 10 to the interconnects that are below the memory cell array 10. The contact area may be provided between the hookup portion HP and the memory area MA in the X direction, or may be provided along the slit SLTe in the hookup portion HP.

In the memory cell array 10, the layout shown in FIG. 3 is repeatedly arranged in the Y direction. The memory cell array 10 of the memory device 1 of the present embodiment may have a planar layout different in structure from that shown in FIG. 3. The number of slits SHE arranged between the adjacent slits SLT can be designed to be any number. The number of string units SU formed between the adjacent slits SLT can be changed based on the number of slits SHE arranged between the adjacent slits SLT.

<Structure of Memory Area MA of Memory Cell Array 10>
(Planar Layout of Memory Area MA of Memory Cell Array 10)

Figure 4:
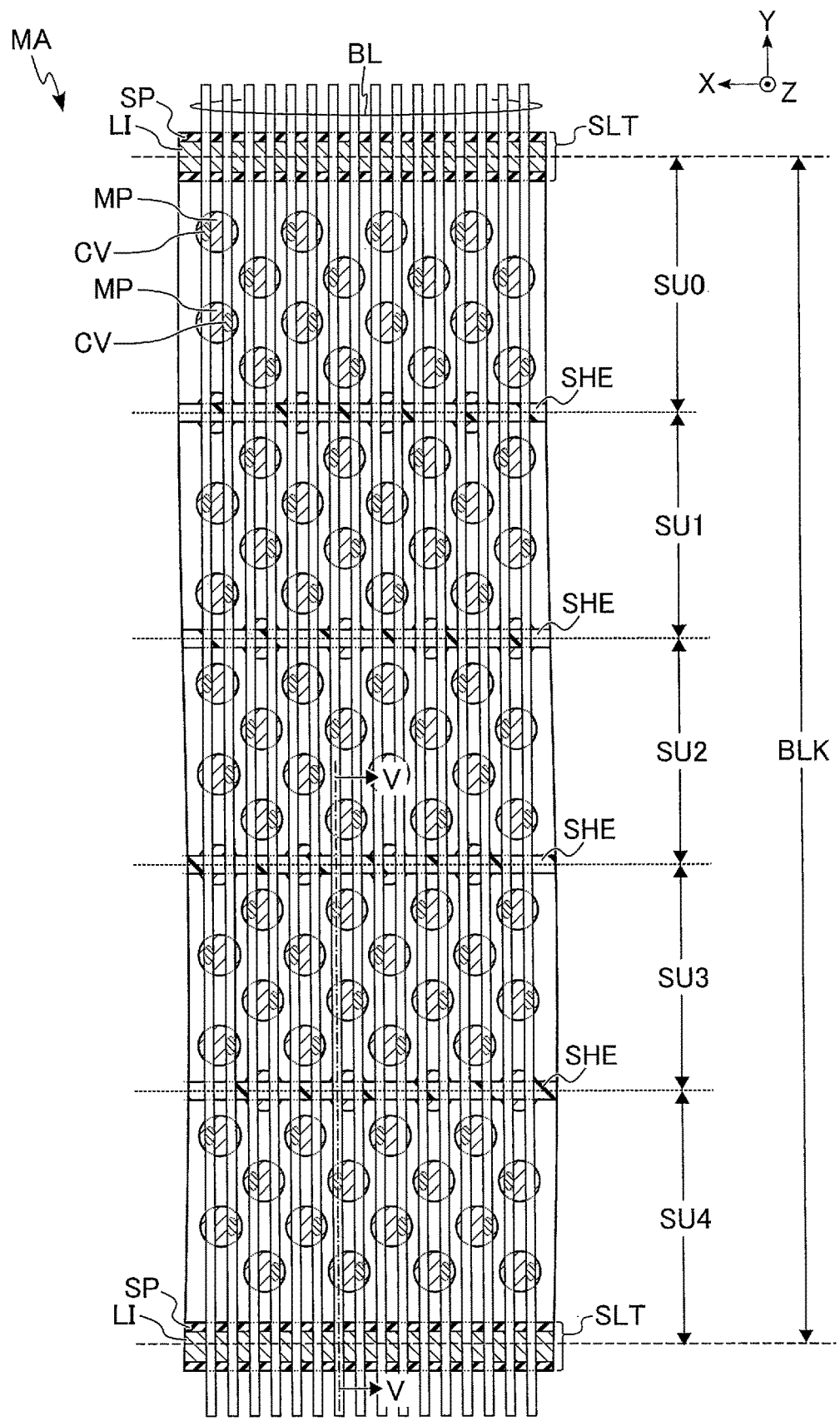
FIG. 4 is a plan view showing an example of a planar layout of a memory area of the memory cell array of the memory device of the first embodiment.

FIG. 4 is a plan view showing an example of a planar layout of the memory area MA in the memory cell array 10 of the memory device 1 of the present embodiment. FIG. 4 displays one block BLK. As shown in FIG. 4, in the memory area MA, the memory cell array 10 includes a plurality of memory pillars MP, a plurality of contacts CV, and a plurality of bit lines BL. Each slit SLT includes a contact LI and a spacer SP.

Each of the memory pillars MP functions, for example, as one NAND string NS. In the region between two adjacent slits SLT, the plurality of memory pillars MP are arranged, for example, in 24 rows and in a staggered pattern. The slit SHE overlaps the memory pillars MP at a predetermined interval (pitch). The memory pillars MP that overlap the slit SHE are in contact with two different select gate lines SGD.

The plurality of bit lines BL are arranged in the X direction. Each of the plurality of bit lines BL has a portion extending in the Y direction. Each bit line BL is arranged such that it overlaps at least one memory pillar MP in the Z direction in each string unit SU. In this example, two bit lines BL are arranged to overlap one memory pillar MP. One of the two bit lines BL overlapping the memory pillars MP is electrically coupled to the memory pillar MP via the contacts CV.

For example, the contact CV between the memory pillar MP in contact with the slit SHE and the bit line BL is omitted. Therefore, the memory pillar MP in contact with the slit SHE is electrically separated from the bit line BL.

The number of components and the arrangement of components, such as the memory pillars MP and the slits SHE, between the adjacent slits SLT are not limited to the configuration described with reference to FIG. 4, and may be changed as appropriate. The number of bit lines BL overlapping each memory pillar MP can be designed to be any number.

The contact LI is a conductor having a portion extending in the X direction. The spacer SP is an insulator provided on the side surface of the contact LI. The contact LI is sandwiched by the spacers SP. The contact LI is separated and insulated by the spacer SP from the conductors (for example, the word lines WL0 to WLn-1 and the select gate lines SGD and SGS) that are adjacent to the contact LI in the Y direction.

(Cross-sectional Structure of Memory Area MA of Memory Cell Array 10)

Figure 5:
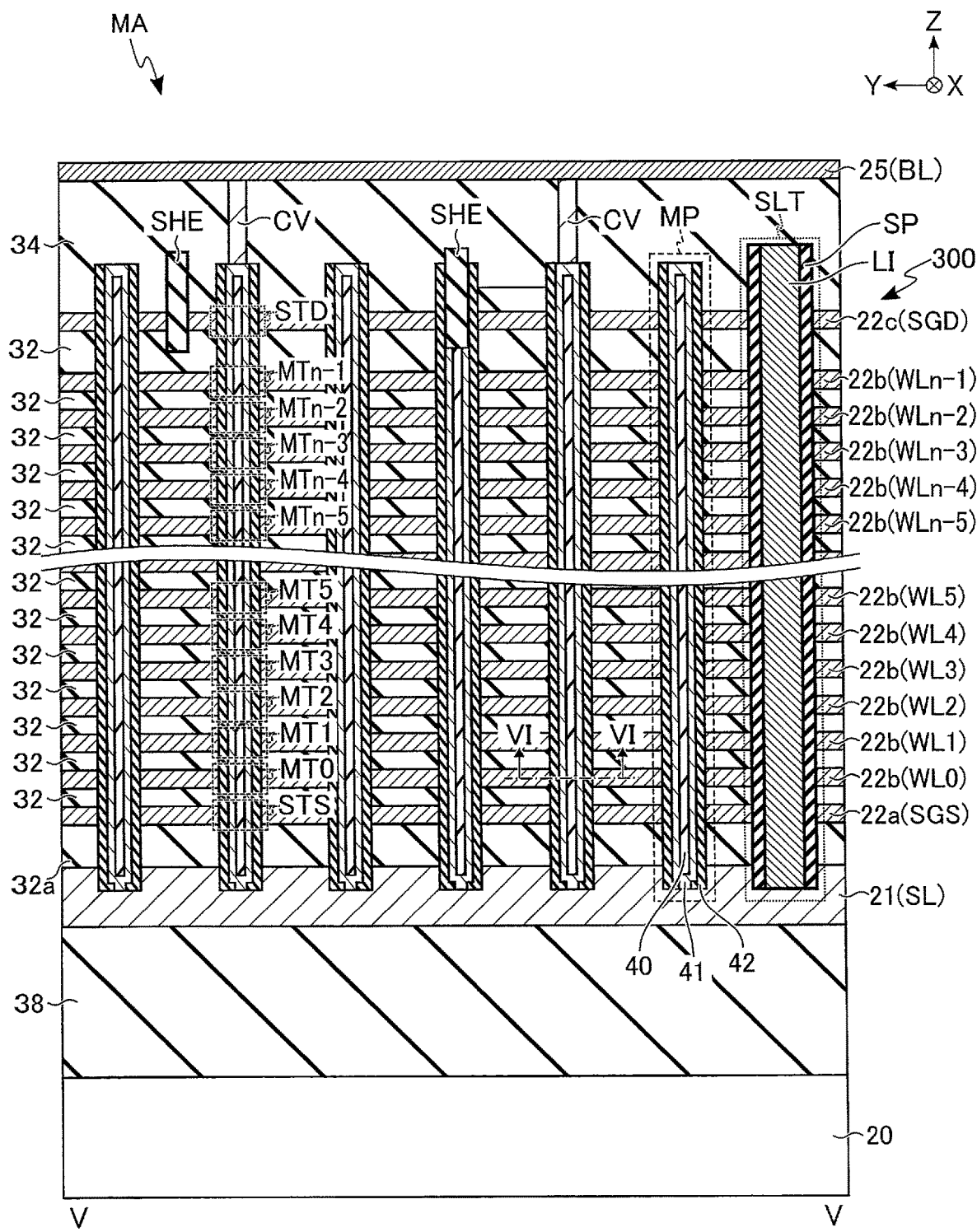
FIG. 5 is a cross-sectional view showing an example of a cross-sectional structure of the memory area of the memory cell array of the memory device of the first embodiment.

FIG. 5 is a cross-sectional view taken along line V-V of FIG. 4 and showing an example of a cross-sectional structure of the memory area MA of the memory cell array 10 of the memory device 1 of the present embodiment. As shown in FIG. 5, the memory cell array 10 further includes a semiconductor substrate (which may be hereinafter referred to simply as a substrate) 20, conductive layers 21, 22 and 25, and insulating layers 32*a*, 32, 34 and 38. The memory cell array 10 has a structure (interconnect stack 300) in which a plurality of conductive layers 22 (22*a*, 22*b*, 22*c*) are stacked in the Z direction.

An insulating layer 38 is provided on the upper surface of the semiconductor substrate 20. The insulating layer 38 covers circuits (not shown) corresponding to, for example, the row decoder module 15 and/or the sense amplifier module 16 on the semiconductor substrate 20.

The conductive layer 21 is provided on the upper surface of the insulating layer 38. The conductive layer 21 is, for example, a plate-shaped layer extending along the XY plane. The conductive layer 21 is used as the source line SL. The conductive layer 21 includes, for example, silicon doped with phosphorus.

The insulating layer 32*a* is provided on the upper surface of the conductive layer 21. The conductive layer 22*a* is provided on the upper surface of the insulating layer 32*a*. The conductive layer 22*a* is, for example, a plate-shaped layer expanding in an X-Y plane. The conductive layer 22*a* is used as a select gate line SGS. The conductive layer 22*a* includes, for example, tungsten.

The insulating layers 32 and the conductive layers 22*b* are alternately stacked in the Z direction on the upper surface of the conductive layer 22*a*. Each conductive layer 22*b* is, for example, a plate-shaped layer expanding in an X-Y plane. The plurality of stacked conductive layers 22*b* are used as word lines WL0 to WLn-1, respectively, in order from the side of the semiconductor substrate 20. The conductive layers 22*b* includes, for example, tungsten.

The conductive layer 22*c* is provided above the uppermost conductive layer 22*b*, with an insulating layer 32 interposed. The conductive layer 22*c* is, for example, a plate-like layer extending along the XY plane. The conductive layer 22*c* is used as the select gate line SGD. The conductive layer 22*c* includes, for example, tungsten.

The insulating layer 34 is provided on the upper surface of the conductive layer 22*c*. The insulating layer 34 may be made up of a plurality of layers. The conductive layer 25 is provided on the upper surface of the insulating layer 34. The conductive layer 25 is, for example, a linear layer extending in the Y direction. The conductive layer 25 is used as a bit line BL. In a region that is not shown, a plurality of conductive layers 25 are arranged in the X direction. The conductive layer 25 includes, for example, copper.

Each of the memory pillars MP is provided to extend in the Z direction in the interconnect stack 300, and penetrates the insulating layers 32 and the conductive layers 22. The bottom of each memory pillar MP is in contact with the conductive layer 21. The intersection between the memory pillar MP and the conductive layer 22*a* functions as a select transistor STS. The intersection between the memory pillar MP and each conductive layer 22*b* functions as one memory cell transistor MT. The intersection between the memory pillar MP and the conductive layer 22*c* functions as a select transistor STD.

Each of the memory pillars MP includes, for example, a core member 40, a semiconductor layer 41, and a stacked film 42. The core member 40 is provided to extend in the Z direction. For example, the upper end of the core member 40 is included in a layer upper than the conductive layer 22*c*, and the lower end of the core member 40 reaches the conductive layer 21. The semiconductor layer 41 covers the periphery of the core member 40. At the bottom of the memory pillar MP, part of the semiconductor layer 41 is in contact with the conductive layer 21. The stacked film 42 covers the side and bottom surfaces of the semiconductor layer 41 except for the portion where the semiconductor layer 41 and the conductive layer 21 are in contact with each other. The core member 40 includes an insulator such as silicon oxide. The semiconductor layer 41 includes, for example, silicon.

A columnar contact CV is provided on the upper surface of the semiconductor layer 41 in the memory pillar MP. In the illustrated region, two contacts CV corresponding to two of the six memory pillars MP are depicted. In the memory area MA, a contact CV is coupled to the memory pillar MP that does not overlap the slit SHE and to which the contact CV is not coupled, in a region that is not shown (for example, a region in the depth direction or the front direction of the drawing sheet).

One conductive layer 25 (that is, one bit line BL) is in contact with the upper surface of the contact CV. One contact CV is coupled to one conductive layer 25 in each of the spaces partitioned by the slits SLT and SHE. That is, the memory pillar MP provided between the adjacent slits SLT and SHE and the memory pillar MP provided between the two adjacent slits SHE are electrically coupled to each of the conductive layers 25.

The slit SLT has a portion provided along the X-Z plane, for example, and divides the conductive layer 22. The contact LI in the slit SLT is provided along the slit SLT. Part of the upper end of the contact LI is in contact with the insulating layer 34. The lower end of the contact LI is in contact with the conductive layer 21. The contact LI is used, for example, as part of the source line SL. A spacer SP is provided at least between the contact LI and the conductive layers 22a, 22b and 22c. The contact LI and the conductive layers 22a, 22b and 22c are separated and insulated by the spacer SP.

The slit SHE has, for example, a portion provided along the X-Z plane and divides at least the conductive layer 22c. The upper end of the slit SHE is in contact with the insulating layer 34. The lower end of the slit SHE is in contact with the insulating layer 32 between the uppermost conductive layer 22b and the conductive layer 22c. The slit SHE includes an insulator such as silicon oxide. The upper end of the slit SHE and the upper end of the slit SLT may be aligned or may not be aligned. The upper end of the slit SHE and the upper end of the memory pillar MP may be aligned or may not be aligned.

Figure 6:
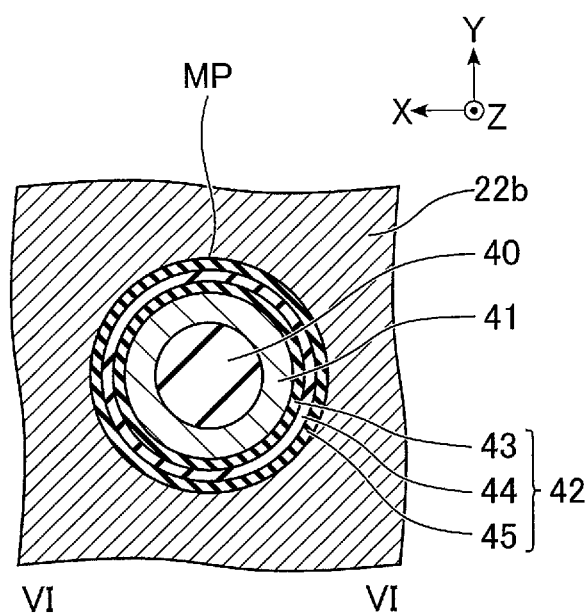
FIG. 6 is a cross-sectional view showing an example of the cross-sectional structure of a memory pillar of the memory device of the first embodiment.

FIG. 6 is a cross-sectional view taken along line VI-VI of FIG. 5 and showing an example of the cross-sectional structure of the memory pillar MP in the memory device 1 of the present embodiment. FIG. 6 shows the cross-sectional structure of the memory pillar MP in a layer parallel to the surface of the semiconductor substrate 20 and including the conductive layer 22.

As shown in FIG. 6, the stacked film 42 includes, for example, a tunnel insulating film 43, a charge trap film 44, and a block insulating film 45.

In the cross section including the conductive layer 22, a core member 40 is provided in the central portion of the memory pillar MP. A semiconductor layer 41 surrounds the side surface of the core member 40. The tunnel insulating film 43 surrounds the side surface of the semiconductor layer 41. The charge trap film 44 surrounds the side surface of the tunnel insulating film 43. The block insulating film 45 surrounds the side surface of the charge trap film 44. The conductive layer 22 surrounds the side surface of the block insulating film 45. The tunnel insulating film 43 includes, for example, silicon oxide. The charge trap film 44 includes, for example, silicon nitride. The block insulating film 45 includes, for example, silicon oxide or aluminum oxide.

In each of the above-mentioned memory pillars MP, the semiconductor layer 41 is used as channel regions (current paths) of the memory cell transistors MT0 to MTn-1 and the select transistors STD and STS. The charge trap film 44 is used as a charge storage layer of the memory cell transistor MT. The memory device 1 allows a current to flow between the bit line BL and the contact LI (source line SL) via the memory pillar MP, by turning on the memory cell transistors MT0 to MTn-1 and the select transistors STD and STS.

<Structure of Hookup Portion HP of Memory Cell Array 10>

A description will be given with reference to FIGS. 7 to 12 for the structure of the hookup portion HP in the memory device 1 of the present embodiment.

Figure 7:
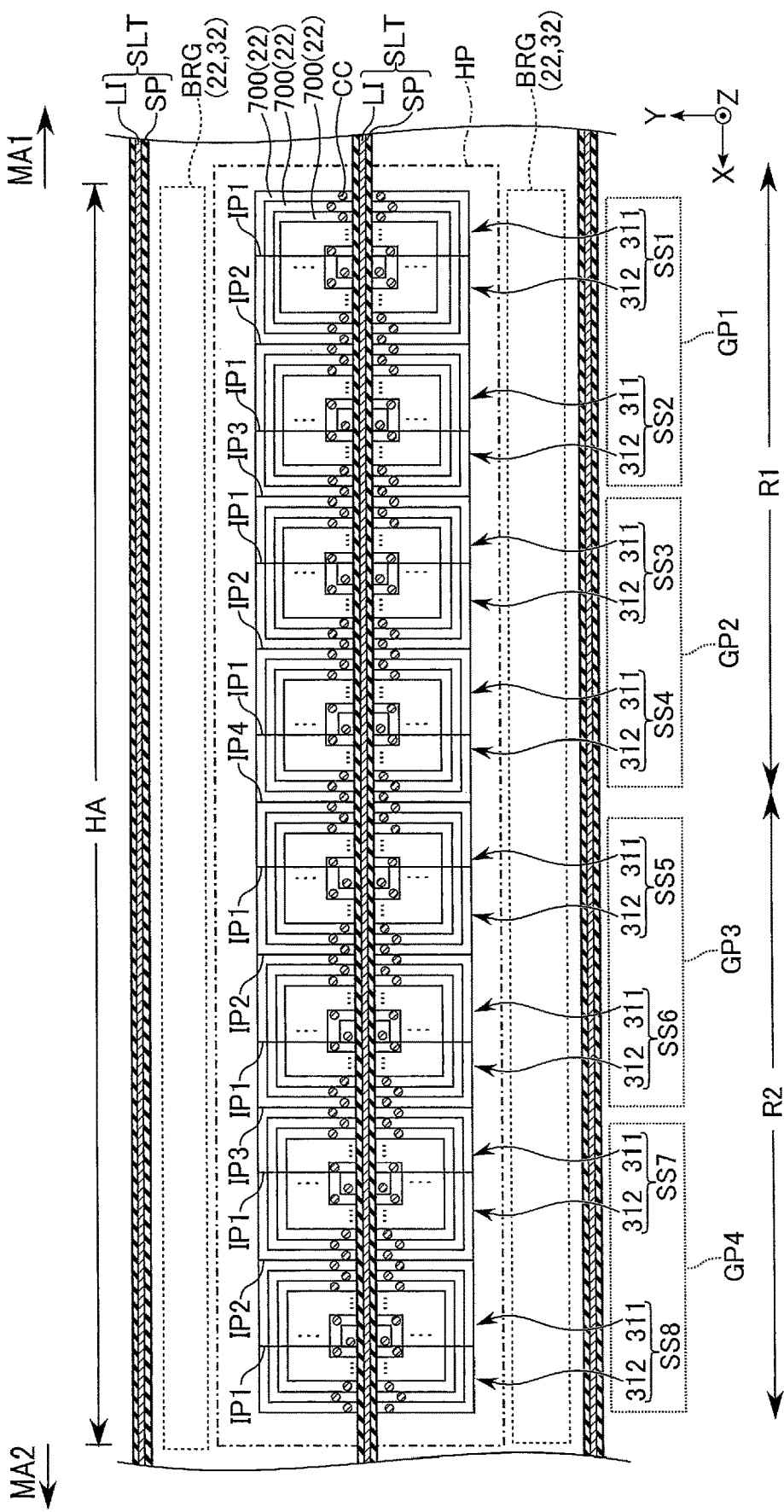
FIG. 7 is a plan view showing an example of a planar layout of a hookup portion of the memory cell array of the memory device of the first embodiment.
Figure 8:
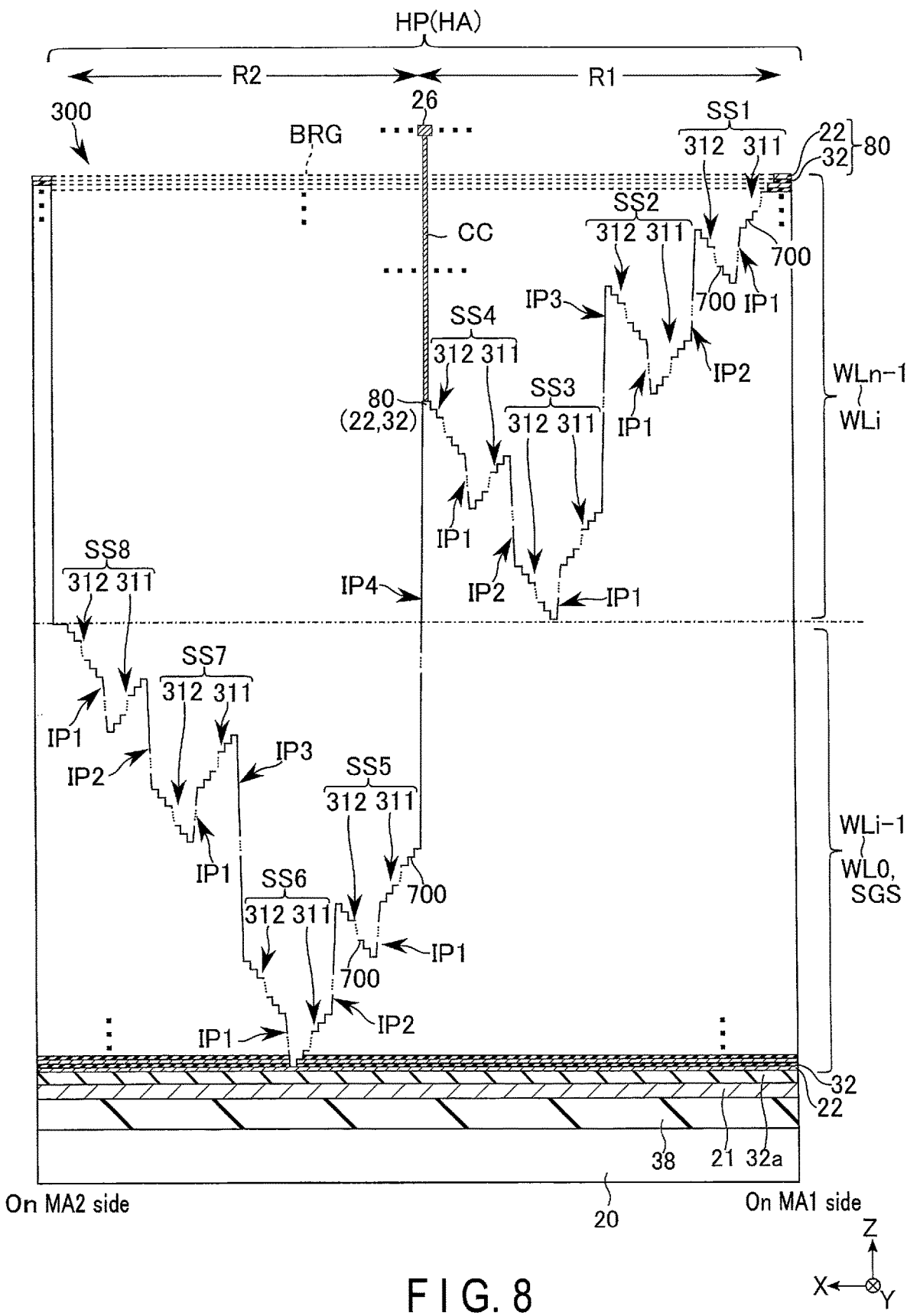
FIG. 8 is a cross-sectional view showing an example of a cross-sectional structure of the hookup portion of the memory cell array of the memory device of the first embodiment.

FIG. 7 is a plan view showing an example of the planar layout of the hookup portion HP of the memory cell array 10 in the memory device 1 of the present embodiment. FIG. 8 is a cross-sectional view showing an example of the cross-sectional structure of the hookup portion HP of the memory cell array 10 in the memory device 1 of the present embodiment. For clarity of illustration, some of the components of the hookup portion HP are not shown in FIG. 8 or are shown in a simplified manner.

As shown in FIGS. 7 and 8, each hookup portion HP includes a plurality of staircase forming portions (hereinafter referred to as sub-staircases) 311 and 312. A plurality of sub-staircases 311 and a plurality of sub-staircases 312 are provided in each hookup portion HP such that they are alternately arranged in the X direction when they are viewed in the Z direction. The plurality of sub-staircases 311 and 312 are provided at different positions (heights, hierarchical areas) in the Z direction when they are viewed in the Y direction. For example, in the hookup portion HP, the plurality of sub-staircases 311 and 312 are laid out such that the arrangement of the plurality of sub-staircases 311 and 312 gradually descends from the end sides of the memory area MA toward the central portion of the hookup portion HP.

Each sub-staircase 311, 312 includes a plurality of conductive layers 22 and a plurality of insulating layers 32. Each of the conductive layers 22 and the insulating layers 32 is a layer that extends from the interconnect stack 300 of the memory area MA via a bridge portion ERG or directly from the memory area MA. Each sub-staircase 311, 312 includes k conductive layers 22. In each sub-staircase 311, 312, one conductive layer 22 and one insulating layer 32 form one stair 80. Each sub-staircase 311, 312 includes a plurality of stairs 80 (for example, k stairs) arranged in the Z direction. It is desirable that "k" is a value represented by a power of 2 (for example, 2, 4, 8, and 16, . . . ).

In each sub-staircases 311, 312, each of the plurality of conductive layers 22 includes a plurality of portions 700 (hereinafter referred to as terraces or terrace portions) that do not overlap the upper layers (conductive layers 22 and insulating layers 32) in the Z direction. In each sub-staircase 311, 312, each of the plurality of terraces (for example, k terraces) 700 is provided on each of the plurality of stairs 80 included in the sub-staircases 311 and 312. Since the terraces 700 are formed, a step is formed between the plurality of stairs 80 of the sub-staircases 311 and 312. In the description given below, the side on which the terrace 700 is formed (the side having a step) of each sub-staircase 311, 312 will be referred to as a step forming surface (or a staircase forming surface, a step arrangement area, or a terrace arrangement area). The surfaces of the sub-staircases 311 and 312 on the opposite side of the step forming surface in the direction parallel to the surface of the semiconductor substrate 20 will be referred to as back surfaces.

Each of the sub-staircases 311 descends in the direction from the first memory area MA1 to the second memory area MA2. In other words, each of the sub-staircases 311 ascends in the direction from the second memory area MA2 to the first memory area MA1. In each sub-staircase 311, the plurality of terraces 700 are provided on the side facing the second memory area MA2.

Each of the sub-staircases 312 ascends in the direction from the first memory area MA1 to the second memory area MA2. In other words, each of the sub-staircases 312 descends in the direction from the second memory area MA2 to the first memory area MA1. In each sub-staircase 312, the plurality of terraces 700 are provided on the side facing the first memory area MA1.

In the description below, for the sake of distinction, the sub-staircases 311 may be conveniently referred to as the downward sub-staircase 311 and the sub-staircase 312 may be conveniently referred to as the upward sub-staircase 312.

In the present embodiment, one sub-staircase 311 and one sub-staircase 312 form one stadium-shaped staircase section SS (SS1, SS2, SS3, . . . , SS7, SS8). A plurality of stadium-shaped staircase sections (which may be referred to simply as staircase sections, or as a main staircase and a stadium-like structure) SS are arranged in the X direction in each hookup portion HP. In the plurality of stadium-shaped staircase sections SS, the plurality of sub-staircases 311 and 312 are arranged such that the step-forming surfaces of the sub-staircases 311 face the step-forming surfaces of the sub-staircases 312 when viewed in the Z direction.

The hookup portion HP includes a plurality of intermediate portions IP (IP1, IP2, IP3, IP4). Each intermediate portion IP is provided in the area between the sub-staircases 311 and 312 adjacent to each other in the X direction. In the description below, the intermediate portion IP may be referred to as a boundary portion (or a slope portion, a cliff portion, or a boundary region).

Each of the plurality of intermediate portions IP is formed by the side surfaces of a plurality of sets (a plurality of stairs 80) each consisting of one conductive layer 22 and one insulating layer 32. Each intermediate portion IP has a surface (hereinafter referred to as an inclined surface) inclined from the memory area MA1 toward the memory area MA2 or from the memory area MA2 toward the memory area MA1.

The intermediate portion IP is formed by an etching process that is performed for the hookup portion HP in the manufacturing process of the memory device 1. The plurality of intermediate portions IP1 indicate that they were collectively processed by the same manufacturing process. The plurality of intermediate portions IP2 indicate that they were collectively processed by the same manufacturing process. The plurality of intermediate portions IP3 indicate that they were collectively processed by the same manufacturing process.

Each intermediate portion IP1 is provided between the sub-staircase 311 and the sub-staircase 312 in each stadium-shaped staircase section SS. Each intermediate portion IP2 is provided between the stadium-shaped staircase sections SS. Each intermediate portion IP3 is provided between two groups GP each including a plurality of stadium-shaped staircase sections SS. The intermediate portion IP4 is provided between the first region R1 and the second region R2 in the hookup portion HP.

For example, in the hookup portion HP shown in FIG. 8, the plurality of conductive layers 22 of the plurality of sub-staircases 311 and 312 of the first region R1 correspond to the upper-half conductive layers 22 of the plurality of conductive layers 22 of the memory cell array 10 (i.e., the word lines WLi to WLn-1 and the select gate line SGD). The plurality of conductive layers 22 of the plurality of sub-staircases 311 and 312 of the second region R2 correspond to the lower-half conductive layers 22 of the plurality of conductive layers 22 of the memory cell array 10 (i.e., the select gate line SGS and the word lines WL0 to WLi-1).

The hookup portion HP includes a plurality of contacts (contact portions) CC.

Each of the plurality of contacts CCs is provided on the upper surface of the corresponding one terrace 700 of the plurality of terraces 700 of each sub-staircase 311, 312. Each contact CC is electrically coupled to one of the plurality of conductive layers 22 in the memory areas MA1 and MA2, via the terrace 700 and the bridge layer (conductive layer 22) of the bridge portion BRG.

A plurality of interconnects (for example, conductive layers including metal) 26 are provided above the hookup area HA in the Z direction. Each of the plurality of interconnects 26 is electrically coupled to the corresponding one of the plurality of contacts CC. Thus, each interconnect 26 is electrically coupled to the corresponding conductive layer 22 (word line WL or select gate line SGS, SGD) via the contact CC and the terrace 700. Each of the plurality of interconnects 26 is electrically coupled to such a circuit as the row decoder module 15 via another contact (not shown) provided in the contact area (not shown).

Depending on the structure of the hookup portion HP and the manufacturing process thereof, there may be a case where the terrace 700 is provided on each of two or more sub-staircases 311 and 312 in a certain layer (a conductive layer 22 of a certain position in the Z direction) of the hookup portion HP. In this case, a terrace that does not come into direct contact with the contact CC may be provided.

The memory device 1 of the present embodiment does not include a beam-like structure extending in the Z direction on the sub-staircases 311 and 312 (or on the intermediate portion IP) of the hookup portion HP. The beam-like structure is a surplus member (dummy pattern) that does not function as a constituent element of the memory device 1. The beam-like structure is a structure including one or more conductive layers (or insulating layers) and one or more insulating layers which are stacked in the Z direction. For example, this beam-like structure is generated during the manufacturing process in order to secure a dimensional margin in the alignment between the constituent members of the memory device 1 and the mask layer.

The number of sub-staircases 311 and 312 provided in the hookup portion HP is appropriately designed according to the number of conductive layers 22 in the interconnect stack 300 and the number of conductive layers 22 assigned to each sub-staircase 311, 312. For example, if the number of the conductive layers 22 is half that of the example shown in FIG. 8, the numbers of stadium-shaped staircase sections SS and the sub-staircases 311 and 312 provided in the region R1 define the hookup portion HP. In this case, a plurality of sub-staircases 311 and 312 (terraces 700) of the stadium-shaped staircase sections SS1 and SS2 in the region R1 are associated with the upper-half conductive layers 22 of the interconnect stack 300, and the plurality of sub-staircases 311 and 312 of the stadium-shaped staircase sections SS3 and SS4 in the region R1 are associated with the lower-half conductive layers 22 of the interconnect stack 300.

(Structural Example of Sub-Staircases 311 and 312)

Figure 9:
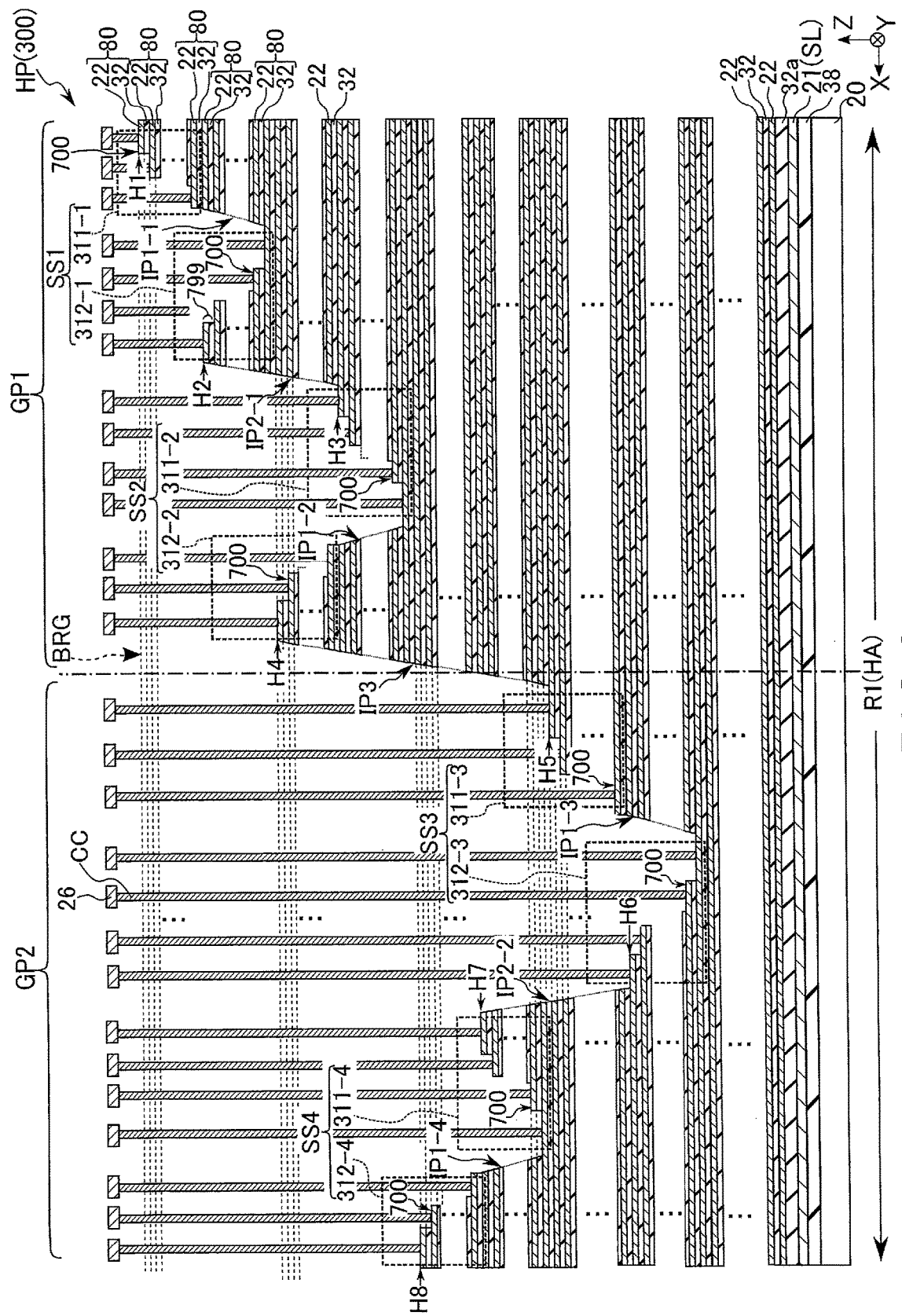
FIG. 9 is a cross-sectional view showing an example of a cross-sectional structure of the hookup portion of the memory device of the first embodiment.

A more specific description will be given with reference to FIG. 9 for the structure of the sub-staircases 311 and 312 in the hookup portion HP in the memory device 1 of the present embodiment. FIG. 9 is a cross-sectional view schematically showing structures of the plurality of stadium-shaped staircase sections SS and the plurality of sub-staircases 311 and 312 provided in the region R1 of the hookup portion HP of FIG. 8.

As shown in FIG. 9, each sub-staircase 311, 312 is provided in the stadium-shaped staircase section SS. In each stadium-shaped staircase section SS, the step forming surfaces of the two sub-staircases 311 and 312 face the center side of the stadium-shaped staircase section SS. In the two sub-staircases 311 and 312 of each stadium-shaped staircase section SS, the position of one sub-staircase in the Z direction is located above the position of the other sub-staircase in the Z direction.

As described above, each sub-staircase 311, 312 includes a terrace 700 provided on the conductive layer 22 of each stair 80. Thus, a step 799 is formed between the stairs 80 arranged in the Z direction.

In each stadium-shaped staircase section SS, an intermediate portion IP1 is provided between the two sub-staircases 311 and 312. The intermediate portion IP1 functions as a boundary portion between the two sub-staircases 311 and 312 of the stadium-shaped staircase section SS.

More specifically, each stadium-shaped staircase section SS1, SS2, SS3, SS4 shown in FIG. 9 has the configuration described below.

The first stadium-shaped staircase section SS1 includes a sub-staircase (downward sub-staircase) 311-1, a sub-staircase (upward sub-staircase) 312-1, and an intermediate portion IP1-1. The sub-staircase 311-1 is provided on the side of the memory area MA1, and the sub-staircase 312-1 is provided on the side of the memory area MA2. The position H1 of the sub-staircase 311-1 in the Z direction is higher than the position H2 of the sub-staircase 312-1 in the Z direction. It is noted here that the position of the top of each sub-staircase 311, 312 in the Z direction is used as a reference for comparing the positions of the sub-staircases 311 and 312 in the Z direction. The positions of members (such as the sub-staircases 311 and 312) in the hookup portion HP in the Z direction are represented as positions measured from the surface of the semiconductor substrate 20.

The intermediate portion IP1-1 is provided between the sub-staircase 311-1 and the sub-staircase 312-1 in the X-direction when they are viewed in the Z-direction. The intermediate portion IP1-1 faces the step forming surface of the lower sub-staircase 312-1 in the X direction when it is viewed in the Y direction. The intermediate portion IP1-1 is provided between the lowermost stair (bottom) of the upper sub-staircase 311-1 and the lowermost stair of the lower sub-staircase 312-2 in the Z direction when they are viewed in the Y direction. The inclined surface of the intermediate portion IP1-1 extends from the lowermost stair of the upper sub-staircase 311-1 to the lowermost stair of the lower sub-staircase 312-1. The inclined surface of the intermediate portion IP1 may be a surface substantially perpendicular to the surface of the semiconductor substrate 20.

The intermediate portion IP1 has a dimension D1 in the Z direction (see FIG. 12).

The second stadium-shaped staircase section SS2 is adjacent to the stadium-shaped staircase section SS1 via the intermediate portion IP2-1 in the X direction when they are viewed in the Z direction. The position of the stadium-shaped staircase section SS2 in the Z direction is lower than the position of the stadium-shaped staircase section SS1 in the Z direction.

The stadium-shaped staircase section SS2 includes a sub-staircase 311-2, a sub-staircase 312-2, and an intermediate portion IP1-2. The sub-staircase 311-2 is provided on the side of the memory area MA1, and the sub-staircase 312-2 is provided on the side of the memory area MA2. The sub-staircase 311-2 is aligned with the sub-staircase 312-1 in the X direction with the intermediate portion IP2-1 in between when they are viewed in the Z direction. The sub-staircase 311-2 is arranged between the sub-staircase 312-1 and the sub-staircase 312-2 in the X direction. The position H3 of the sub-staircase 311-2 in the Z direction is lower than the position H4 of the sub-staircase 312-2 in the Z direction.

In the two stadium-shaped staircase sections SS1 and SS2 adjacent to each other in the X direction, the relationship between the position of the sub-staircase 311 in the Z-direction and the position of the sub-staircase 312 in the Z-direction is different in each stadium-shaped staircase section SS.

The intermediate portion IP1-2 is provided between the sub-staircase 311-2 and the sub-staircase 312-2 in the X direction. The intermediate portion IP1-2 is provided below the sub-staircase 312-2 in the Z direction. The intermediate portion IP1-2 faces the step forming surface of the sub-staircase 311-2 in the X direction. The inclined surface of the intermediate portion IP1-2 extends from the lowermost stair of the sub-staircase 312-2 to the lowest stair of the sub-staircase 311-2. The intermediate portion IP1-2 has a dimension D1 in the Z direction.

The intermediate portion IP2-1 is arranged in a region (boundary region) between the first stadium-shaped staircase section SS1 and the second stadium-shaped staircase section SS2. The intermediate portion IP2-1 is provided between the uppermost stair (top) of the sub-staircase 312-1 and the uppermost stair of the sub-staircase 311-2. The inclined surface of the intermediate portion IP2-1 extends from the uppermost stair of the upper sub-staircase 312-1 to the uppermost stair of the lower sub-staircase 311-2. The intermediate portion IP2-1 has a dimension D2 in the Z direction (see FIG. 12). For example, the dimension D2 of the intermediate portion IP2-1 is larger than the dimension D1 of the intermediate portion IP1.

The third stadium-shaped staircase section SS3 is adjacent to the second stadium-shaped staircase section SS2 in the X direction via the intermediate portion IP3 when it is viewed in the Z direction. The position of the stadium-shaped staircase section SS3 in the Z direction is lower than the position of the stadium-shaped staircase section SS2 in the Z direction.

The stadium-shaped staircase section SS3 includes a sub-staircase 311-3, a sub-staircase 312-3, and an intermediate portion IP1-3. In the stadium-shaped staircase section SS3, the configuration of the sub-staircases 311-3 and 312-3 is similar to the configuration of the sub-staircases 311-1 and 312-1 of the stadium-shaped staircase section SS1.

In the arrangement of the sub-staircases 311-3 and 312-3 in the X direction, the sub-staircase 311-3 is provided on the side of the memory area MA1, and the sub-staircase 312-3 is provided on the side of the memory area MA2. The position H5 of the sub-staircase 311-3 in the Z direction is higher than the position H6 of the sub-staircase 312-3 in the Z direction. The positions H5 and H6 of the sub-staircases 311-3 and 312-3 in the Z direction are lower than the position H3 of the above-mentioned sub-staircase 311-2 in the Z-direction.

In the stadium-shaped staircase section SS3, the intermediate portion IP1-3 is provided between the sub-staircase 311-3 and the sub-staircase 312-3. The intermediate portion IP1-3 is provided below the sub-staircase 311-3 in the Z direction. The inclined surface of the intermediate portion IP1-3 faces the step forming surface of the sub-staircase 312-3 in the X direction. The intermediate portion IP1-3 has a dimension D1 in the Z direction.

The intermediate portion IP3 is arranged in a region (boundary region) between the second stadium-shaped staircase section SS2 and the third stadium-shaped staircase section SS3. The intermediate portion IP3 is provided between the uppermost stair of the sub-staircase 312-2 and the uppermost stair of the sub-staircase 311-3. The inclined surface of the intermediate portion IP3 extends from the top of the sub-staircase 312-2 to the top of the sub-staircase 311-3. The intermediate portion IP3 has a dimension D3 in the Z direction (see FIG. 12). For example, the dimension D3 of the intermediate portion IP3 is larger than the dimension D2 of the intermediate portion IP2.

The fourth stadium-shaped staircase section SS4 is adjacent to the third stadium-shaped staircase section SS3 in the X direction, with the intermediate portion IP2-2 located in between. The above-mentioned stadium-shaped staircase section SS3 is arranged between the stadium-shaped staircase section SS2 and the stadium-shaped staircase section SS4 in the X direction. The position of the stadium-shaped staircase section SS4 in the Z direction is higher than the position of the stadium-shaped staircase section SS3 in the Z direction.

The stadium-shaped staircase section SS4 includes a sub-staircase 311-4, a sub-staircase 312-4, and an intermediate portion IP1-4. In the stadium-shaped staircase section SS4, the configurations of the sub-staircases 311-4 and 312-4 are similar to the configurations of the sub-staircases 311-2 and 312-2 of the stadium-shaped staircase section SS2.

In the arrangement of the sub-staircases 311-4 and 312-4 in the X direction, the sub-staircase 311-4 is provided on the side of the memory area MA1, and the sub-staircase 312-4 is provided on the side of the memory area MA2. The position H7 of the sub-staircase 311-4 in the Z direction is lower than the position H8 of the sub-staircase 312-4 in the Z direction. The positions H7 and H8 of the sub-staircases 311-4 and 312-4 in the Z direction are lower than the position H3 of the above-mentioned sub-staircase 311-2 in the Z-direction. The positions H7 and H8 of the sub-staircases 311-4 and 312-4 in the Z direction are higher than the position H5 of the above-mentioned sub-staircase 311-3 in the Z-direction.

In the stadium-shaped staircase section SS4, the intermediate portion IP1-4 is provided between the sub-staircase 311-4 and the sub-staircase 312-4. The intermediate portion IP1-4 is provided below the sub-staircase 312-4 in the Z direction. The inclined surface of the intermediate portion IP1-4 faces the step forming surface of the sub-staircase 311-4 in the X direction. The intermediate portion IP1-4 has a dimension D1 in the Z direction.

As described above, each contact CC is provided on the terrace 700 of the conductive layer 22 of each of the sub-staircases 311 and 312. Each contact CC is coupled to the interconnect 26 of an upper layer.

As described above, in each stadium-shaped staircase section SS, the sub-staircase 311 and the sub-staircase 312 are obliquely adjacent to each other in the X direction and the Z direction.

In the description below, the set GP consisting of the four sub-staircases 311 and 312 of the two stadium-shaped staircase sections SS that are adjacent to each other in the X direction, with the intermediate portion IP2 located in between, will be referred to as a staircase group GP (GP1, GP2, . . . ). Where the four sub-staircases 311 and 312 forming the staircase group GP are described in units of the stadium-shaped staircase section SS, the two stadium-shaped staircase sections SS arranged in the X direction, with the intermediate portion IP2 located in between, will be referred to as a stadium group SX (SX1, SX2, . . . ).

(Layout of Sub-Staircases 311 and 312 of Staircase Group GP)

With reference to FIG. 10, a more specific description will be given as to how each of staircase groups GP1 and GP2 of the hookup portion HP is structured in the memory device 1 of the present embodiment (i.e., the arrangement pattern of a plurality of sub-staircases 311 and 312 in the X direction and these positions in the Z direction).

(a) of FIG. 10 is a schematic cross-sectional view illustrating the arrangement of a plurality of sub-staircases 311 and 312 of the staircase group GP1 (stadium group SX1). (b) of FIG. 10 is a schematic cross-sectional view illustrating the arrangement of a plurality of sub-staircases 311 and 312 of the staircase group GP2 (stadium group SX2).

In the examples shown in (a) and (b) of FIG. 10, the orientation in which the plurality of sub-staircases 311 and 312 of each staircase group GP1, GP2 are arranged is the direction from the first memory area MA1 to the second memory area MA2 (the direction from the right side to the left side of the drawing sheet), and this direction is assumed to be the reference direction for describing the present embodiment. In this arrangement direction, the sub-staircase (downward sub-staircase) 311 and the sub-staircase (upward sub-staircase) 312 are alternately arranged in each staircase group GP.

As described above, when a plurality of sub-staircases 311 are 312 are provided at different heights, the plurality of step-forming surfaces of the plurality of sub-staircases 311 and 312 do not line up at the same height (layer) in the X direction. That is, the plurality of terraces 700 do not exist on the same straight line (same height) in the X direction.

As shown in (a) of FIG. 10, of the four sub-staircases 311-1, 312-1, 311-2 and 312-2 belonging to the staircase group GP1, the position H1 of the top of the sub-staircase 311-1 in the Z direction is higher than any of the positions H2, H3 and H4 of the tops of the sub-staircase 312-1, 311-2 and 312-2 in the Z direction. The position H3 of the top of the sub-staircase 311-2 in the Z direction is lower than any of the positions H1, H2 and H4 of the tops of the sub-staircases 311-1, 312-1 and 312-2 in the Z direction.

The position H2 of the top of the sub-staircase 312-1 in the Z direction is lower than the position H1 of the top of the sub-staircase 311-1 in the Z-direction and is higher than the position H4 of the top of the sub-staircase 312-2 in the Z direction. The position H4 of the top of the sub-staircase 312-2 in the Z direction is lower than the position H2 of the top of the sub-staircase 312-1 in the Z direction and is higher than the position H3 of the top of the sub-staircase 311-2 in the Z direction.

As described above, in the present embodiment, in the staircase group GP1 composed of two adjacent stadium-shaped staircase sections SS1 and SS2, the four sub-staircases 311-1, 312-1, 311-2 and 312-2 are arranged in the X direction (for example, in a direction from the first memory area MA1 to the second memory area MA2) in the order of the sub-staircase 311-1, the sub-staircase 312-1, the sub-staircase 311-2, and the sub-staircase 312-2.

In addition, these four sub-staircases 311-1, 312-1, 311-2, 312-2 are arranged in the Z direction in the order of the sub-staircase 311-1, the sub-staircase 312-1, the sub-staircase 312-2 and the sub-staircase 311-2, i.e., in the height descending order of the sub-staircases 311 and 312 in the Z direction.

As shown in (b) of FIG. 10, of the four sub-staircases 311-3, 312-3, 311-4, 312-4 belonging to the staircase group GP2, the position H8 of the top of the sub-staircase 312-4 in the Z direction is higher than any of the positions H5, H6 and H7 of the tops of the sub-staircases 311-3, 312-3 and 311-4 in the Z direction. The position H6 of the top of the sub-staircase 312-3 in the Z direction is lower than any of the positions H5, H7 and H8 of the tops of the sub-staircases 311-3, 311-4 and 312-4 in the Z direction.

The position H7 of the top of the sub-staircase 311-4 in the Z direction is lower than the position H8 of the top of the sub-staircase 312-4 in the Z-direction and is higher than the position H5 of the top of the sub-staircase 311-3 in the Z-direction.

The position H5 of the top of the sub-staircase 311-3 in the Z direction is lower than the position H7 of the top of the sub-staircase 311-4 in the Z-direction and is higher than the position H6 of the top of the sub-staircase 312-3 in the Z direction.

As described above, in the present embodiment, in the staircase group GP2 composed of two adjacent stadium-shaped staircase sections SS3 and SS4 in the X direction, the four sub-staircases 311-3, 312-3, 311-4 and 312-4 are arranged in the X direction in the order of the sub-staircase 311-3, the sub-staircase 312-3, the sub-staircase 311-4, and the sub-staircase 312-4 from the first memory area MA1 to the second memory area MA2.

These four sub-staircases 311-3, 312-3, 311-4 and 312-4 are arranged in the Z direction in the order of the sub-staircase 312-4, the sub-staircase 311-4, the sub-staircase 311-3 and the sub-staircase 312-3, i.e., in the height descending order of the sub-staircases 311 and 312 in the Z direction.

Of the plurality of sub-staircases 311-1, 312-1, 311-2 and 312-2 of the staircase group GP1, the third sub-staircase 311-2 counted from the first memory area MA1 to the second memory area MA2 exists at the lowest position in the Z direction.

On the other hand, of the plurality of sub-staircases 311-3, 312-3, 311-4 and 312-4 of the staircase group GP2, the second sub-staircase 312-3 counted from the first memory area MA1 to the second memory area MA2 exists at the lowest position in the Z direction.

When the height order of the plurality of sub-staircases 311-3, 312-3, 311-4 and 312-4 is counted in the order from the second memory area MA2 to the first memory area MA1, the sub-staircase 312-3 having the height H6 is the third sub-staircase counted from the side of the second memory area MA2.

When the plurality of sub-staircases 311-3, 312-3, 311-4 and 312-4 are looked at in the direction from the side of the second memory area MA2 to the side of the first memory area MA1 with respect to the orientation in which the step forming surfaces of the plurality of sub-staircases 311-3, 312-3, 311-4 and 312-4 of the stairs group GP2 are arranged, the sub-staircases 311-3 and 311-4 can be regarded as upward sub-staircases, and the sub-staircases 312-3 and 312-4 can be regarded as downward sub-staircases.

As can be seen from the above, the structure of the sub-staircases 311-3, 312-3, 311-4 and 312-4 of the staircase group GP2 is symmetrical with the structure of the sub-staircases 311-1, 312-1, 311-2 and 312-2 of the staircase group GP1.

That is, in the present embodiment, the profile of the height positions of the plurality of sub-staircases 311-3, 312-3, 311-4 and 312-4 of the staircase group GP2 (stadium group SX2) has an mirror image relationship (symmetrical with respect to the X direction) with the profile of the height positions of the plurality of sub-staircases 311-1, 312-1, 311-2 and 312-2 of the staircase group GP1 (stadium group SX1), with the intermediate portion IP3 as a boundary (symmetrical axis).

In the staircase group GP1, the profile of the height positions of the sub-staircases 311-2 and 312-2 of the second stadium-shaped staircase section SS2 has a mirror image relationship with the profile of the height positions of the staircases 311-1 and 312-1 of the first stadium-shaped staircase section SS1, with the intermediate portion IP2-1 as a boundary. Likewise, in the staircase group GP2, the profile of the height positions of the sub-staircases 311-4 and 312-4 of the fourth stadium-shaped staircase section SS4 has a mirror image relationship with the profile of the height positions of the sub-staircases 311-3 and 312-3 of the stadium-shaped staircase section SS3, with the intermediate portion IP2-2 as a boundary.

In the present embodiment, the symmetrical axis of the two structures having a mirror image relationship is an axis that intersects the inclined surface of each intermediate portion IP and is along the Z direction (which axis may be hereinafter referred to as the Z axis).

In the hookup portion HP, the profile of the height positions of the plurality of sub-staircases 311 and 312 in the region R2 has a mirror image relationship with the profile of the height positions of the plurality of sub-staircases 311 and 312 in the region R1, with the Z axis intersecting the intermediate portion IP4 as a symmetrical axis. However, the plurality of sub-staircases 311 and 312 in the region R2 are provided in the region (layer) lower than the plurality of sub-staircases 311 and 312 in the region R1, in the Z direction.

(Structure of Sub-Staircases 311 and 312 Belonging to Different Staircase Groups GP)

With reference to FIG. 11, a description will be given for the structure of a plurality of sub-staircases 311 and 312 belonging to different staircase groups GP (arrangement pattern in the X direction and positions in the Z direction).

FIG. 11 is a schematic cross-sectional view for illustrating the structure of a plurality of sub-staircases 311 and 312, in which two stadium-shaped staircase sections SS2 and SS3 arranged in the X direction via the intermediate portion IP3 are extracted from the hookup portion HP of the memory device 1 of the present embodiment.

As shown in FIG. 11, in the two stadium-shaped staircase sections SS2 and SS3 arranged with the intermediate portion IP3 in between, the plurality of sub-staircases 311-2, 312-2, 311-3 and 312-3 are arranged from the side of the first memory area MA1 to the side of the second memory area MA2 in the order of the sub-staircase 311-2, the sub-staircase 312-2, the sub-staircase 311-3, and the sub-staircase 312-3.

As described above, the sub-staircase 311-2 has the height H3 in the Z direction, and the sub-staircase 312-2 has the height H4 in the Z direction. The sub-staircase 311-3 has the height H5 in the Z direction, and the sub-staircase 311-4 has the height H6 in the Z direction.

The position H3 of the sub-staircase 311-2 in the Z direction is lower than the position H4 of the sub-staircase 312-2 in the Z-direction and is higher than the position H5 of the sub-staircase 311-3 in the Z-direction.

The position H5 of the sub-staircase 311-3 in the Z direction is lower than the position H3 of the sub-staircase 311-2 in the Z-direction and is higher than the position H6 of the sub-staircase 312-3 in the Z-direction.

These four sub-staircases 311-2, 312-2, 311-3, 312-3 are arranged in the Z direction in the order of the sub-staircase 312-2, the sub-staircase 311-2, the sub-staircase 311-3 and the sub-staircase 312-3, i.e., in the height descending order of the tops of the sub-staircases 311 and 312 in the Z direction.

As can be seen from this, in the plurality of sub-staircases 311-2, 312-2, 311-3 and 312-3 of the stadium-shaped staircase sections SS2 and SS3, the height descending order of the sub-staircases 311-2, 312-2, 311-3 and 312-3 in the Z direction is different from the arrangement order of the sub-staircases 311-2, 312-2, 311-3 and 312-3 in the X direction.

In addition, the profile of the height positions of the sub-staircases 311-2 and 312-2 of the stadium-shaped staircase section SS2 has a mirror image relationship with the profile of the height positions of the sub-staircases 311-3 and 312-3 of the stadium-shaped staircase section SS3, with the intermediate portion IP3 as a boundary.

(Structure of Stadium-Shaped Staircase Sections SS)

As shown in FIGS. 8 to 11, the four stadium-shaped staircase sections SS1, SS2, SS3 and SS4 in the region R1 are arranged along the X direction in the order of the stadium-shaped staircase section SS1, the stadium-shaped staircase section SS2, the stadium-shaped staircase section SS3 and the stadium-shaped staircase section SS4 in a direction from the memory area MA1 to the memory area MA2.

When the positions (coordinates) of the stadium-shaped staircase sections SS1, SS2, SS3 and SS4 in the Z direction are compared in units of the stadium-shaped staircase section SS, the height descending order in the Z direction is the order of the stadium-shaped staircase section SS1, the stadium-shaped staircase section SS2, the stadium-shaped staircase section SS4, and the stadium-shaped staircase section SS3.

The position of the stadium-shaped staircase section SS in the Z direction is assumed to be the position of the top of the sub-staircase which is one of the two sub-staircases 311 and 312 included in each stadium-shaped staircase section SS and which is higher in position in the Z direction.

Specifics of this will be described.

The stadium-shaped staircase section SS1 is provided above the stadium-shaped staircase sections SS2, SS3 and SS4 in the Z direction The stadium-shaped staircase section SS2 is provided below the stadium-shaped staircase section SS1 and above the stadium-shaped staircase section SS4, in the Z direction.

The stadium-shaped staircase section SS4 is provided below the stadium-shaped staircase section SS2 and above the stadium-shaped staircase section SS3, in the Z direction.

The stadium-shaped staircase section SS3 is provided below the stadium-shaped staircase sections SS1, SS2 and SS4, in the Z direction.

When the positions of the stadium-shaped staircase sections SS5, SS6, SS7 and SS8 in the region R2 are compared in the Z direction like those of the stadium-shaped staircase sections SS1, SS2, SS3 and SS4 in the region R1, the height descending order of the stadium-shaped staircase sections SS5, SS6, SS7 and SS8 in the Z direction is the order of the stadium-shaped staircase section SS8, the stadium-shaped staircase section SS7, the stadium-shaped staircase section SS5, and the stadium-shaped staircase section SS6.

As described above, however, the positions of the stadium-shaped staircase sections SS5, SS6, SS7 and SS8 in the Z direction are lower than the position of the stadium-shaped staircase section SS3 in the Z direction. For example, the stadium-shaped staircase section SS5 is provided below the stadium-shaped staircase section SS3 of the region R1 and above the stadium-shaped staircase section SS6, in the Z direction. The stadium-shaped staircase sections SS7 and SS8 are provided below the stadium-shaped staircase section SS3 in the region R1 and above the stadium-shaped staircase section SS5, in the Z direction.

As described above, the profile of the height positions of the plurality of stadium-shaped staircase sections SS has a configuration similar to the profile of the height positions of the sub-staircases 311 and 312.

(Structure of Intermediate Portions IP)

With reference to FIG. 12, a description will be given for the structure of the plurality of intermediate portions IP in the hookup portion HP in the memory device 1 of the present embodiment.

FIG. 12 is a schematic cross-sectional view illustrating the structure of the plurality of intermediate portions (boundary portions, inclined portions, cliff portions) IP in the hookup portion HP in the memory device 1 of the present embodiment.

As described above, a plurality of intermediate portions IP1 (IP1-1, IP1-2, IP1-3 and IP1-4), IP2 (IP2-1 and IP2-2), IP3, and IP4 are provided in the hookup portion HP. Each intermediate portion IP includes a plurality of conductive layers 22 and a plurality of insulating layers 32. Unlike the sub-staircases 311 and 312, the intermediate portion IP does not have a terrace 700. Therefore, a contact CC is not provided on the intermediate portion IP. It is noted, however, that a contact CC may be in contact with the uppermost conductive layer 22 of the intermediate portion IP.

The intermediate portion IP1-1 is provided in the stadium-shaped staircase section SS1. The intermediate portion IP1-1 has an inclined surface F1-1 facing the second memory area MA2. The inclined surface F1-1 is inclined from the side of the first memory area MA1 to the side of the second memory area MA2.

The intermediate portion IP1-2 is provided in the stadium-shaped staircase section SS2. The intermediate portion IP1-2 has an inclined surface F1-2 facing the first memory area MA1. The inclined surface F1-2 is inclined from the side of the second memory area MA2 to the side of the first memory area MA1.

The intermediate portion IP1-3 is provided in the stadium-shaped staircase section SS3. The intermediate portion IP1-3 has an inclined surface F1-3 facing the second memory area MA2. The inclined surface F1-3 is inclined from the side of the first memory area MA1 to the side of the second memory area MA2.

The intermediate portion IP1-4 is provided in the stadium-shaped staircase section SS4. The intermediate portion IP1-4 has an inclined surface F1-4 facing the first memory area MA1. The inclined surface F1-4 is inclined from the side of the second memory area MA2 to the side of the first memory area MA1.

The intermediate portion IP2-1 is provided in the boundary region between the stadium-shaped staircase section SS1 and the stadium-shaped staircase section SS2. The intermediate portion IP2-1 is provided between the intermediate portion IP1-1 and the intermediate portion IP1-2, at a position in the X direction. The intermediate portion IP2-1 has an inclined surface F2-1 facing the second memory area MA2. The inclined surface F2-1 is inclined from the side of the first memory area MA1 to the side of the second memory area MA2.

The intermediate portion IP2-2 is provided in the boundary region between the stadium-shaped staircase section SS3 and the stadium-shaped staircase section SS4. The intermediate portion IP2-2 is provided between the intermediate portion IP1-3 and the intermediate portion IP1-4, at a position in the X direction. The intermediate portion IP2-2 has an inclined surface F2-2 facing the first memory area MA1. The inclined surface F2-2 is inclined from the side of the second memory area MA2 to the side of the first memory area MA1.

The intermediate portion IP3 is provided in the boundary region between the stadium-shaped staircase section SS2 and the stadium-shaped staircase section SS3. The intermediate portion IP3 is provided between the intermediate portion IP1-2 and the intermediate portion IP1-3, at a position in the X direction. The intermediate portion. IP3 has an inclined surface F3 facing the second memory area MA2. The inclined surface F3 is inclined from the side of the first memory area MA1 to the side of the second memory area MA2.

For example, the inclination angle of the inclined surface F1 of the intermediate portion IP1, the inclination angle of the inclined surface F2 of the intermediate portion IP2, and the inclination angle of the inclined surface F3 of the intermediate portion IP3 are substantially equal. It is noted, however, that the inclination angles of the intermediate portions IP1, IP2, and IP3 may be different depending on the processing conditions. The inclination angle of the intermediate portion IP is an angle formed by the X direction (upper surface of the substrate 20 or the terrace 700) and the inclined surface.

The inclined surfaces F1, F2, and F3 are not limited to flat surfaces, but may have irregularities. Due to the irregularities, steps may be caused on the inclined surfaces F1, F2 and F3. The size of the terrace which the steps may cause on the inclined surfaces F1, F2 and F3 is sufficiently smaller than the size of the terraces 700 of the sub-staircases 311 and 312.

Each intermediate portion IP has a dimension in the Z direction, as described below.

For example, the dimension of the intermediate portion IP in the Z direction (the height of the intermediate portion IP) is a distance from the terrace surface connected to the upper end (top) of an intermediate portion IP to the terrace surface connected to the lower end (bottom) of that intermediate portion IP in the Z-direction. The upper end of the intermediate portion IP is an end of the intermediate portion IP on the side of the interconnect 26, and the lower end of the intermediate portion IP is an end of the intermediate portion IP on the side of the substrate 20.

Each intermediate portion IP1 has the dimension D1 in the Z direction. The dimension D1 is substantially equal to, for example, the dimension DO of the sub-staircase 311 (or the sub-staircase 312) in the Z direction. It is noted, however, that the dimension. D1 may be different from the dimension DO, and, for example, can be larger than the dimension DO by one stair. Each intermediate portion IP2 has the dimension D2 in the Z direction. The dimension D2 is larger than the dimension D1. For example, the dimension D2 is about 1.5 to 2 times the dimension D1. The intermediate portion IP3 has the dimension D3 in the Z direction. The dimension D3 is larger than the dimension D2, and is, for example, about 1.5 to 2 times the dimension D2.

For example, with respect to the position coordinates of the intermediate portion IP in the Z direction, the position Ha of the upper end of the intermediate portion IP1-1 in the Z direction is located above the position Hb1 of the upper end of the intermediate portion IP2-1 in the Z direction. The position Hb1 of the upper end of the intermediate portion IP2-1 in the Z direction is the same as the position H2 of the terrace 700 on the uppermost stair (top) of the sub-staircase 312-1 in the Z direction. The position Hc of the upper end of the intermediate portion IP1-2 in the Z direction is below the position Hb1 of the upper end of the intermediate portion IP2-1 as the Z direction and is above the position Hb2 of the lower end of the intermediate portion IP2-1 in the Z direction. The position Hb2 of the lower end of the intermediate portion IP2-1 in the Z direction is the same as the position H3 of the uppermost terrace 700 of the sub-staircase 311-2 in the Z direction.

The position Hd of the upper end of the intermediate portion IP1-3 in the Z direction is above the position Hb3 of the lower end of the intermediate portion IP2-2 in the Z direction and is below the position Hb4 of the upper end of the intermediate portion IP2-2 in the Z direction. The position Hb3 of the lower end of the intermediate portion IP2-2 in the Z direction is the same as the position H6 of the uppermost terrace 700 of the sub-staircase 312-3 in the Z direction.

The position He of the upper end of the intermediate portion IP1-4 in the Z direction is above the position Hb4 of the upper end of the intermediate portion IP2-2 in the Z direction. The position Hb4 of the upper end of the intermediate portion IP2-2 in the Z direction is the same as the position H7 of the uppermost terrace 700 of the sub-staircase 311-4 in the Z direction.

The position Hf of the upper end of the intermediate portion IP3 in the Z direction is below the position Ha of the upper end of the intermediate portion IP1-1 in the Z direction and is above the position Hc of the upper end of the intermediate portion IP1-2 in the Z direction. The position Hg of the lower end of the intermediate portion IP3 in the Z direction is below the position He of the upper end of the intermediate portion IP1-4 in the Z direction and is above the position Hd of the upper end of the intermediate portion IP1-3 in the Z direction.

The upper end of each intermediate portion IP1 is continuously connected to the lowermost terrace 700 of the corresponding one of the sub-staircases 311 and 312. The position of the upper end of each intermediate portion IP1 is substantially the same as the position of the lowermost terrace 700 in the Z direction, to which the upper end of the intermediate portion IP1 is connected. The upper end of each intermediate portion IP2 is continuously connected to the uppermost terrace 700 of the corresponding one of the sub-staircases 311 and 312. The position of the upper end of each intermediate portion IP2 is substantially the same as the position of the uppermost terrace 700 in the Z direction, to which the upper end of the intermediate portion IP2 is connected. The upper end of the intermediate portion IP3 is continuously connected to the uppermost terrace 700 of the sub-staircase 312. The position of the upper end of the intermediate portion IP3 is substantially the same as the position of the uppermost terrace 700 in the Z direction, to which the upper end of the intermediate portion IP3 is connected.

As a result, the position of the upper end of the intermediate portion IP in the Z direction is substantially the same as the position of the bottom of the contact CC on the terrace 700 connected to the upper end in the Z direction.

In the two staircase groups GP1 and GP2 arranged in the X direction, similarly to the profile of the height positions of the sub-staircases 311 and 312 (and the stadium-shaped staircase section SS) belonging to the two staircase groups GP1 and GP2, the profile of the height positions of the plurality of intermediate portions IP1-1, IP1-2 and IP2-1 belonging to the staircase group GP1 has a mirror image relationship with the profile of the height positions of the plurality of intermediate portions IP1-3, IP1-4 and IP2-2 belonging to the staircase group GP2, with the intermediate portion IP3 as a boundary.

The plurality of the sub-staircases 311 and 312, the plurality of stadium-shaped staircase sections SS, and the plurality of intermediate portions IP, which are in the region R2 of the hookup portion HP shown in FIG. 8, have a structure in which the configurations shown in FIGS. 9 to 12 are reversed horizontally, and are arranged from the second memory area MA2 toward the first memory area MA1. The profile of the height positions of the plurality of intermediate portions IP in the region R2 has a mirror image relationship with the profile of the height positions of the plurality of intermediate portions IP shown in FIG. 12, with the intermediate portion IP4 as a boundary portion.

The intermediate portion IP4 is adjacent to the stadium-shaped staircase section SS4 in the X direction.

The intermediate portion IP4 has an inclined surface F4 facing the second memory area MA2. The inclined surface F4 is inclined from the side of the first memory area MA1 to the side of the second memory area MA2. The position of the upper end of the intermediate portion IP4 in the Z direction is higher than the position He of the upper end of the intermediate portion IP1-4 and is lower than the position Hc of the upper end of the intermediate portion IP1-2. For example, the position of the upper end of the intermediate portion IP4 in the Z direction is the same as the position H8 of the uppermost terrace 700 of the sub-staircase 312-4. The intermediate portion IP4 has a dimension D4 in the Z direction. The dimension D4 is larger than the dimension D3, and is, for example, about 1.5 to 2 times larger than the dimension D3.

The sub-staircases 311 and 312 and the stadium-shaped staircase sections SS in the hookup portion HP of the memory device 1 of the present embodiment are formed by the manufacturing process described later so as to have the above-mentioned periodic structure.

Thus, in the memory device 1 of the present embodiment, the structures (sub-staircases, stadium-shaped staircase sections, staircase groups, etc.) that are adjacent to each other, with the intermediate portions IP1, IP2, IP3, and IP4 generated by the batch etching of a plurality of layers in the manufacturing process as boundaries, have a mirror image relationship with each other.

In FIGS. 7 to 12, the positions (coordinates) of the sub-staircases 311 and 312 in the Z direction are shown as the positions of the tops (uppermost portions) of the sub-staircases 311 and 312 in the Z direction. It is noted, however, that the positions of the sub-staircases 311 and 312 in the Z direction may be indicated by a portion other than the tops of the sub-staircases 311 and 312. For example, the positions of the sub-staircases 311 and 312 in the Z direction may be indicated by the positions of the bottoms (lowermost portions) of the sub-staircase 311 and 312 or by the central positions between the tops and the bottoms of the sub-staircases 311 and 312. In FIGS. 7 to 12, the positions of the sub-staircases 311 and 312 in the X direction are the positions of those ends of the sub-staircases 311 and 312 which are on the side of the first memory area M1. It is noted, however, that the positions of the sub-staircases 311 and 312 in the X direction may be indicated by portions other than those ends of the sub-staircases 311 and 312 which are on the side of the first memory area M1. For example, the positions of the sub-staircases 311 and 312 in the X direction may be indicated by the positions of those ends of the sub-staircases 311 and 312 which are on the side of the second memory area MA2, or by the central positions between the two ends of the sub-staircases in the X direction.

Even if the reference positions of the sub-staircases 311 and 312 are changed, the plurality of sub-staircases 311 and 312 maintain the same positional relationships as described with reference to FIGS. 7 to 12 in both the X direction and the Z direction.

Furthermore, a structure other than the semiconductor substrate 20 may be used for the reference of "upper" and "top" with respect to the Z direction. For example, in the case of a chip-bonded structure in which the semiconductor substrate 20 is removed, the direction in which the terrace 700 faces so as to be provided with the contact CC thereon may be associated with "upper" and "top".

[b] Manufacturing Method

A manufacturing method of the memory device of the first embodiment will be described with reference to FIGS. 13 to 24. Each of FIGS. 13, 15, 16, 18, 19, 21, 22 and 24 is a cross-sectional diagram illustrating one step in the method of manufacturing the memory device 1 of the embodiment. Each of FIGS. 14, 17, 20 and 23 is a cross-sectional diagram illustrating one step in the method of manufacturing the memory device of the embodiment, part of the hookup portion HP being extracted.

As shown in FIG. 13, a circuit (not shown) including a row decoder module 15 etc. is formed on the semiconductor substrate 20, and then an insulating layer 38 is formed on the semiconductor substrate 20, for example, by CVD (Chemical Vapor deposition). The circuit on the semiconductor substrate 20 is covered with the insulating layer 38. A conductive layer 21 is formed on the insulating layer 38, for example by CVD. The conductive layer 21 is a layer used for the source line SL in the memory cell array 10.

An insulating layer 32a is formed on the conductive layer 21, for example, by CVD. A plurality of insulating layers 32 and a plurality of insulating layers 39 are alternately formed one by one on the insulating layer 32a, for example, by CVD.

Thus, in a memory area MA and a hookup area HA, a layer stack 300X is formed above the semiconductor substrate 20 in the Z direction. The lowermost layer of the layer stack 300X in the Z direction is the insulating layer 32a, and this lowermost insulating layer 32a is formed on the upper surface of the conductive layer 21. The insulating layer 39 is formed on the upper surface of the insulating layer 32a.

The plurality of insulating layers 39 are layers that are replaced with conductive layers 22 (for example, the select gate lines SGS and SOD, and word lines WL) in the step described later. In the description below, the insulating layer 39 will be referred to as a sacrificial layer 39. The number of sacrificial layers 39 in the layer stack 300X can be changed depending on the number of conductive layers 22 formed in the memory cell array 10.

A mask layer 90 is formed above the layer stack 300X in the Z direction by performing a lithography process. A plurality of openings OP0 are provided in the mask layer 90.

The openings OP0 are provided such that they correspond to the positions where stadium-shaped staircase sections are to be formed in the hookup area HA. The number of openings OP0 arranged in the X direction in the hookup area HA can be changed in accordance with the number of conductive layers 22 provided in the memory cell array 10. In the example shown in FIG. 13, the mask layer 90 comprises eight openings OP0 above the hookup area HA of one block BLK.

By repeating the etching treatment for the layer stack 300X and the slimming treatment for the mask layer 90, a mountain-shaped structure (hereinafter referred to as a mountain portion) 301 viewed in the Y direction is formed in the layer stack 300X. The mountain portion 301 is a structure including a plurality of terraces 700. The mountain portion (also referred to as a double-sided staircase) 301 includes a plurality of terraces 700 on the side of the first memory area MA1 and on the side of the second memory area MA2.

The portion between the two mountain portions 301 adjacent to each other in the X direction (the region between the skirts of mountain) is called a valley portion 302.

More specifically, a plurality of mountain portions 301 and a plurality of valley portions 302 are formed by executing the etching treatment and the slimming treatment a number of times, as described below.

By the first anisotropic etching based on the pattern of the mask layer 90, the layer stack 300X is etched through the openings OP0 in an etching amount by which one stair 80X is removed. As a result, one sacrificial layer 39 and one insulating layer 32 are removed from the regions corresponding to the openings OP0. Thereafter, the mask layer 90 is selectively shrunk (slimmed) by isotropic etching for the slimming process. As a result, the openings OP0 are isotropically widened.

By the second anisotropic etching using the mask layer 90, which is performed after the first slimming treatment, the layer stack 300X is etched through the openings OP0 in an etching amount by which one stair 80X is etched. At this time, the upper terrace 700 functions as a mask for the lower layers 32 and 39 of the layer stack 300X. As a result, a step 799 is formed between the two stacked sacrificial layers 39 (two stairs 80X), and a staircase structure is formed in the layer stack 300X. A second slimming process (isotropic etching) is performed for the mask layer 90. This further widens the openings OP0 isotropically.

Thereafter, a plurality of etching treatments (for example, k etching treatments) and a plurality of slimming treatments (for example, k–1 slimming treatments) are executed until a plurality of mountain portions 301 including a predetermined number (k) of terraces 700 are formed.

FIG. 14 is a diagram showing an example of the configuration of the region XIV shown in FIG. 13.

For example, as shown in FIG. 14, a plurality of mountain portions 301 are formed in the layer stack 300X. Each mountain portion 301 includes two terraces 700 on each side of the mountain portion 301. In each stair 80X of the mountain portion 301, the upper surface of the sacrificial layer 39 is exposed, and the upper surface of the insulating layer 32 is covered with the sacrificial layer 39 of the upper layer.

The dimensions (widths) W1 of the terraces 700 formed in a first position of the stairs 80X in the Z direction are substantially equal in both the X direction and the Y direction. The dimensions W2 of the terraces 700 formed in a second position of the stairs 80X in the Z direction are substantially equal in both the X direction and the Y direction. Preferably, the widths of the terraces 700 in the stairs 80X are substantially the same, but they may be different.

Since the terraces 700 are formed, the processed shape of the end portions of the memory areas MA1 and MA2 on the side of the hookup portion HP side is like a staircase. As a result, in the hookup portion HP, sub-staircases 311x and 312x including a plurality of stacked sacrificial layers 39 are formed at the terminal portions of the memory areas MA1 and MA2.

After the formation of the mountain portions 301, the mask layer 90 is removed. As a result, in the hookup area HA, the layer stack 300X is provided with the stairs 80X each including one insulating layer 39 and one insulating layer 32.

As shown in FIG. 15, a mask layer 91 is formed above the layer stack 300X in the Z direction by the lithography process. A plurality of openings OP1 are provided in the mask layer 91. The plurality of openings OP1 are formed in the mask layer 91 such that the mountain portions 301 (301a, 301b) arranged in the X direction in each hookup portion HP are alternately exposed. Therefore, in the hookup portion HP, the mountain portion 301a exposed in the opening OP1 and the mountain portion 301b covered by the mask layer 91 are alternately arranged in the X direction.

The mask layer 91 is patterned by a lithography process such that the positions of the edges Eg1 of the openings OP1 (also called opening edges or mask edges) in the X direction are located in the regions (valley portions) 302 between the skirts of the two mountain portions 301a and 301b arranged in the X direction.

In this step, with respect to the misalignment of the mask layer 91, the positions of the edges Eg1 of the openings OP1 of the mask layer 91 in the X direction may be designed such that a margin is ensured regarding the size of the terrace width of the terrace 700 which is to be formed at the lowermost stair of each of the mountain portions 301a and 301b by an etching process based on the mask layer 91.

The number of openings OP1 arranged in the X direction in each hookup portion HP can be changed in accordance with the number of conductive layers 22 provided in the memory cell array 10. In the example shown in FIG. 15, the mask layer 91 includes four openings OP1 arranged in the X direction and located above the hookup portion HP. When the number of openings OP1 is four, the number of mask edges Eg1 of the mask layer 91 appearing in cross sections along the X direction is eight.

As shown in FIG. 16, the layer stack 300X is etched by anisotropic etching based on the pattern of the mask layer 91. In this etching, the pattern of the terrace 700 and the step 799 of the mountain portion 301a is transferred to the sacrificial layer 39 and the insulating layer 32 of the lower layer. As a result, a mountain portion 301c is formed in the region (position) below the mountain portion 301b (301a) in the Z direction. The mountain portion 301c has substantially the same structure as the mountain portion 301a.

FIG. 17 is a diagram showing an example of the configuration of the region XVII shown in FIG. 16.

As shown in FIG. 17, for example, in the hookup portion HP, the layer stack 300X is etched through the openings OP1 in an etching amount by which a plurality of layers 32 and 39 corresponding to the height of the mountain portion 301 are etched. The uppermost stair of the formed mountain portion 301c is located lower than the lowermost stair of the mountain portion 301a by one stair.

By etching the mountain portions 301a and the valley portions 302, a plurality of intermediate portions (cliff portions) IP1 are formed below the mountain portions 301b such that they are continuous with the foot (lowermost terrace 700) of the mountain portion 301b. The intermediate portions IP1 are adjacent to the mountain portions 301c in the X direction. For example, each intermediate portion IP1 includes a taper in the Z direction and has a certain degree of inclination angle. The inclined surface of each intermediate portion IP1 faces the mountain portion 301c. The dimension of the intermediate portion IP1 in the Z direction is larger than the dimension of the mountain portion 301c in the Z direction.

In the description below, the process in which a plurality of stairs 80X in the layer stack 300X are processed by one-time anisotropic etching, such as etching performed for the mountain portions 301 in the present step, will be referred to as a multi-stage etching process (or a multi-stage etching step).

After the mountain portions 301c and the intermediate portions IP1 are formed by the multi-stage etching process, the mask layer 91 is removed.

As shown in FIG. 18, a mask layer 92 is formed above the layer stack 300X in the Z direction by the lithography process. A plurality of openings OP2 are provided in the mask layer 92. The mask edges Eg2 of each opening OP2 are arranged on the tops TPa of the mountain portions 301c (the upper ends of the mountain portions 301c in the Z direction). When the number of openings OP2 is two, the number of mask edges Eg2 of the mask layer 92 appearing in cross sections along the X direction is four.

The plurality of openings OP2 expose a region between the tops TPa of the two mountain portions 301c arranged in the X direction, with the mountain portion 301b (or the mountain portion 301d) interposed in between. Thus, the step forming surface on one side of the mountain portion 301c in the X direction is exposed in the opening OP2. In addition, the mountain portion 301d arranged between the two exposed step forming surfaces arranged in the X direction is exposed in the opening OP2.

On the other hand, the mountain portion 301b between the step forming surfaces covered with the mask layer 92 is covered with the mask layer 92.

As described above, in the present step, the positions of the edges Eg2 of the openings OP2 of the mask layer 92 in the X direction are different from the positions of the edges Eg1 of the openings of the mask layer 91 in the steps shown in FIGS. 15 to 17.

In the present step, with respect to the misalignment between the mask layer 92 and the tops TPa of the mountain portions 301c, the positions of the edges Eg2 of the openings OP2 may be designed in consideration of a margin of the terrace width (the dimension of the terrace in the X direction) of the tops of the mountain portions 301c.

As shown in FIG. 19, the layer stack 300X is etched by anisotropic etching based on the pattern of the mask layer 92.

FIG. 20 is a diagram showing an example of the configuration of the region XX shown in FIG. 19.

In the present step, the layer stack 300X is etched in an amount corresponding to the height of the plurality of layers 32 and 39 (a plurality of stairs 80X) included in the mountain portion 301d and the intermediate portion IP1.

In this etching, the pattern of the terraces 700 and the steps 799 of the exposed mountain portion 301d is transferred to the sacrificial layers 39 and the insulating layers 32 of the lower layer.

As a result, a mountain portion 301e and an intermediate portion IP1 are formed in the region below the position where the mountain portion 301d is provided. The mountain portion 301e has substantially the same structure as the mountain portion 301d.

By the etching performed for the mountain portion 301c, the step forming surfaces (a plurality of terraces and steps) and the valley portions on the exposed side of the mountain portion 301c are etched with the mask edge Eg2 as a boundary, and a plurality of intermediate portions IP2 are formed. The pattern of the step forming surface on the etched side of the mountain portion 301c is transferred to the plurality of insulating layers 32 and the plurality of sacrificial layers 39 that are below the intermediate portion IP2. As a result, a sub-staircase 311x or a sub-staircase 312x is formed below the intermediate portions IP2. Further, those portions of the mountain portion 301c which are covered with the mask layer 92 are not etched and remain as sub-staircases 311x and 312x. In this manner, a plurality of sub-staircases 311x and 312x are formed from one mountain portion 301c. The intermediate portions TP1 face the formed plurality of sub-staircases 311x and 312x, respectively, in the X direction.

For example, the position of the upper end of the mountain portion 301e is located below the bottom surface of the intermediate portion IP1 covered with the mask layer 92 in the Z direction.

After the multi-stage etching process in the present step ends, the mask layer 92 is removed.

As shown in FIG. 21, a mask layer 93 is formed above the layer stack 300X in the Z direction by the lithography process. An opening OP3 is provided in the mask layer 93. The positions of the mask edges Eg3 of the opening OP3 of the mask layer 93 in the X direction are located on the tops TPb of the respective mountain portions 301e (the upper ends of the mountain portions 301e in the Z direction). The number of mask edges Eg3 of the mask layer 93 appearing in cross sections along the X direction is two.

The opening OP3 partially exposes the mountain portions 301e in the hookup portion HP, with the tops TPb of the mountain portions 301e as a boundary. The opening OP3 exposes the region between the tops TPb of the two mountain portions 301e arranged in the X direction. As a result, in addition to part of the mountain portions 301e, the mountain portion 301b above the intermediate portions IP2 and the sub-staircases 311x and 312x respectively having the tops TPa are exposed through the openings OP3.

As described above, in the present step, the positions of the edges Eg3 of the opening OP3 of the mask layer 93 in the X direction are different from the positions of the edges Eg2 of the openings OP2 of the mask layer 92 in the steps shown in FIGS. 18 to 20. In the present step, with respect to the misalignment between the mask layer 93 and the tops TPb of the mountain portions 301e, the positions of the edges Eg3 of the opening OP3 may be designed in consideration of a margin of the terrace width (the dimension of the terrace in the X direction) of the tops TPb of the mountain portions 301e.

As shown in FIG. 22, the layer stack 300X is etched by anisotropic etching based on the pattern of the mask layer 93.

FIG. 23 is a diagram showing an example of the configuration of the region XXIII shown in FIG. 22.

As shown in FIG. 23, in the present step, the layer stack 300X is etched in an amount corresponding to the height of the plurality of layers 32 and 39 (the plurality of stairs 80X) included in the mountain portion 301*b* (301*f*) and the intermediate portions IP1 and IP2. In the etching executed through the opening OP3, the pattern of the mountain portion 301*b* and the sub-staircases 311*x* and 312*x* shown in FIG. 21 is transferred to the sacrificial layers 39 and the insulating layers 32 of the lower layer.

As a result, a mountain portion 301*f*, sub-staircases 311*x* and 312*x*, and intermediate portions TP1 and IP2 are formed in the region below the member covered with the mask layer 93. The mountain portion 301*f* has substantially the same structure as the mountain portion 301*b*. For example, the position of the upper end of the mountain portion 301*f* is one stair lower than the terrace 700 of the lowermost layer covered with the mask layer 93 in the Z direction.

By this etching, intermediate portions IP3 are formed on the back surfaces of the sub-staircases 311*x* and 312*x* for which the mask edges Eg3 are arranged. Each intermediate portion IP3 extends from the top TPb to the upper ends of the sub-staircases 311*x* and 312*x* below that top TPb.

After the multi-stage etching process in the present step ends, the mask layer 93 is removed.

As shown in FIG. 24, a mask layer 94 is formed above the layer stack 300X in the Z direction by the lithography process. An opening OP4 is provided in the mask layer 94. The position of the opening edge Eg4 of the opening OP4 of the mask layer 94 in the X direction is located on the top TPc of the mountain portion 301*f*. The opening OP4 exposes the region R2 on the side of the second memory area MA2 from the top TPc of the mountain portion 301*f* in hookup portion HP. The region R1 of the hookup portion HP which is closer to the first memory area MA1 than the top TPc of the mountain portion 301*f* is covered with a mask layer 94. The number of mask edges Eg4 of the mask layer 94 appearing in cross sections along the X direction is two.

As described above, in the present step, the positions of the edges Eg4 of the opening OP4 of the mask layer 94 in the X direction are different from the positions of the edges Eg2 of the openings OP2 of the mask layer 92 in the steps shown in FIGS. 18-20 and from the positions of the edges Eg3 of the openings OP3 of the mask layer 93 in the steps shown in FIGS. 21 to 23. In the present step, with respect to the misalignment between the mask layer 94 and the top TPc of the mountain portion 301*f*, the positions of the edges Eg4 of the opening OP4 may be designed in consideration of a margin of the terrace width (the dimension of the terrace 700 in the X direction) of the top TPc of the mountain portion 301*f*.

That is, in the present embodiment, the portion where the mask edge Eg (Eg1, Eg2, Eg3, Eg4) is continually arranged in the plurality of multi-stage etching steps does not exist in the hookup portion HP. As a result, the beam-like structure extending in the Z direction is not formed in the hookup portion HP.

Thereafter, the layer stack 300X is etched by anisotropic etching based on the pattern of the mask layer 94. In the present step, the layer stack 300X is etched in an amount corresponding to the height of the plurality of stairs 80 included from the uppermost end of the layer stack 300X to the bottom surface of the intermediate portion IP1 of the lowermost layer.

Thus, as shown in FIG. 8 mentioned above, within the region R2, the pattern of each exposed component is transferred to the plurality of sacrificial layers 39 and the plurality of insulating layers 32 that are located below. Further, in the present step, the upper surface of the sacrificial layer 39, which is the lowermost layer of the layer stack 300X, is exposed. An intermediate portion IP4 is formed below the mask edge Eg4 in the boundary region between the region R1 and the region R2.

After the multi-stage etching process ends, the mask layer 94 is removed.

By the manufacturing process including the plurality of multi-stage etching processes described above, a pattern of a plurality of sub-staircases 311 and 312 and a pattern of a plurality of stadium-shaped staircase sections SS are formed, which have a mirror image relationship with each other, with the intermediate portion IP in between. According to the above-mentioned manufacturing process, no beam-shaped structure is formed in the hookup portion HP.

After the staircase structure. (structure including a plurality of sub-staircases 311 and 312) is formed in the hookup portion. HP, the memory pillars MP are formed in the memory cell array 10 (see FIGS. 5 and 6). The outline of the process of forming the memory pillars MP is as below.

First, a mask layer having a plurality of openings is formed on the layer stack 300X. In the present step, the openings of the mask layer are formed in the regions corresponding to the positions where the plurality of memory pillars MP are formed. By the anisotropic etching process using this mask layer, a plurality of memory holes are formed in the memory areas MA1 and MA2 of the layer stack 300X. The above-mentioned block insulating film 45, charge trap film 44, and tunnel insulating film 43 are sequentially formed on the side surfaces and bottom surfaces of the plurality of memory holes. Parts of the block insulating film 45, the charge trap film 44, and the tunnel insulating film 43 provided at the bottoms of the memory holes are removed. Thereafter, a semiconductor layer 41 and a core member 40 are formed in the memory hole. Part of the core member 40 provided in the upper regions of the memory holes is removed. A semiconductor layer 41 is formed in the voids created by the removal.

Thereafter, an insulating layer 34 is formed on the memory cell array 10. By this time, the insulating layer 34 is embedded in the hookup area HA, and the bridge portion BRG and the hookup portion HP are covered with the insulating layer 34.

After the insulating layer 34 is formed, a slit SLT is formed in a predetermined region in the layer stack 300X. Thereafter, the replacement process of the sacrificial layers 39 is executed. As a result, an interconnect stack 300 is formed. Specifically, the plurality of sacrificial layers 39 are selectively removed via the slit SLT by wet etching using thermal phosphoric acid or the like. As a result, air gaps are created in the regions where the sacrificial layers 39 of the layer stack 300X are removed. The structure from which the plurality of sacrificial layers 39 are removed is maintained by a plurality of memory pillars MP, support columns (not shown), etc. A conductor is embedded in the air gaps in the layer stack 300X via the slit SLT. For example, the CVD method is used to form a conductor in this step.

The conductor formed inside the slit SLT is removed by the etch back treatment. As a result, the conductors formed in the adjacent interconnect layers are separated. As a result, a conductive layer 22*a* functioning as the select gate line SGS, a plurality of conductive layers 22*b* functioning as the word lines WL0 to WLn-1, and a conductive layer 22*c* functioning as the select gate line SGD are formed.

The conductive layer 22 extends to the memory areas MA1 and MA2, the bridge portion BRG in the hookup area HA, and the hookup portion HP. The conductive layer 22 is exposed from the upper conductive layers at the sub-staircases 311 and 312 of the hookup portion HP. As a result, the exposed portions of the conductive layer 22 are formed as the terrace 700 in the sub-staircases 311 and 312.

The conductive layer 22 formed in this step may include a barrier metal. In this case, in the conductor formation process executed after the removal of the sacrificial member 39, titanium nitride is deposited as a barrier metal, and then tungsten is formed on the titanium nitride.

After the formation of the conductive layer 22, the embedding process for the slit SLT is performed. Specifically, an insulating layer (spacer SP) is formed in such a manner as to cover the side surface and the bottom surface of the slit SLT. Then, part of the spacer SP provided at the bottom of the slit SLT is removed. Thereafter, a contact LI is formed in the slit SLT.

A slit SHE is formed in such a manner as to divide the conductive layer 22c in the Y direction.

A plurality of contacts CC are formed on the sub-staircases 311 and 312 of the hookup portion HP by the contact forming step. Each of the plurality of contacts CC is coupled to the corresponding one of the plurality of terraces 700 of the plurality of sub-staircases (downward sub-staircases) 311 and the plurality of sub-staircases (upward sub-staircases) 312 in the hookup portion HP.

By an interconnect forming step, a plurality of interconnects 26 are formed above the insulating layer 34 covering the memory area MA and the hookup area HA. Each of the plurality of interconnects 26 is coupled to the corresponding one of the plurality of contacts CC in the hookup portion HP.

As described above, the manufacturing process of the memory device 1 of the present embodiment forms a staircase structure for coupling contacts to the interconnect stack 300 in the memory cell array 10.

The manufacturing method (manufacturing process) of the hookup portion HP of the memory device 1 of the present embodiment is not limited the example shown in FIGS. 13 to 24 (for example, the number of layers provided in the mountain portion 301, the number of layers of the sub-staircases 311 and 312, the number of openings in each mask layer, and/or the number of times a multi-stage etching process is performed), and may be appropriately changed depending on the number of layers of the conductive layers 22 in the memory cell array 10.

[c] Conclusion

In the process of manufacturing a staircase structure in a hookup area of a certain memory device, a surplus member extending in the Z direction (hereinafter referred to as a beam-like structure) may be caused in the hookup area, due to the margin secured for misalignment between the hookup area and the mask layer.

The beam-shaped structure increases the dimensions of the hookup area and may cause defects at the time of collapse.

Further, if a mask edge (an edge of the opening OP) of the mask layer is arranged on the beam-like structure or on the intermediate portion IP generated by the multi-stage etching process, there is a possibility that a slit extending to a plurality of stairs of the sub-staircases will be formed in the layer stack due to the mask edge shift. If a conductor remains in this slit during the replacement from a sacrificial layer to a conductor, a short circuit occurs between the interconnects.

If a large margin for the mask edge of the mask layer is secured in order to avoid such defects, the area of the hookup area tends to increase.

The memory device 1 of the present embodiment has the configurations shown in FIGS. 10 to 12 with respect to the X direction and the Z direction of the plurality of sub-staircases 311 and 312 in the hookup portion HP.

According to the present embodiment, as described with reference to FIGS. 13 to 24 described above, when the hookup portion HP having the configuration shown in FIGS. 10 to 12 is formed, the positions of the edges of the openings OP1, OP2, OP3 and OP4 which are formed in each of the mask layers 91, 92, 93 and 94 to etch the layer stack 300X in the hookup portion HP are not repeatedly arranged at specific positions in the hookup portion HP. In the memory device 1 of the present embodiment formed by this manufacturing process, the hookup portion HP does not include a beam-shaped structure.

Thus, in the present embodiment, the margin for the alignment between the hookup area. HA and the mask layers 91, 92, 93 and 94 need not be designed under severe conditions. As a result, the space for securing the margin is reduced.

Therefore, the memory device 1 of the present embodiment can reduce the area of the hookup area HA. As a result, the memory device 1 of the present embodiment can reduce the chip size.

Further, according to the present embodiment, the above-mentioned beam-like structure generated for securing a margin for alignment is not formed in the hookup area HA.

Therefore, the memory device 1 of the present embodiment can suppress defects which may be caused in the hookup portion by the beam-shaped structure.

As described above, the memory device of the present embodiment and the manufacturing method thereof contribute to reduction of the cost of memory devices.

(2) Second Embodiment

The memory device of the second embodiment and the manufacturing method thereof will be described with reference to FIGS. 25 to 31.

[a] Configuration

The configuration of the memory device 1 of the present embodiment will be described with reference to FIGS. 25 and 26.

FIG. 25 is a cross-sectional view schematically showing a structural example of a hookup portion of the memory cell array 10 of the memory device 1 of the present embodiment. As shown in FIG. 25, in the present embodiment, each of the staircase groups GP (two stadium-shaped staircase sections SS) including four sub-staircases 311z and 312z has the structure (arrangement pattern) shown in (a) or (b) of FIG. 10, as in the first embodiment. These staircase groups GP are arranged in the hookup portion HP such that two structures which are adjacent with the intermediate portions IP2 and IP3 as boundaries have a mirror image relationship.

In the present embodiment, the plurality of sub-staircases 311z and 312z and the plurality of intermediate portions IP can have the structures described in FIGS. 11 and 12.

In the present embodiment, the structure of the plurality of sub-staircases 311z and 312z in the region R2 has a mirror image relationship with the structure of the plurality of sub-staircases 311z and 312z in the region R1, without an intermediate portion serving as a boundary between the two regions R1 and R2. In this point, the present embodiment differs from the first embodiment.

In addition, the internal configurations of the sub-staircases 311z and 312z of the present embodiment differ from those of the sub-staircases 311 and 312 described in connection with the first embodiment.

As a result of this, the correspondence between the terrace 700 (700a, 700b) in each of the regions R1 and R2 and the conductive layer 22 in the memory areas MA1 and MA2 in the present embodiment differs from the correspondence between the terrace 700 and the conductive layer 22 in the first embodiment.

For example, each of the sub-staircases 311z and 312z in the region R1 includes a terrace 700a of an even-numbered conductive layer (for example, word lines WL0, WL2, ... ) included among the plurality of conductive layers 22. Each of the sub-staircases 311z and 312z in the region R2 includes a terrace 700b of an odd-numbered conductive layer (for example, select gate line SGS, word lines WL1, WL3, ... ) included among the plurality of conductive layers 22.

The configuration of the sub-staircases 311z and 312z provided in the hookup portion HP of the memory device 1 of the present embodiment will be described with reference to FIG. 26.

FIG. 26 is a schematic cross-sectional view showing the region XXVI of FIG. 25.

As shown in FIG. 26, a plurality of sub-staircases (downward sub-staircases) 311z (311z-3, 311z-4, 311z-5 and 311z-6) and a plurality of sub-staircases (upward sub-staircases) 312z (312z-3, 312z-4, 312z-5 and 312z-6) are arranged alternately in the X direction, as in the first embodiment. The pair of sub-staircases 311z and 312z forms a stadium-shaped staircase section SS.

In each of the sub-staircases 311z and 312z, one terrace 700 (700a, 700b) is provided for a pair (hereinafter referred to as a stair pair) 99 including two stairs 80.

One of a plurality of contacts CC (CCa, CCb) is provided on the upper surface of the terrace 700 of the stair pair 99.

In the present embodiment, in the boundary region between the regions R1 and R2, two sub-staircases 311z-5 and 312z-4 are adjacent to each other in the X direction such that the back surfaces of the sub-staircases 311z-5 and 312z-4 are in contact with each other. The conductive layer 22 and the insulating layer 32 of each stair 80 are continuous between the two sub-staircases 311z-5 and 312z-4. The two sub-staircases 311z-5 and 312z-4 share a plurality of conductive layers 22 and a plurality of insulating layers 32.

The positions of the sub-staircases 311z and 312z of the region R2 in the Z direction are shifted downward by one stair 80 from the positions of the sub-staircases 311z and 312z of the region R1 in the Z direction.

For example, when the sub-staircase 311z-5 and the sub-staircase 312z-4 are compared, the position of the top of the sub-staircase 311z-5 in the Z direction is one stair lower than the position of the top of the sub-staircase 312z-4 in the Z-direction. When the stair 80 on which the terrace 700a of the sub-staircase 312z-4 is provided is an even-numbered stair of the stair pair 99, the terrace 700b of the sub-staircase 311z-5 is provided on the odd-numbered stair of the stair pair 99.

As a result, each of the sub-staircases 311z and 312z in the region R1 has a terrace 700a corresponding to one of the plurality of even-numbered conductive layers 22. The terrace 700a is coupled to the contact CCa. Each of sub-staircases 311z and 312z in the region R2 has a terrace 700b corresponding to one of the plurality of odd-numbered conductive layers 22. The terrace 700b is coupled to the contact CCb.

As described above, in the present embodiment, the plurality of conductive layers 22 in the memory area MA are coupled to such a circuit as a row decoder module 15 via a bridge portion BRG and a hookup portion HP.

[b] Manufacturing Method

The manufacturing method of the memory device 1 of the present embodiment will be described with reference to FIGS. 27 to 30.

Each of FIGS. 27 to 30 is a schematic cross-sectional diagram illustrating one step in the method of manufacturing the memory device 1 of the present embodiment.

Figure 27:
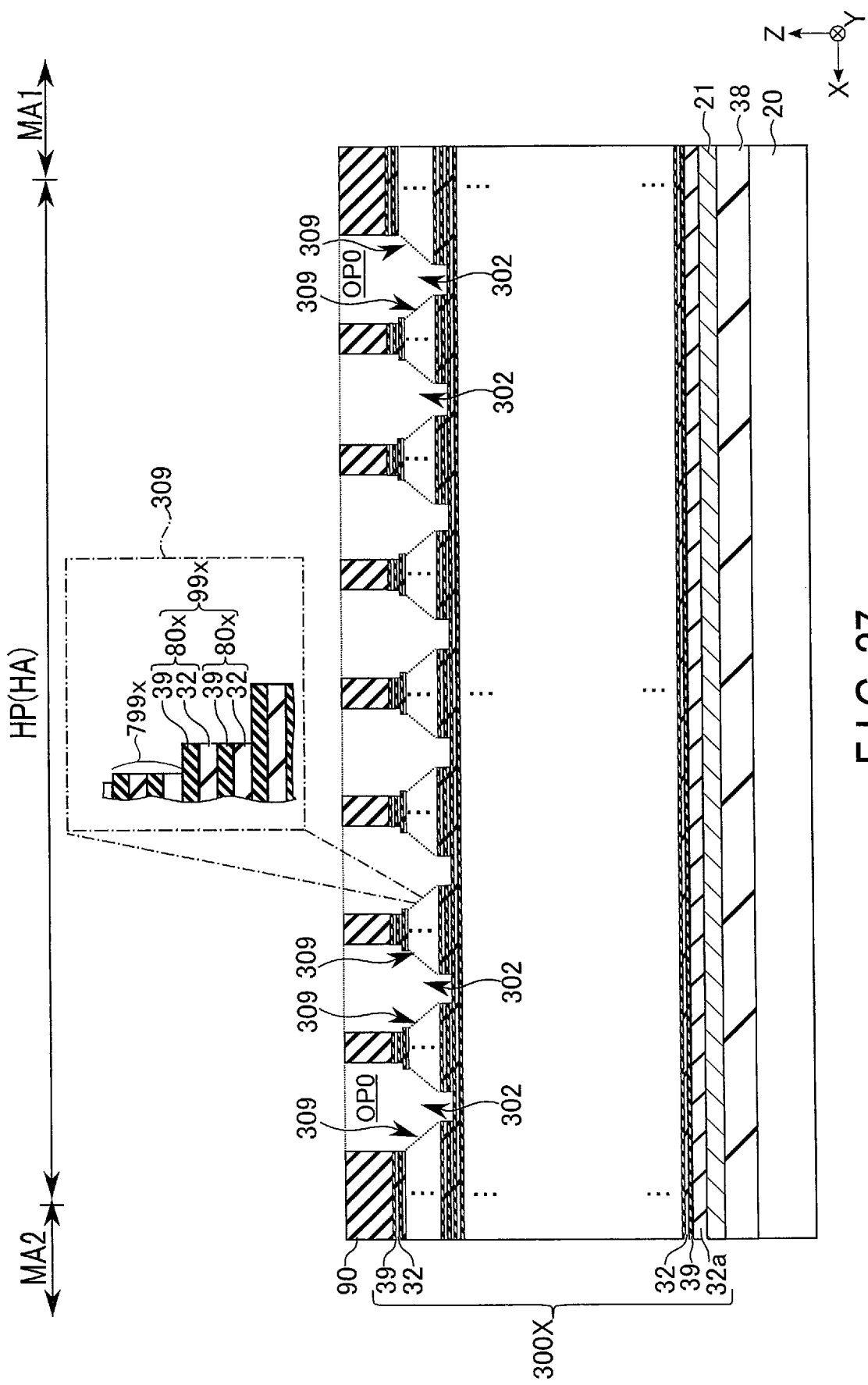

As shown in FIG. 27, the etching process for the layer stack 300X based on the pattern of the mask layer 90 and the slimming process for the mask layer 90 are repeated to form a plurality of mountain portions 309 in the layer stack 300X, as in the steps shown in FIGS. 13 and 14 of the first embodiment.

In the present embodiment, the layer stack 300X is etched in an etching amount by which two insulating layers 32 and two sacrificial layers 39 are etched by one etching process.

Thus, a set including two insulating layers 32 and two sacrificial layers 39 (stair pair 99x including two stairs 80x) is formed as a step 799x by one etching step. In each stair pair 99x, the upper surface of the upper sacrificial layer 39 of the stair pair 99x is exposed, and each of the upper surfaces of the two insulating layers 32 and one sacrificial layer 39 that are below the upper sacrificial layer 39 is covered with an upper layer (the insulating layer 32 or the sacrificial layer 39).

As described above, a plurality of steps 799x are formed in the layer stack 300X by the etching process in which four layers including the two insulating layers 32 and the two sacrificial layers 39 are processed as one unit.

Figure 28:
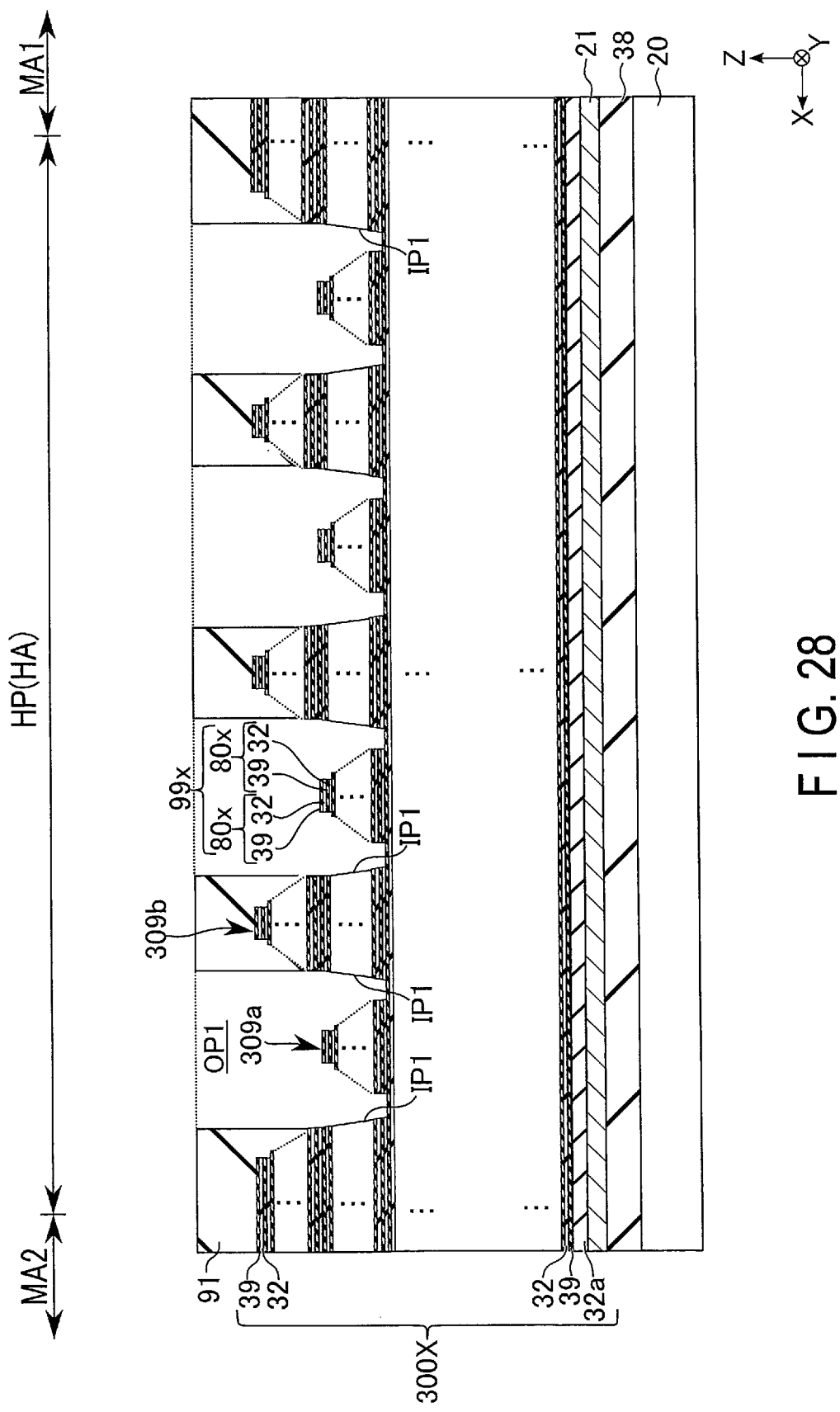

As shown in FIG. 28, a mask layer 91 is formed above the layer stack 300X in the Z direction by the lithography process. A plurality of openings OP1 are provided in the mask layer 91. As in the first embodiment, the openings OP1 are formed so as to alternately expose the mountain portions 309 (309a, 309b) arranged in the X direction in each hookup portion HP.

Etching for the layer stack 300X is performed in an etching amount corresponding to the number of stairs of the mountain portion 309. The pattern of the step 799x of the mountain portion 309 at the position corresponding to the opening OP1 is transferred to a plurality of sacrificial layers 39 and insulating layers 32 of lower layers in the Z direction. As a result, a mountain portion 309a is formed at a position recessed toward the side of the semiconductor substrate 20 from the mountain portion 309b covered with the mask layer 91. At this time, an intermediate portion (cliff portion) IP1 is formed below the mountain portion 309b. The intermediate portion IP1 faces the step forming surface of the mountain portion 309a.

After the mask layer 91 is removed, the layer stack 300X is etched based on the pattern of the mask layer having a mask edge on the mountain portion 309a substantially in the same manner as in the steps shown in FIGS. 18 to 20 referred to in the above. Thus, the pattern of the step forming surface of the mountain portion 309a and the pattern of the mountain portion 309b are transferred to the lower layers of the layer stack 300X, and an intermediate portion IP2 is formed.

As shown in FIG. 29, after the multi-stage etching process in which the intermediate portion IP2 is formed, a mask layer 93 is formed above the layer stack 300X in the Z direction by the lithography process. An opening OP3 is provided in the mask layer 93.

In the present step, in a substantially similar manner to that of the steps shown in FIGS. 21 to 23 referred to in the above, the mask edges Eg3 of the opening OP3 are located on the tops TPb of the mountain portions 309b which are juxtaposed with the intermediate portion IP2 in the X direction.

By the multi-stage etching process based on the pattern of the mask layer 93, the patterns of the mountain portion 309, the sub-staircases 311y and 312y and the intermediate portions IP1 and IP2, which are exposed in the opening OP3, are transferred to the plurality of insulating layers 32 and the sacrificial layers 39 in the lower layers. An intermediate portion IP3 is formed below the mask edge Eg3.

Thus, in the present step, a symmetrical structure including a plurality of sub-staircases 311y and 312y and a plurality of intermediate portions IP1, IP2 and IP3 is formed in the hookup portion HP, with the mountain portion 309x as a center.

As shown in FIG. 30, a mask layer 95 is formed above the layer stack 300X in the Z direction by the lithography process. An opening OP5 is provided in the mask layer 95.

The opening OP5 is formed in the mask layer 95 such that the half region R2 of the hookup portion HP on the side of the second memory area MA2 is exposed. The other half of the hookup portion HP on the side of the first memory area MA1 is covered with the mask layer 95. One of the mask edges of the mask layer 95 is located on the top of the mountain portion 309x.

In the present step, the layer stack 300X is etched in an etching amount by which one stair 80 is etched. One sacrificial layer 39 and one insulating layer 32 included in one stair 80 are removed.

FIG. 31 is a cross-sectional diagram showing an example of the configuration of the region XXXI in FIG. 30.

As shown in FIG. 31, the position of each of the sub-staircases 311y and 312y of the region R2 in the Z direction is recessed toward the side of the semiconductor substrate 20 by one stair from the position of each of sub-staircases 311y and 312y of the region R1 in the Z direction.

In the region R1, each of the terraces 700a of the sacrificial layers 39 corresponding to the even-numbered conductive layers remains. In the region R2, each of the terraces 700b of the sacrificial layers 39 corresponding to the odd-numbered conductive layers is exposed.

Thereafter, the step of forming memory pillars MP, the step of forming slits SLT, the replacement process (the step of forming conductive layers 22), the step of forming contacts CC and the step of forming interconnects 26 are sequentially executed in a substantially similar manner to that of the manufacturing process described in connection with the first embodiment.

By executing the above-mentioned steps, the memory device 1 of the present embodiment is formed.

In the present embodiment, the number of stairs 80 removed from the layer stack 300X (the etching amount for the layer stack 300X) at the time of forming the interconnect stack is practically the same as the number of stairs 80 removed from the layer stack 300X in the first embodiment. In the present embodiment, however, the anisotropic etching based on the pattern of the mask layer 95 does not correspond to the multi-stage etching process, and the number of times the performed multi-stage etching process is one time smaller than the number of times the multi-stage etching performed in the first embodiment. In the present embodiment, the size of each intermediate portion IP (IP1, IP2 and IP3) (for example, the dimension of the intermediate portion IP in the X direction) is substantially the same as the size of each intermediate portion IP1, IP2, IP3 of the first embodiment.

The memory device of the present embodiment can attain substantially the same advantages as the memory device of the first embodiment.

(3) Others

In the above-described embodiments, a NAND flash memory is described as an example of the memory device. However, the memory device of the embodiments may be another type of memory device as long as it is a device provided with an interconnect stack.

In the present embodiment, the memory cell array 10 may have a structure in which a plurality of memory pillars MP and a plurality of interconnect stacks 300 are stacked in the Z direction. In this case, the plurality of hookup portions HP described above are stacked in the Z direction. Each hookup portion HP is coupled to the memory area MA provided at the same height, via a bridge portion BRG or directly.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:

first and second memory areas each including a plurality of conductive layers stacked in a first direction and being arranged in a second direction perpendicular to the first direction;

a bridge portion provided between the first memory area and the second memory area in the second direction, the bridge portion coupling the plurality of conductive layers of the first memory area and the plurality of conductive layers of the second memory area to each other;

a hookup portion provided between the first memory area and the second memory area in the second direction, the hookup portion including a plurality of terraces coupled to the plurality of conductive layers via the bridge portion;

a plurality of interconnects provided in correspondence with the plurality of terraces above the hookup portion; and a plurality of contacts that electrically couple the plurality of terraces and the plurality of interconnects to each other, wherein the hookup portion includes a first sub-staircase, a second sub-staircase, a third sub-staircase and a fourth sub-staircase each including corresponding ones of the plurality of terraces, the first to fourth sub-staircases are arranged in order of the first sub-staircase, the second sub-staircase, the third sub-staircase and the fourth sub-staircase in a direction from a side of the first memory area toward a side of the second memory area, and the first to fourth sub-staircases are arranged in order of the first sub-staircase, the second sub-staircase, the fourth sub-staircase and the third sub-staircase in a direction from a side of the plurality of interconnects toward a side of the plurality of terraces.

2. The memory device according to claim 1, wherein
each of the first and third sub-staircases includes the plurality of terraces that descend from the side of the first memory area toward the side of the second memory area, and
each of the second and fourth sub-staircases includes the plurality of terraces that ascend from the side of the first memory area toward the side of the second memory area.

3. The memory device according to claim 1, wherein
the hookup portion further includes a fifth sub-staircase, a sixth sub-staircase, a seventh sub-staircase and an eighth sub-staircase,
the fifth to eighth sub-staircases are provided between the fourth sub-staircase and the second memory area in the second direction,
each of positions of the fifth to eighth sub-staircases in the first direction are lower than a position of the third sub-staircase in the first direction,
the fifth to eighth sub-staircases are arranged in order of the fifth sub-staircase, the sixth sub-staircase, the seventh sub-staircase and the eighth sub-staircase in the direction from the side of the first memory area toward the side of the second memory area, and
the fifth to eighth sub-staircases are arranged in order of the eighth sub-staircase, the seventh sub-staircase, the fifth sub-staircase and the sixth sub-staircase in the direction from the side of the plurality of interconnects toward the side of the plurality of terraces.

4. The memory device according to claim 3, wherein
the hookup portion further includes a first portion, a second portion, a third portion, a fourth portion, a fifth portion, a sixth portion and a seventh portion,
the first portion is provided between the first and second sub-staircases in the second direction,
the second portion is provided between the second and third sub-staircases in the second direction,
the third portion is provided between the third and fourth sub-staircases in the second direction,
the fourth portion is provided between the fourth and fifth sub-staircases in the second direction,
the fifth portion is provided between the fifth and sixth sub-staircases in the second direction,
the sixth portion is provided between the sixth and seventh sub-staircases in the second direction,
the seventh portion is provided between the seventh and eighth sub-staircases in the second direction, and
dimensions of the second portion and the sixth portion in the first direction are larger than dimensions of the first portion, the third portion, the fifth portion, and the seventh portion in the first direction, and are smaller than a dimension of the fourth portion in the first direction.

5. The memory device according to claim 3, wherein
a position profile of the fifth to eighth sub-staircases in the first direction has a mirror image relationship with a position profile of the first to fourth sub-staircases in the first direction.

6. A memory device comprising:
first and second memory areas each including a plurality of conductive layers stacked in a first direction and being arranged in a second direction perpendicular to the first direction;
a bridge portion provided between the first memory area and the second memory area in the second direction, the bridge portion coupling the plurality of conductive layers of the first memory area and the plurality of conductive layers of the second memory area to each other; and
a hookup portion provided between the first memory area and the second memory area in the second direction, the hookup portion including a plurality of staircase portions each including a plurality of terraces coupled to the plurality of conductive layers via the bridge portion, and the hookup portion including a plurality of intermediate portions provided between the plurality of staircase portions,
wherein
the plurality of staircase portions include a first staircase portion, a second staircase portion, a third staircase portion, and a fourth staircase portion arranged in order from a side of the first memory area toward a side of the second memory area,
the plurality of intermediate portions include a first intermediate portion provided between the first and second staircase portions in the second direction, a second intermediate portion provided between the second and third staircase portions in the second direction, and a third intermediate portion provided between the third and fourth staircase portions in the second direction,
a position of the second staircase portion in the first direction is higher than a position of the first staircase portion in the first direction, and
a position of the third staircase portion in the first direction is lower than the position of the first staircase portion in the first direction and is higher than a position of the fourth staircase portion in the first direction.

7. The memory device according to claim 6, wherein
dimensions of the first and third intermediate portions in the first direction are substantially equal to each other and are smaller than a dimension of the second intermediate portion in the first direction.

8. The memory device according to claim 7, wherein
the plurality of staircase portions further include a fifth staircase portion provided between the first memory area and the first staircase portion,
the plurality of intermediate portions further include a fourth intermediate portion provided between the first staircase portion and the fifth staircase portion in the second direction,
a position of the fifth staircase portion in the first direction is higher than the position of the second staircase portion in the first direction, and
a dimension of the fourth intermediate portion in the first direction is larger than the dimensions of the first and third intermediate portions in the first direction, and is smaller than the dimension of the second intermediate portion in the first direction.

9. The memory device according to claim 8, wherein
the plurality of staircase portions further include a sixth staircase portion provided between the second memory area and the fourth staircase portion,
the plurality of intermediate portions further include a fifth intermediate portion provided between the fourth staircase portion and the sixth staircase portion in the second direction,
a position of the sixth staircase portion in the first direction is lower than the position of the first staircase portion in the first direction and is higher than the position of the third staircase portion in the first direction, and a dimension of the fifth intermediate portion in the first direction is substantially equal to the dimension of the fourth intermediate portion in the first direction.

10. The memory device according to claim 6, wherein a position profile of the third and fourth staircase portions in the first direction has a mirror image relationship with a position profile of the first and second staircase portions in the first direction.

11. The memory device according to claim 6, wherein each of the first and third staircase portions includes the plurality of terraces that descend from the side of the first memory area toward the side of the second memory area, and each of the second and fourth staircase portions includes the plurality of terraces that ascend from the side of the first memory area toward the side of the second memory area.

12. The memory device according to claim 6, wherein each of the first to fourth staircase portions includes a downward sub-staircase including the plurality of terraces that descend from the side of the first memory area toward the side of the second memory area, and an upward sub-staircase including the plurality of terraces that ascend from the side of the first memory area toward the side of the second memory area.

13. The memory device according to claim 12, wherein a position profile of the downward sub-staircase and the upward sub-staircase included in the second staircase portion in the first direction has a mirror image relationship with a position profile of the downward sub-staircase and the upward sub-staircase included in the first staircase portion in the first direction, and a position profile of the downward sub-staircase and the upward sub-staircase included in the fourth staircase portion in the first direction has a mirror image relationship with a position profile of the downward sub-staircase and the upward sub-staircase included in the third staircase portion in the first direction.

14. A memory device comprising:

first and second memory areas each including a plurality of conductive layers stacked in a first direction and being arranged in a second direction perpendicular to the first direction;

a bridge portion provided between the first memory area and the second memory area in the second direction, the bridge portion coupling the plurality of conductive layers of the first memory area and the plurality of conductive layers of the second memory area to each other; and a hookup portion provided between the first memory area and the second memory area in the second direction, the hookup portion including a plurality of terraces coupled to the plurality of conductive layers via the bridge portion, wherein the hookup portion includes:

a first sub-staircase, a second sub-staircase, a third sub-staircase, and a fourth sub-staircase arranged in order from a side of the first memory area toward a side of the second memory area, and each including corresponding ones of the plurality of terraces, and a first portion provided below the first sub-staircase in the first direction and adjacent to the second sub-staircase in the second direction, a second portion provided above the third sub-staircase in the first direction and provided between the second sub-staircase and the third sub-staircase in the second direction, and a third portion provided below the fourth sub-staircase in the first direction and adjacent to the third sub-staircase in the second direction, a first dimension of the first portion in the first direction is substantially equal to a third dimension of the third portion in the first direction, and a second dimension of the second portion in the first direction is larger than the first and third dimensions.

15. The memory device according to claim 14, wherein the first portion has a first surface facing the side of the second memory area, the second portion has a second surface facing the side of the second memory area, and the third portion has a third surface facing the side of the first memory area.

16. The memory device according to claim 14, wherein a position of an upper end of the third portion in the first direction is lower than positions of upper ends of the first and second portions in the first direction.

17. The memory device according to claim 14, wherein the hookup portion further includes a fifth sub-staircase provided between the second memory area and the fourth sub-staircase in the second direction, and a fourth portion provided above the fifth sub-staircase in the first direction and provided between the fourth sub-staircase and the fifth sub-staircase in the second direction, and a fourth dimension of the fourth portion in the first direction is larger than the second dimension.

18. The memory device according to claim 17, wherein the fourth portion has a fourth surface facing the side of the second memory area, and a position of an upper end of the fourth portion in the first direction is lower than a position of an upper end of the second portion in the first direction, and is higher than a position of an upper end of the third portion in the first direction.

19. The memory device according to claim 17, wherein a position of the first sub-staircase in the first direction is higher than a position of the second sub-staircase in the first direction, a position of the fourth sub-staircase in the first direction is lower than the position of the second sub-staircase in the first direction and is higher than a position of the third sub-staircase in the first direction, and a position of the fifth sub-staircase in the first direction is lower than the position of the third sub-staircase in the first direction.

20. The memory device according to claim 14, wherein each of the first and third sub-staircases includes the plurality of terraces that descend from the side of the first memory area toward the side of the second memory area, and each of the second and fourth sub-staircases includes the plurality of terraces that ascend from the side of the first memory area toward the side of the second memory area.

* * * * *